United States Patent
Yamazaki et al.

(10) Patent No.: US 12,004,400 B2
(45) Date of Patent: Jun. 4, 2024

(54) LIGHT-EMITTING APPARATUS, LIGHTING DEVICE, DISPLAY DEVICE, MODULE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Daisuke Kubota, Kanagawa (JP); Nobuharu Ohsawa, Kanagawa (JP); Takeyoshi Watabe, Kanagawa (JP); Taisuke Kamada, Saitama (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 379 days.

(21) Appl. No.: 17/414,502

(22) PCT Filed: Dec. 19, 2019

(86) PCT No.: PCT/IB2019/061064
§ 371 (c)(1),
(2) Date: Jun. 16, 2021

(87) PCT Pub. No.: WO2020/136514
PCT Pub. Date: Jul. 2, 2020

(65) Prior Publication Data
US 2022/0069025 A1    Mar. 3, 2022

(30) Foreign Application Priority Data

Dec. 28, 2018  (JP) ................. 2018-246814
Dec. 28, 2018  (JP) ................. 2018-246821

(51) Int. Cl.
*H10K 59/32* (2023.01)
*H10K 50/85* (2023.01)
*H10K 102/00* (2023.01)

(52) U.S. Cl.
CPC ............. *H10K 59/32* (2023.02); *H10K 50/85* (2023.02); *H10K 2102/311* (2023.02)

(58) Field of Classification Search
CPC ....................... H10K 59/32; H10K 50/85
See application file for complete search history.

(56) References Cited

U.S. PATENT DOCUMENTS 6,424,326 B2   7/2002  Yamazaki et al.
6,828,951 B2  12/2004  Yamazaki et al.
(Continued)

FOREIGN PATENT DOCUMENTS

CN    103715225 A    4/2014
CN    104867957 A    8/2015
(Continued)

OTHER PUBLICATIONS

International Search Report (Application No. PCT/IB2019/061064) dated Mar. 17, 2020.
(Continued)

*Primary Examiner* — Nathan W Ha
(74) *Attorney, Agent, or Firm* — Husch Blackwell LLP

(57) ABSTRACT

A display device that has a function of emitting visible light and infrared light and a function of detecting light. The display device is a display device including a first light-emitting device, a second light-emitting device, and a light-receiving device, in a display portion. The first light-emitting device includes a first pixel electrode, a first optical adjustment layer, a first light-emitting layer, a second light-emitting layer, and a common electrode. The second light-emitting device includes a second pixel electrode, a second optical adjustment layer, the first light-emitting layer, the second light-emitting layer, and the common electrode. The light-receiving device includes a third pixel electrode, an active layer, and the common electrode. The active layer (Continued)

includes an organic compound. The first light-emitting device emits infrared light emitted by the first light-emitting layer. The second light-emitting device emits visible light emitted by the second light-emitting layer. The light-receiving device has a function of absorbing at least part of visible light and infrared light.

27 Claims, 29 Drawing Sheets

(56) References Cited

U.S. PATENT DOCUMENTS

| | | |
|---|---|---|
| 7,042,444 B2 | 5/2006 | Cok |
| 7,173,279 B2 | 2/2007 | Yamazaki et al. |
| 7,202,856 B2 | 4/2007 | Cok |
| 7,355,340 B2 | 4/2008 | Shitagaki et al. |
| 7,397,064 B2 | 7/2008 | Yamazaki et al. |
| 7,629,610 B2 | 12/2009 | Yamazaki et al. |
| 7,956,349 B2 | 6/2011 | Tsutsui et al. |
| 8,399,821 B2 | 3/2013 | Matsumoto |
| 8,698,395 B2 | 4/2014 | Im et al. |
| 8,789,968 B2 | 7/2014 | Ohsawa et al. |
| 8,803,138 B2 | 8/2014 | Fujita et al. |
| 9,088,006 B2 | 7/2015 | Yamazaki et al. |
| 9,123,665 B2 | 9/2015 | Sago |
| 9,178,102 B2 | 11/2015 | Fujita et al. |
| 9,224,928 B2 | 12/2015 | Fujita et al. |
| 9,401,460 B2 | 7/2016 | Fujita et al. |
| 9,412,909 B2 | 8/2016 | Fujita et al. |
| 9,553,274 B2 | 1/2017 | Xia et al. |
| 9,577,222 B2 | 2/2017 | Seo et al. |
| 9,627,650 B2 | 4/2017 | Seo et al. |
| 9,660,220 B2 | 5/2017 | Uesaka et al. |
| 9,721,998 B2 | 8/2017 | Yamazaki |
| 9,741,967 B2 | 8/2017 | Ohsawa et al. |
| 9,817,520 B2 | 11/2017 | Ikeda et al. |
| 9,917,257 B2 | 3/2018 | Lee et al. |
| 9,921,670 B2 | 3/2018 | Wang et al. |
| 9,935,292 B2 | 4/2018 | Seo et al. |
| 9,978,960 B2 | 5/2018 | Inoue et al. |
| 10,090,363 B2 | 10/2018 | Seo et al. |
| 10,224,510 B2 | 3/2019 | Uesaka et al. |
| 10,333,106 B2 | 6/2019 | Ohsawa et al. |
| 10,388,706 B2 | 8/2019 | Lee et al. |
| 10,734,589 B2 | 8/2020 | Suzuki et al. |
| 10,985,220 B2 | 4/2021 | Lee et al. |
| 2001/0028060 A1 | 10/2001 | Yamazaki et al. |
| 2006/0113907 A1 | 6/2006 | Im et al. |
| 2014/0042409 A1* | 2/2014 | Ohyama ............... H10K 50/85 257/40 |
| 2014/0077185 A1* | 3/2014 | Lee ..................... H10K 50/858 257/40 |
| 2014/0084269 A1* | 3/2014 | Weaver ............... H10K 50/131 257/40 |
| 2014/0091287 A1 | 4/2014 | Sago |
| 2014/0138636 A1* | 5/2014 | Song .................... H10K 50/844 257/40 |
| 2014/0225100 A1 | 8/2014 | Yokoyama et al. |
| 2014/0332831 A1 | 11/2014 | Ohsawa et al. |
| 2015/0021627 A1 | 1/2015 | Fujita et al. |
| 2015/0053958 A1* | 2/2015 | Ishisone ............... H10K 50/171 257/40 |
| 2015/0076451 A1* | 3/2015 | Dobbertin ............. H10K 50/81 257/40 |
| 2015/0162566 A1* | 6/2015 | Kikuchi ............... H10K 50/858 257/40 |
| 2015/0188078 A1* | 7/2015 | Osawa ................. H10K 50/858 257/40 |
| 2015/0200382 A1* | 7/2015 | Moon ................... H10K 50/85 257/40 |
| 2015/0207092 A1* | 7/2015 | Tsuji .................... H10K 50/82 257/40 |
| 2015/0228698 A1* | 8/2015 | Kawahara ............ G06F 1/1637 257/40 |
| 2015/0243712 A1 | 8/2015 | Wang et al. |
| 2015/0255519 A1* | 9/2015 | Lee ....................... G09G 3/007 345/207 |
| 2015/0333271 A1 | 11/2015 | Chung et al. |
| 2015/0364527 A1 | 12/2015 | Wang et al. |
| 2016/0093678 A1 | 3/2016 | Seo et al. |
| 2016/0118626 A1 | 4/2016 | Seo et al. |
| 2016/0126500 A1 | 5/2016 | Uesaka et al. |
| 2016/0141515 A1 | 5/2016 | Hayama et al. |
| 2017/0271415 A1 | 9/2017 | Yamazaki |
| 2018/0261652 A1 | 9/2018 | Kim et al. |
| 2018/0261655 A1 | 9/2018 | Lee et al. |
| 2018/0261773 A1 | 9/2018 | Yamamoto et al. |
| 2019/0002488 A1 | 1/2019 | Humphries et al. |
| 2019/0031673 A1 | 1/2019 | Yamaguchi et al. |
| 2019/0062357 A1 | 2/2019 | Yoo et al. |
| 2019/0096959 A1 | 3/2019 | Lee et al. |
| 2019/0115542 A1 | 4/2019 | Yokoyama et al. |
| 2019/0131540 A1 | 5/2019 | Sim et al. |
| 2019/0341434 A1 | 11/2019 | Lee et al. |
| 2019/0372028 A1 | 12/2019 | Qiao et al. |
| 2020/0152887 A1 | 5/2020 | Yamaguchi et al. |

FOREIGN PATENT DOCUMENTS

| | | |
|---|---|---|
| CN | 105304673 A | 2/2016 |
| CN | 108573994 A | 9/2018 |
| CN | 108573995 A | 9/2018 |
| CN | 109560175 A | 4/2019 |
| EP | 1 450 245 A2 | 8/2004 |
| EP | 2 827 283 A1 | 1/2015 |
| EP | 3 373 336 A1 | 9/2018 |
| EP | 3 373 355 A2 | 9/2018 |
| JP | 2001-265283 A | 9/2001 |
| JP | 2010-050014 A | 3/2010 |
| JP | 2012-216519 A | 11/2012 |
| JP | 2013-117719 A | 6/2013 |
| JP | 2013-140839 A | 7/2013 |
| JP | 2014-072120 A | 4/2014 |
| JP | 2014-197522 A | 10/2014 |
| JP | 2015-038859 A | 2/2015 |
| JP | 2015-162463 A | 9/2015 |
| JP | 2016-066626 A | 4/2016 |
| JP | 2016-072250 A | 5/2016 |
| JP | 2016-085968 A | 5/2016 |
| JP | 2016-085969 A | 5/2016 |
| JP | 2018-037356 A | 3/2018 |
| JP | 2018-147877 A | 9/2018 |
| KR | 2012-0109397 A | 10/2012 |
| KR | 2015-0101509 A | 9/2015 |
| KR | 2015-0142816 A | 12/2015 |
| KR | 2018-0103206 A | 9/2018 |
| KR | 2018-0103207 A | 9/2018 |
| KR | 2019-0035984 A | 4/2019 |
| TW | 480727 | 3/2002 |
| TW | 200422921 | 11/2004 |
| TW | 201301607 | 1/2013 |
| TW | 201415625 | 4/2014 |
| TW | 201624789 | 7/2016 |
| TW | 201834295 | 9/2018 |

OTHER PUBLICATIONS

Written Opinion (Application No. PCT/IB2019/061064) dated Mar. 17, 2020.

Taiwanese Office Action (Application No. 108146137) dated Oct. 30, 2023.

* cited by examiner

FIG. 6A  FIG. 6B  FIG. 6C  FIG. 6D
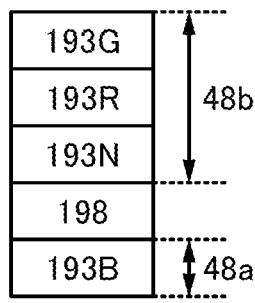
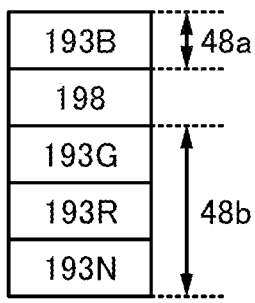
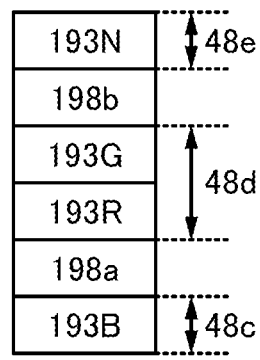
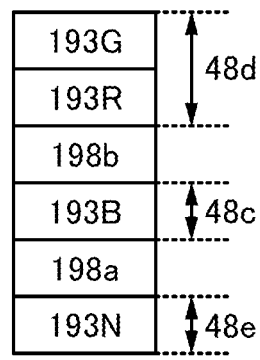
FIG. 6E
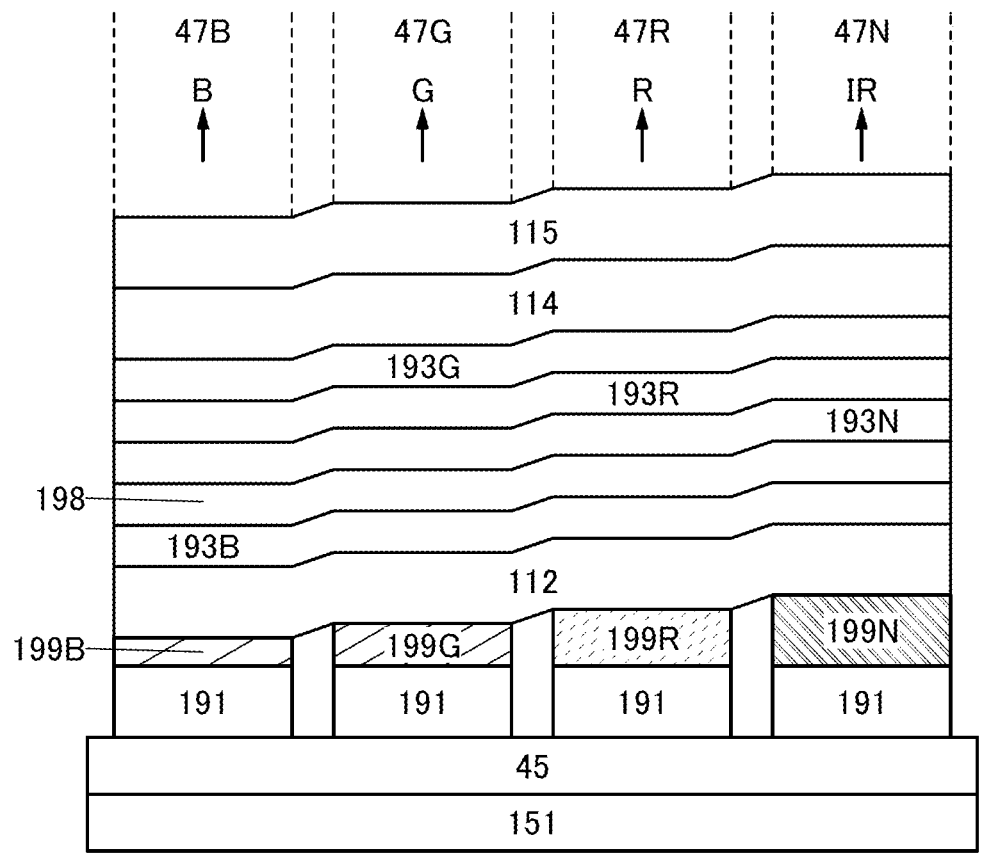

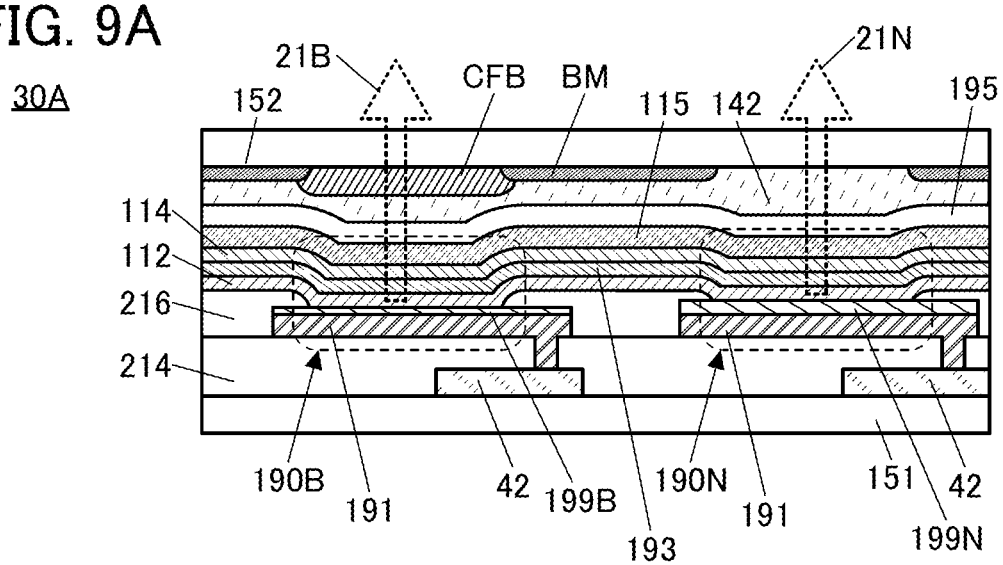
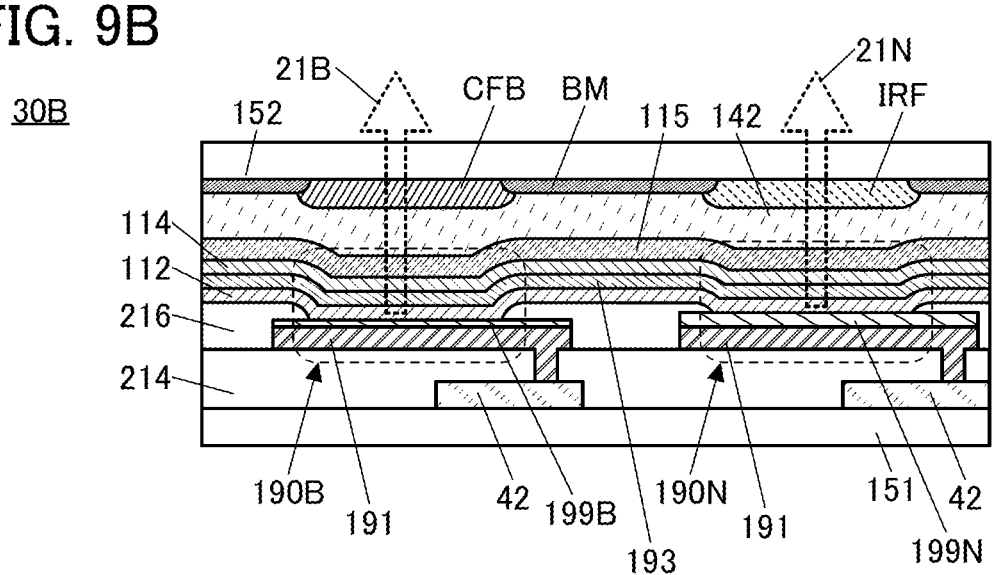

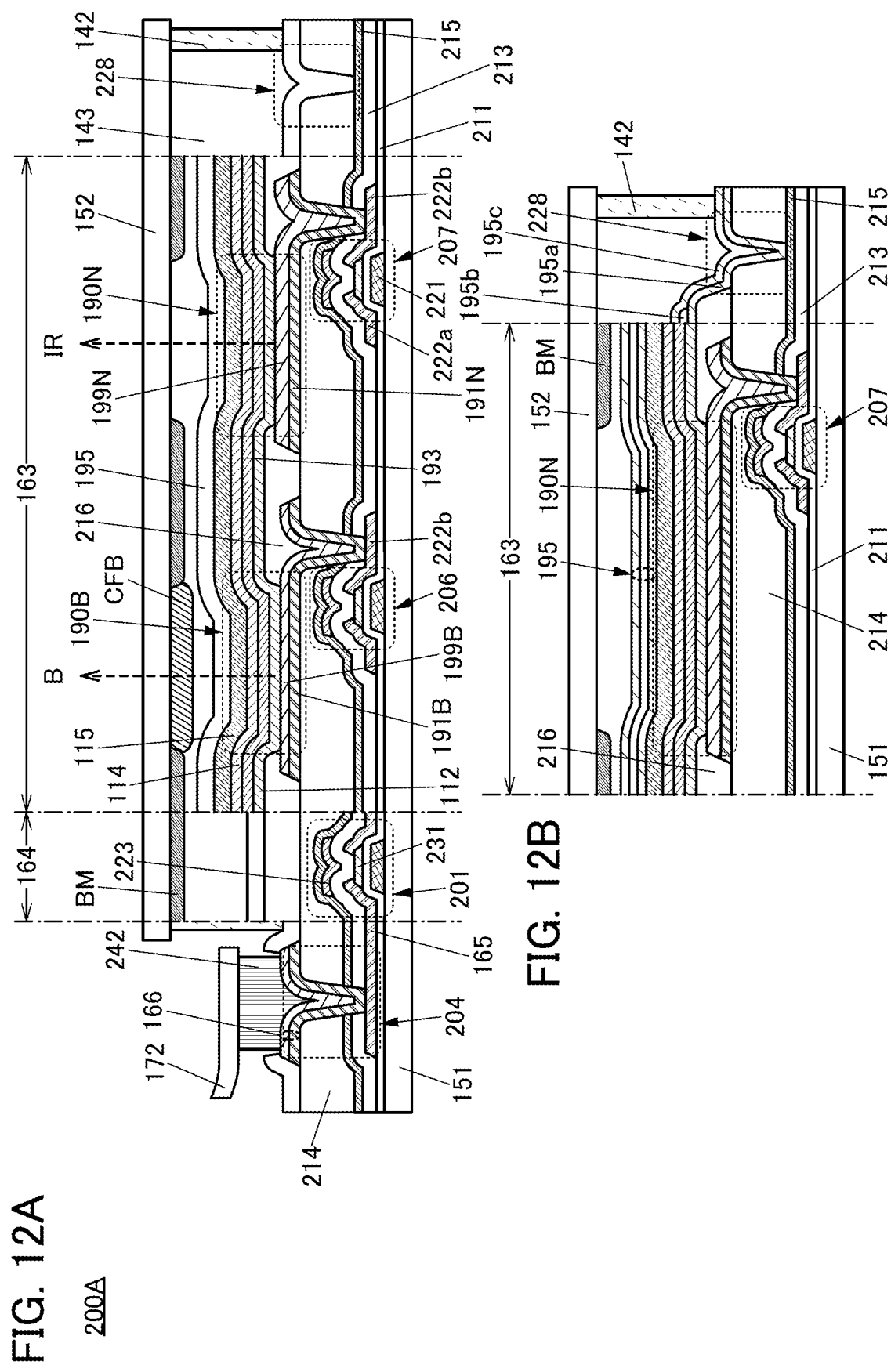

FIG. 15A
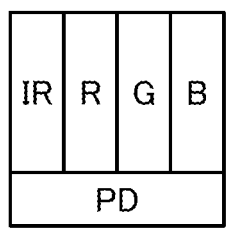
FIG. 15B     FIG. 15C     FIG. 15D
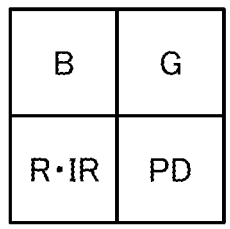 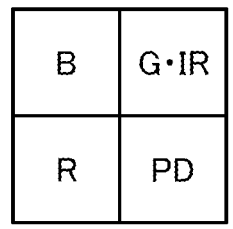 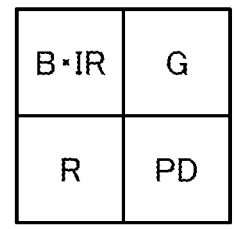
FIG. 15E     FIG. 15F
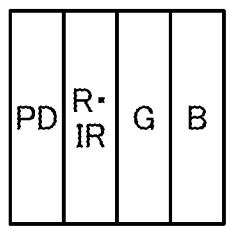 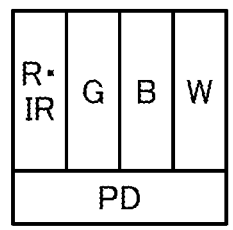

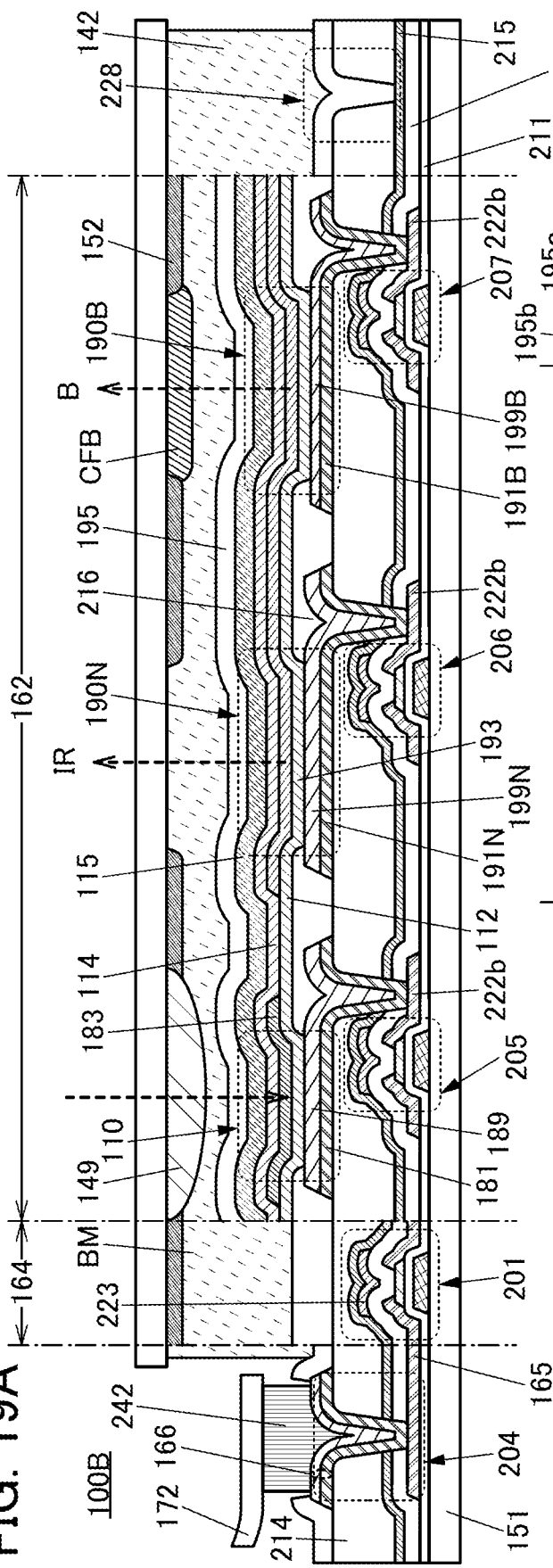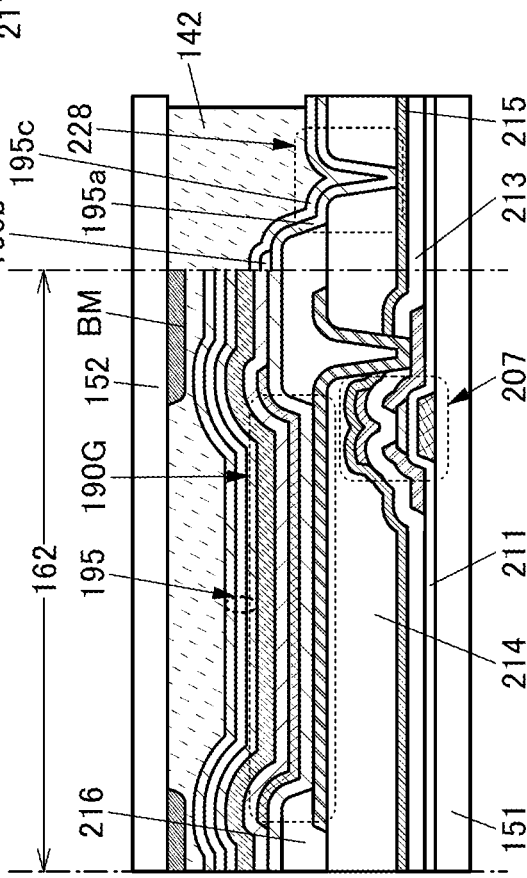

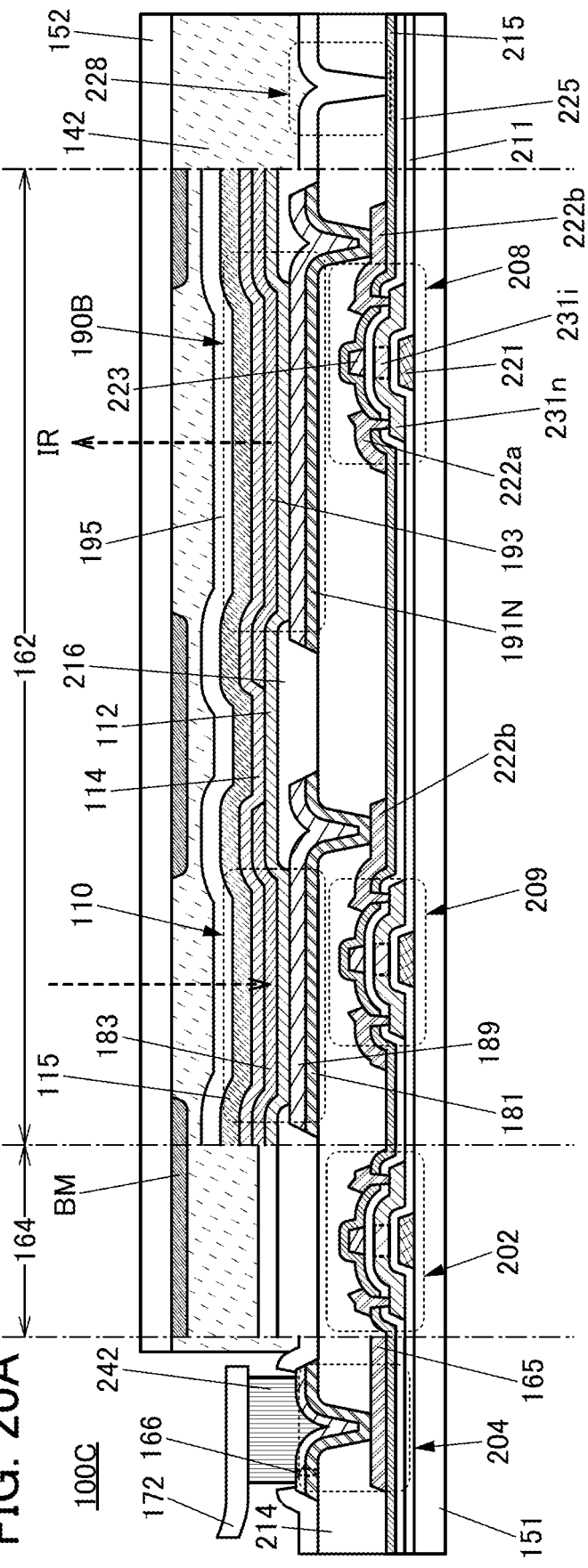

LIGHT-EMITTING APPARATUS, LIGHTING DEVICE, DISPLAY DEVICE, MODULE, AND ELECTRONIC DEVICE

This application is a 371 of international application PCT/IB2019/061064 filed on Dec. 19, 2019 which is incorporated herein by reference.

TECHNICAL FIELD

One embodiment of the present invention relates to a light-emitting device, a light-emitting apparatus, a light-emitting module, an electronic device, and a lighting device. One embodiment of the present invention relates to a display device, a display module, and an electronic device. One embodiment of the present invention relates to a display device including a light-receiving device and a light-emitting device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, application of display devices to a variety of uses has been expected. Large display devices can be used for a television device for home use (also referred to as a TV or a television receiver), digital signage, and a PID (Public Information Display), for example. In addition, a smartphone and a tablet terminal including a touch panel are being developed as portable information terminals.

Light-emitting apparatuses including light-emitting devices (also referred to as light-emitting elements) have been developed as display devices, for example. Light-emitting devices (also referred to as EL devices or EL elements) utilizing an electroluminescence (hereinafter referred to as EL) phenomenon have features such as ease of reduction in thickness and weight, high-speed response to an input signal, and driving with a direct-current low voltage source, and have been used in display devices. For example, Patent Document 1 discloses a light-emitting apparatus having flexibility, to which an organic EL device (also referred to as an organic EL element) is applied.

Image sensors have been used in a variety of applications such as personal authentication, defect analysis, medical diagnosis, and security. The wavelength of light sources used for image sensors is different depending on applications. Light having a variety of wavelengths, for example, light having a short wavelength, such as visible light and X-rays, and light having a long wavelength, such as near-infrared light, is used for image sensors.

Light-emitting devices have been considered to be applied to light sources of image sensors like those described above.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a light-emitting apparatus having a function of emitting visible light and infrared light. An object of one embodiment of the present invention is to provide a highly convenient light-emitting apparatus. An object of one embodiment of the present invention is to provide a multifunctional light-emitting apparatus. An object of one embodiment of the present invention is to provide a novel light-emitting apparatus.

An object of one embodiment of the present invention is to provide a display device having a function of detecting light. An object of one embodiment of the present invention is to provide a display device having a function of emitting visible light and infrared light and a function of detecting light. An object of one embodiment of the present invention is to provide a highly convenient display device. An object of one embodiment of the present invention is to provide a multifunctional display device. An object of one embodiment of the present invention is to provide a novel display device.

Note that the description of these objects does not preclude the existence of other objects. One embodiment of the present invention does not need to achieve all the objects. Other objects can be derived from the descriptions of the specification, the drawings, and the claims.

Means for Solving the Problems

A light-emitting apparatus includes a first light-emitting device and a second light-emitting device. The first light-emitting device includes a first pixel electrode, a first optical adjustment layer, a first light-emitting layer, a second light-emitting layer, and a common electrode. The second light-emitting device includes a second pixel electrode, a second optical adjustment layer, the first light-emitting layer, the second light-emitting layer, and the common electrode. The first optical adjustment layer is positioned between the first pixel electrode and the common electrode. The second optical adjustment layer is positioned between the second pixel electrode and the common electrode. The first light-emitting layer and the second light-emitting layer each include a region positioned between the first pixel electrode and the common electrode and a region positioned between the second pixel electrode and the common electrode. The first light-emitting device emits infrared light emitted by the first light-emitting layer. The second light-emitting device emits visible light emitted by the second light-emitting layer.

It is preferable that the light-emitting apparatus of one embodiment of the present invention further include a third light-emitting device. At this time, it is preferable that the first light-emitting device and the second light-emitting device further include a third light-emitting layer. The third light-emitting device preferably includes a third pixel electrode, a third optical adjustment layer, the first light-emitting layer, the second light-emitting layer, the third light-emitting layer, and the common electrode. The third light-emitting layer preferably includes a region positioned between the first pixel electrode and the common electrode, a region positioned between the second pixel electrode and the common electrode, and a region positioned between the third pixel electrode and the common electrode. The third light-emitting device preferably emits visible light emitted by the third light-emitting layer. The second light-emitting layer and the third light-emitting layer preferably emit light having different wavelengths from each other.

Alternatively, it is preferable that the first light-emitting device and the second light-emitting device preferably further include a third light-emitting layer. The third light-emitting layer preferably includes a region positioned between the first pixel electrode and the common electrode and a region positioned between the second pixel electrode and the common electrode. The first light-emitting device preferably emits both infrared light emitted by the first light-emitting layer and visible light emitted by the third light-emitting layer.

It is preferable that the first light-emitting device and the second light-emitting device further include a charge-generation layer. The charge-generation layer is preferably positioned between the first light-emitting layer and the second light-emitting layer.

The first light-emitting layer preferably includes a region positioned between the first optical adjustment layer and the second light-emitting layer and a region positioned between the second optical adjustment layer and the second light-emitting layer.

A light-emitting apparatus of one embodiment of the present invention includes a first light-emitting device and a second light-emitting device. The first light-emitting device includes a first pixel electrode, a first optical adjustment layer, a first light-emitting layer, a second light-emitting layer, a third light-emitting layer, a fourth light-emitting layer, and a common electrode. The second light-emitting device includes a second pixel electrode, a second optical adjustment layer, the first light-emitting layer, the second light-emitting layer, the third light-emitting layer, the fourth light-emitting layer, and the common electrode. The first optical adjustment layer is positioned between the first pixel electrode and the common electrode. The second optical adjustment layer is positioned between the second pixel electrode and the common electrode. The first light-emitting layer, the second light-emitting layer, the third light-emitting layer, and the fourth light-emitting layer each include a region positioned between the first pixel electrode and the common electrode and a region positioned between the second pixel electrode and the common electrode. The first light-emitting layer has a function of emitting infrared light. The second light-emitting layer has a function of emitting visible light. The third light-emitting layer has a function of emitting visible light having a shorter wavelength than visible light emitted by the second light-emitting layer. The fourth light-emitting layer has a function of emitting visible light having a shorter wavelength than visible light emitted by the third light-emitting layer. The first light-emitting device emits infrared light emitted by the first light-emitting layer. The second light-emitting device emits visible light emitted by the second light-emitting layer, the third light-emitting layer, or the fourth light-emitting layer.

The second light-emitting layer preferably has a function of emitting red light. The third light-emitting layer preferably has a function of emitting green light. The fourth light-emitting layer preferably has a function of emitting blue light.

It is preferable that the first light-emitting device and the second light-emitting device further include a first charge-generation layer. The first charge-generation layer is preferably positioned between the first light-emitting layer and the fourth light-emitting layer.

It is preferable that the first light-emitting device and the second light-emitting device further include a second charge-generation layer. The second charge-generation layer is preferably positioned between the first light-emitting layer and the second light-emitting layer.

It is preferable that the first light-emitting layer, the second light-emitting layer, the third light-emitting layer, and the fourth light-emitting layer be stacked in this order from a side close to the first optical adjustment layer, and that the first light-emitting layer, the second light-emitting layer, the third light-emitting layer, and the fourth light-emitting layer be stacked in this order from a side close to the second optical adjustment layer.

The first light-emitting device preferably emits both infrared light emitted by the first light-emitting layer and visible light emitted by the fourth light-emitting layer.

The first optical adjustment layer may be positioned between the first pixel electrode and the first light-emitting layer, and the first optical adjustment layer may be positioned between the common electrode and the first light-emitting layer.

One embodiment of the present invention is a display device including a first light-emitting device, a second light-emitting device, and a light-receiving device, in a display portion. The first light-emitting device includes a first pixel electrode, a first optical adjustment layer, a first light-emitting layer, a second light-emitting layer, and a common electrode. The second light-emitting device includes a second pixel electrode, a second optical adjustment layer, the first light-emitting layer, the second light-emitting layer, and the common electrode. The first optical adjustment layer is positioned between the first pixel electrode and the common electrode. The second optical adjustment layer is positioned between the second pixel electrode and the common electrode. The first light-emitting layer and the second light-emitting layer each include a region positioned between the first pixel electrode and the common electrode and a region positioned between the second pixel electrode and the common electrode. The light-receiving device includes a third pixel electrode, an active layer, and the common electrode. The active layer is positioned between the third pixel electrode and the common electrode. The active layer includes an organic compound. The first light-emitting device emits infrared light emitted by the first light-emitting layer. The second light-emitting device emits visible light emitted by the second light-emitting layer. The light-receiving device has a function of absorbing at least part of visible light and infrared light.

Alternatively, one embodiment of the present invention is a display device including a first light-emitting device, a second light-emitting device, and a light-receiving device, in a display portion. The first light-emitting device includes a first pixel electrode, a common layer, a first optical adjustment layer, a first light-emitting layer, a second light-emitting layer, and a common electrode. The second light-emitting device includes a second pixel electrode, the common layer, a second optical adjustment layer, the first light-emitting layer, the second light-emitting layer, and the common electrode. The first optical adjustment layer is positioned between the first pixel electrode and the common electrode. The second optical adjustment layer is positioned between the second pixel electrode and the common electrode. The first light-emitting layer and the second light-emitting layer each include a region positioned between the first pixel electrode and the common electrode and a region positioned between the second pixel electrode and the common electrode. The light-receiving device includes a third pixel electrode, the common layer, an active layer, and the common electrode. The active layer is positioned between the third pixel electrode and the common electrode.

The active layer includes an organic compound. The first light-emitting device emits infrared light emitted by the first light-emitting layer. The second light-emitting device emits visible light emitted by the second light-emitting layer. The light-receiving device has a function of absorbing at least part of visible light and infrared light. The common layer includes a region positioned between the first pixel electrode and the common electrode, a region positioned between the second pixel electrode and the common electrode, and a region positioned between the third pixel electrode and the common electrode.

It is preferable that the display device of one embodiment of the present invention further include a third light-emitting device. At this time, it is preferable that the first light-emitting device and the second light-emitting device further include a third light-emitting layer. The third light-emitting device preferably include a fourth pixel electrode, a third optical adjustment layer, the first light-emitting layer, the second light-emitting layer, the third light-emitting layer, and the common electrode. The third light-emitting layer preferably includes a region positioned between the first pixel electrode and the common electrode, a region positioned between the second pixel electrode and the common electrode, and a region positioned between the fourth pixel electrode and the common electrode. The third light-emitting device preferably emits visible light emitted by the third light-emitting layer. The second light-emitting layer and the third light-emitting layer preferably emit light having different wavelengths from each other.

Alternatively, it is preferable that the first light-emitting device and the second light-emitting device further include a third light-emitting layer. The third light-emitting layer preferably includes a region positioned between the first pixel electrode and the common electrode and a region positioned between the second pixel electrode and the common electrode. The first light-emitting device preferably emits both infrared light emitted by the first light-emitting layer and visible light emitted by the third light-emitting layer. It is preferable that the first light-emitting device and the second light-emitting device further include a charge-generation layer. The charge-generation layer is preferably positioned between the first light-emitting layer and the second light-emitting layer.

The first light-emitting layer preferably includes a region positioned between the first optical adjustment layer and the second light-emitting layer and a region positioned between the second optical adjustment layer and the second light-emitting layer.

Another embodiment of the present invention is a display device including a first light-emitting device, a second light-emitting device, and a light-receiving device, in a display portion. The first light-emitting device includes a first pixel electrode, a first optical adjustment layer, a first light-emitting layer, a second light-emitting layer, a third light-emitting layer, a fourth light-emitting layer, and a common electrode. The second light-emitting device includes a second pixel electrode, a second optical adjustment layer, the first light-emitting layer, the second light-emitting layer, the third light-emitting layer, the fourth light-emitting layer, and the common electrode. The first optical adjustment layer is positioned between the first pixel electrode and the common electrode. The second optical adjustment layer is positioned between the second pixel electrode and the common electrode. The first light-emitting layer, the second light-emitting layer, the third light-emitting layer, and the fourth light-emitting layer each include a region positioned between the first pixel electrode and the common electrode and a region positioned between the second pixel electrode and the common electrode. The first light-emitting layer has a function of emitting infrared light. The second light-emitting layer has a function of emitting visible light. The third light-emitting layer has a function of emitting visible light having a shorter wavelength than visible light emitted by the second light-emitting layer. The fourth light-emitting layer has a function of emitting visible light having a shorter wavelength than visible light emitted by the third light-emitting layer. The light-receiving device includes a third pixel electrode, an active layer, and the common electrode. The active layer is positioned between the third pixel electrode and the common electrode. The active layer includes an organic compound. The first light-emitting device emits infrared light emitted by the first light-emitting layer. The second light-emitting device emits visible light emitted by the second light-emitting layer, the third light-emitting layer, or the fourth light-emitting layer. The light-receiving device has a function of absorbing at least part of visible light and infrared light.

The second light-emitting layer preferably has a function of emitting red light. The third light-emitting layer preferably has a function of emitting green light. The fourth light-emitting layer preferably has a function of emitting blue light.

It is preferable that the first light-emitting device and the second light-emitting device further include a first charge-generation layer. The first charge-generation layer is preferably positioned between the first light-emitting layer and the fourth light-emitting layer.

It is preferable that the first light-emitting device and the second light-emitting device further include a second charge-generation layer. The second charge-generation layer is preferably positioned between the first light-emitting layer and the second light-emitting layer.

It is preferable that the first light-emitting layer, the second light-emitting layer, the third light-emitting layer, and the fourth light-emitting layer be stacked in this order from a side close to the first optical adjustment layer, and that the first light-emitting layer, the second light-emitting layer, the third light-emitting layer, and the fourth light-emitting layer be stacked in this order from a side close to the second optical adjustment layer.

The first light-emitting device preferably emits both infrared light emitted by the first light-emitting layer and visible light emitted by the fourth light-emitting layer.

The first optical adjustment layer may be positioned between the first pixel electrode and the first light-emitting layer, and the first optical adjustment layer may be positioned between the common electrode and the first light-emitting layer It is preferable that the display portion further include a lens. The lens preferably includes a portion overlapping with the light-receiving device. Light passing through the lens enters the light-receiving device.

It is preferable that the display portion further include a partition. The partition preferably covers an end portion of the first pixel electrode, an end portion of the second pixel electrode, and an end portion of the third pixel electrode. It is preferable that the third pixel electrode be electrically insulated from each of the first pixel electrode and the second pixel electrode by the partition. The partition preferably has a function of absorbing at least part of light emitted by the first light-emitting device.

It is preferable that the display portion further include a colored layer. The colored layer preferably includes a portion in contact with a side surface of the partition. The colored layer preferably includes a color filter or a black matrix.

The display portion preferably has flexibility.

One embodiment of the present invention is a module including the light-emitting apparatus or the display device having any of the above-described structures, in which a connector such as a flexible printed circuit (hereinafter, also referred to as FPC) or a TCP (Tape Carrier Package) is attached or an integrated circuit (IC) is implemented by a COG (Chip On Glass) method, a COF (Chip On Film) method, or the like. Note that in this specification and the like, a module including a light-emitting apparatus is referred to as a light-emitting module, and a module including a display device is referred to as a display module in some cases.

One embodiment of the present invention is an electronic device including the above-described display module and at least one of an antenna, a battery, a housing, a camera, a speaker, a microphone, and an operation button.

Effect of the Invention

According to one embodiment of the present invention, a light-emitting apparatus having a function of emitting visible light and infrared light can be provided. According to one embodiment of the present invention, a highly convenient light-emitting apparatus can be provided. According to one embodiment of the present invention, a multifunctional light-emitting apparatus can be provided. According to one embodiment of the present invention, a novel light-emitting apparatus can be provided.

According to one embodiment of the present invention, a display device having a function of detecting light can be provided. According to one embodiment of the present invention, a display device having a function of emitting visible light and infrared light and a function of detecting light can be provided. According to one embodiment of the present invention, a highly convenient display device can be provided. According to one embodiment of the present invention, a multifunctional display device can be provided. According to one embodiment of the present invention, a novel display device can be provided.

Note that the description of the effects does not preclude the existence of other effects. One embodiment of the present invention does not need to have all the effects. Other effects can be derived from the descriptions of the specification, the drawings, and the claims.

BRIEF DESCRIPTION OF THE DRAWINGS

FIG. 6A to FIG. 6E each illustrate a stacked-layer structure of a light-emitting device.

FIG. 9A and FIG. 9B are cross-sectional views illustrating examples of a light-emitting apparatus.

FIG. 12A and FIG. 12B are cross-sectional views illustrating examples of a light-emitting apparatus.

FIG. 15A to FIG. 15F are top views illustrating examples of a pixel.

FIG. 19A and FIG. 19B are cross-sectional views illustrating examples of a display device.

FIG. 20A is a cross-sectional view illustrating an example of a display device. FIG. 20B illustrates an example of a transistor.

MODE FOR CARRYING OUT THE INVENTION

Figure 1A:
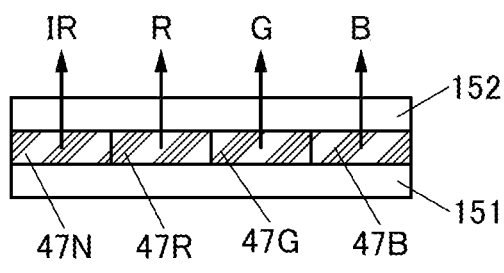
FIG. 1A and FIG. 1B are cross-sectional views illustrating examples of a light-emitting apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a light-emitting apparatus of one embodiment of the present invention will be described with reference to FIG. 1 to FIG. 13.

The light-emitting apparatus of one embodiment of the present invention includes a light-emitting device that emits infrared light and a light-emitting device that emits visible light. As the visible light, light with a wavelength greater than or equal to 400 nm and less than 750 nm, e.g., red light, green light, or blue light, can be given. As the infrared light, near-infrared light, specifically, light with a wavelength greater than or equal to 750 nm and less than or equal to 1300 nm, can be given.

In the light-emitting apparatus of one embodiment of the present invention, the light-emitting device emitting infrared light and the light-emitting device emitting visible light include and share a plurality of light-emitting layers. When optical adjustment layers having different thicknesses are provided in these two light-emitting devices, infrared light can be extracted from one of the light-emitting devices and visible light can be extracted from the other of the light-emitting devices.

The light-emitting apparatus of one embodiment of the present invention includes a first light-emitting device and a second light-emitting device. The first light-emitting device includes a first pixel electrode, a first optical adjustment layer, a first light-emitting layer, a second light-emitting layer, and a common electrode. The second light-emitting device includes a second pixel electrode, a second optical adjustment layer, the first light-emitting layer, the second light-emitting layer, and the common electrode. The first optical adjustment layer is positioned between the first pixel electrode and the common electrode. The second optical adjustment layer is positioned between the second pixel electrode and the common electrode. The first light-emitting layer and the second light-emitting layer each include a region positioned between the first pixel electrode and the common electrode and a region positioned between the second pixel electrode and the common electrode. The first light-emitting device emits infrared light emitted by the first light-emitting layer. The second light-emitting device emits visible light emitted by the second light-emitting layer.

A light-emitting material included in the first light-emitting layer preferably emits light with a maximum peak wavelength (also referred to as a wavelength at which the peak intensity is the highest) greater than or equal to 750 nm and less than or equal to 1300 nm. A light-emitting material included in the second light-emitting layer preferably emits light with a maximum peak wavelength greater than or equal to 400 nm and less than or equal to 750 nm. Note that even when a peak wavelength is described simply in this specification and the like, it can be rephrased as a maximum peak wavelength.

The light-emitting apparatus of one embodiment of the present invention can be used as a light source of a sensor (e.g., an image sensor or an optical touch sensor). Since the light-emitting apparatus of one embodiment of the present invention can emit both visible light and infrared light, the light-emitting apparatus can be combined with either a sensor that uses visible light as a light source or a sensor that uses infrared light as a light source and therefore is highly convenient. Furthermore, the light-emitting apparatus of one embodiment of the present invention can be used as a light source of a sensor that uses both visible light and infrared light as a light source, whereby the functionality of the sensor can be increased. Moreover, since the light-emitting apparatus of one embodiment of the present invention can emit visible light, it can be used as a display device.

In the light-emitting apparatus of one embodiment of the present invention, the light-emitting device emitting infrared light and the light-emitting device emitting visible light can share layers. Therefore, it is possible to add a function of emitting infrared light to the light-emitting apparatus without significantly increasing the number of manufacturing steps. For example, a layer(s) that is not used for optical adjustment of a hole-injection layer, a hole-transport layer, a light-emitting layer, an electron-transport layer, and an electron-injection layer can have the same structure for the light-emitting device emitting infrared light and the light-emitting device emitting visible light.

Figure 1B:
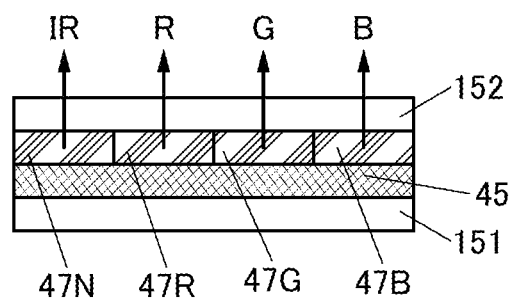

FIG. 1A and FIG. 1B are cross-sectional views each illustrating the light-emitting apparatus of one embodiment of the present invention.

A light-emitting apparatus 40A and a light-emitting apparatus 40B illustrated in FIG. 1A and FIG. 1B each emit red (R) light, green (G) light, blue (B) light, and infrared light (IR).

The light-emitting apparatus 40A and the light-emitting apparatus 40B each include a light-emitting device from which infrared light is extracted, in addition to light-emitting devices from which red light, green light, and blue light are extracted.

The light-emitting apparatus of one embodiment of the present invention can have any of a top-emission structure in which light is emitted in a direction opposite to a substrate where a light-emitting device is formed, a bottom-emission structure in which light is emitted toward the substrate where the light-emitting device is formed, and a dual-emission structure in which light is emitted toward both surfaces.

FIG. 1A and FIG. 1B illustrate light-emitting apparatuses in which the light-emitting devices emit light to a substrate 152 side.

The light-emitting apparatus 40A illustrated in FIG. 1A includes a light-emitting device 47N, a light-emitting device 47R, a light-emitting device 47G, and a light-emitting device 47B between a substrate 151 and the substrate 152.

The light-emitting apparatus 40B illustrated in FIG. 1B includes a layer 45 including transistors between the substrate 151 and the substrate 152, in addition to the structure of the light-emitting apparatus 40A.

In the light-emitting apparatus 40A and the light-emitting apparatus 40B, the light-emitting device 47N can emit infrared light (IR), the light-emitting device 47R can emit red (R) light, the light-emitting device 47G can emit green (G) light, and the light-emitting device 47B can emit blue (B) light.

The layer 45 including transistors includes a plurality of transistors. For example, the layer 45 including transistors includes a transistor that is electrically connected to the light-emitting device.

The maximum peak wavelength in the visible light region of the emission spectrum of the light-emitting device 47B (also referred to as a first peak wavelength) can be greater than or equal to 400 nm and less than or equal to 480 nm, for example.

The maximum peak wavelength in the visible light region of the emission spectrum of the light-emitting device 47R (also referred to as a second peak wavelength) can be greater than or equal to 580 nm and less than 750 nm, for example.

The maximum peak wavelength in the visible light region of the emission spectrum of the light-emitting device 47G (also referred to as a third peak wavelength) can be a wavelength between the first peak wavelength and the second peak wavelength. For example, the third peak wavelength can be greater than or equal to 480 nm and less than 580 nm.

The maximum peak wavelength in the infrared region of the emission spectrum of the light-emitting device 47N (also referred to as a fourth peak wavelength) can be a wavelength longer than the second peak wavelength. For example, the fourth peak wavelength can be greater than or equal to 750 nm and less than or equal to 1300 nm.

[Pixel]

Figure 1C:
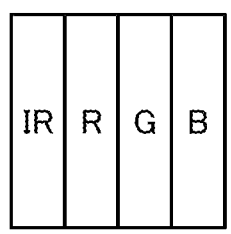
FIG. 1C and FIG. 1D are top views illustrating examples of a pixel.
Figure 1D:
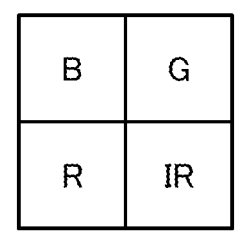

FIG. 1C and FIG. 1D illustrate structure examples of a pixel.

The light-emitting apparatus of one embodiment of the present invention includes a plurality of pixels arranged in a matrix. One pixel includes one or more subpixels. One subpixel includes one light-emitting device. For example, the pixel can have a structure including four subpixels (e.g., three colors of R, G, and B and infrared light, or three colors of yellow (Y), cyan (C), and magenta (M) and infrared light) or a structure including five subpixels (e.g., four colors of R, G, B, and white (W) and infrared light, or four colors of R, G, B, and Y and infrared light).

The pixels in FIG. 1C and FIG. 1D each include four subpixels (four light-emitting devices) of red (R), green (G), blue (B), and infrared light (IR). FIG. 1C illustrates an example in which the four subpixels are arranged in a horizontal line, and FIG. 1D illustrates an example in which the four subpixels are arranged in a matrix of 2×2.

[Structure of Light-Emitting Device (Single Structure)]

A structure of the light-emitting device included in the light-emitting apparatus of one embodiment of the present invention will be described below with reference to FIG. 2 to FIG. 5.

In this specification and the like, unless otherwise specified, in describing a structure including a plurality of elements (e.g., light-emitting devices and light-emitting layers), letters are not added when a common part of the elements is described. For example, when a common part of a light-emitting layer 193R, a light-emitting layer 193G, and the like is described, the light-emitting layers are simply referred to as the light-emitting layer 193, in some cases.

Light-emitting apparatuses illustrated in FIG. 2A, FIG. 2B, FIG. 3A, FIG. 3B, and FIG. 4 each include the light-emitting device 47B that emits blue (B) light, the light-emitting device 47G that emits green (G) light, the light-emitting device 47R that emits red (R) light, and the light-emitting device 47N that emits infrared light (IR), which are over the substrate 151 with the layer 45 including transistors therebetween.

The light-emitting device include a pixel electrode 191 and a common electrode 115. The pixel electrode 191 is provided in each of the light-emitting devices. The common electrode 115 is shared by the plurality of light-emitting devices. The pixel electrode 191 and the common electrode 115 may each have a single-layer structure or a stacked-layer structure.

The material, thickness, and the like of the pair of electrodes can be the same for the plurality of light-emitting devices. Accordingly, the manufacturing cost of the light-emitting apparatus can be reduced and the manufacturing process of the light-emitting apparatus can be simplified.

The light-emitting devices included in the light-emitting apparatus of one embodiment of the present invention preferably employ a micro optical resonator (microcavity) structure. Therefore, one of the pair of electrodes of the light-emitting devices is preferably an electrode having properties of transmitting and reflecting visible light and infrared light (a semi-transmissive semi-reflective electrode), and the other is preferably an electrode having a property of reflecting visible light and infrared light (a reflective electrode). When the light-emitting device have a microcavity structure, light emission obtained from the light-emitting layer can be resonated between the electrodes, whereby light emitted from the light-emitting device can be intensified.

Note that the semi-transmissive semi-reflective electrode can have a stacked-layer structure of a reflective electrode and an electrode having a property of transmitting visible light and infrared light (also referred to as a transparent electrode). In this specification and the like, the reflective electrode functioning as part of a semi-transmissive semi-reflective electrode may be referred to as a pixel electrode or a common electrode, and the transparent electrode may be referred to as an optical adjustment layer; in some cases, the transparent electrode (optical adjustment layer) can also be regarded as having a function of a pixel electrode or a common electrode.

The light transmittance of the transparent electrode is greater than or equal to 40%. For example, an electrode whose transmittance for each of visible light (light with a wavelength greater than or equal to 400 nm and less than 750 nm) and near-infrared light (light with a wavelength greater than or equal to 750 nm and less than or equal to 1300 nm) is greater than or equal to 40% is preferably used in the light-emitting device. The reflectivity of the semi-transmissive and semi-reflective electrode for each of visible light and infrared light is greater than or equal to 10% and less than or equal to 95%, preferably greater than or equal to 30% and less than or equal to 80%. The reflectivity of the reflective electrode for visible light and infrared light is greater than or equal to 40% and less than or equal to 100%, preferably greater than or equal to 70% and less than or equal to 100%. These electrodes preferably have a resistivity less than or equal to $1 \times 10^{-2}$ Ωcm.

FIG. 2A, FIG. 2B, FIG. 3A, and FIG. 3B illustrate top-emission light-emitting apparatuses in which the light-emitting devices are formed over the substrate 151 and emit light to the common electrode 115 side. Thus, a semi-transmissive and semi-reflective electrode is used as the common electrode 115, and a reflective electrode is used as the pixel electrode 191.

Figure 4:
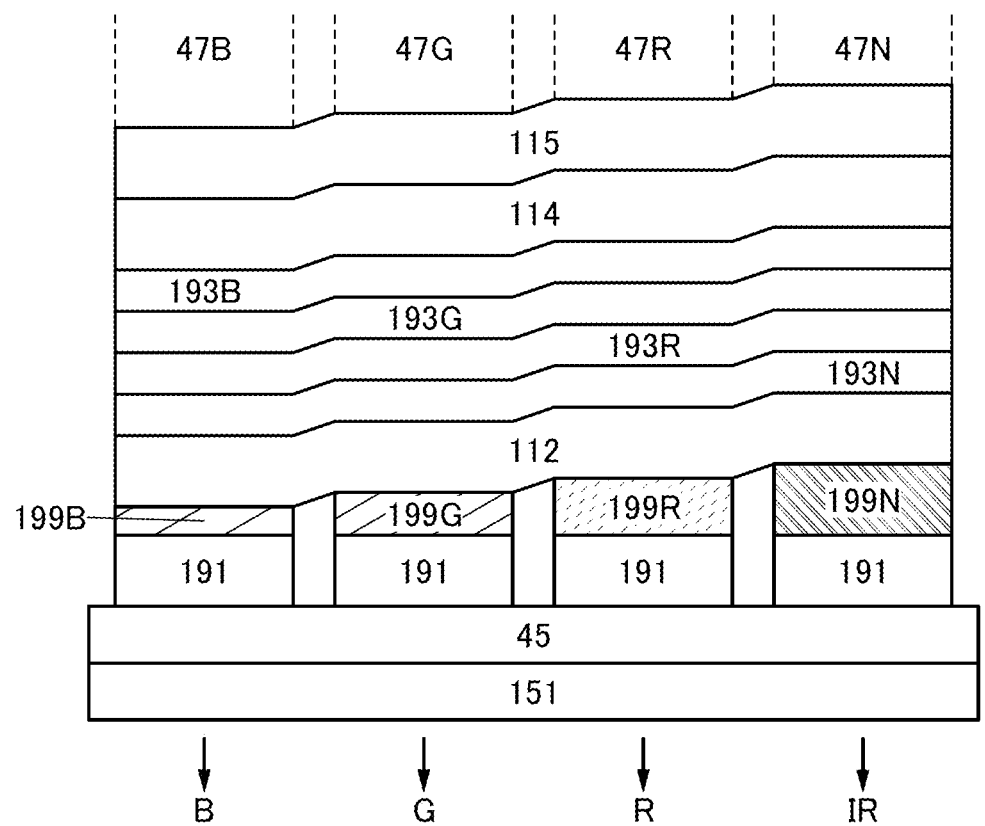
FIG. 4 illustrates a stacked-layer structure of a light-emitting device.

In contrast, FIG. 4 illustrates a bottom-emission light-emitting apparatus in which the light-emitting devices are formed over the substrate 151 and emit light to the substrate 151 side. Thus, a semi-transmissive and semi-reflective electrode is used as the pixel electrode 191, and a reflective electrode is used as the common electrode 115.

In the light-emitting apparatus of one embodiment of the present invention, it is preferable that an optical path length between the pair of electrodes be adjusted using an optical adjustment layer 199 in each light-emitting device and the other layers be shared by the plurality of light-emitting devices. Thus, the number of deposition steps in manufacturing the light-emitting apparatus can be reduced, leading to a reduction in the manufacturing cost of the light-emitting apparatus and simplification of the manufacturing process.

In the light-emitting device 47B emitting blue light, the thickness of an optical adjustment layer 199B is preferably adjusted so that the optical path length between the pair of electrodes becomes an optical path length that intensifies blue light emission. Similarly, in the light-emitting device 47G emitting green light, the thickness of an optical adjustment layer 199G is preferably adjusted so that the optical path length between the pair of electrodes becomes an optical path length that intensifies green light emission. Furthermore, in the light-emitting device 47R emitting red light, the thickness of an optical adjustment layer 199R is preferably adjusted so that the optical path length between the pair of electrodes becomes an optical path length that intensifies red light emission. Moreover, in the light-emitting device 47N emitting infrared light, the thickness of an optical adjustment layer 199N is preferably adjusted so that the optical path length between the pair of electrodes becomes an optical path length that intensifies infrared light emission. Note that when the semi-transmissive and semi-reflective electrode has a stacked-layer structure of a reflective electrode and an electrode having a property of transmitting visible light and infrared light (also referred to as a transparent electrode), the optical path length between the pair of electrodes represents the optical path length between a pair of reflective electrodes. The light-emitting apparatus of one embodiment of the present invention may include a light-emitting device without an optical adjustment layer. For example, the optical path length between the pair of electrodes may be such an optical path length that light emission with any the wavelength is intensified in the state where no optical adjustment layer is provided.

Specifically, adjustment is preferably performed so that the optical path length between the pixel electrode 191 and the common electrode 115 can be $n\lambda/2$ (n is a natural number) or the neighborhood thereof, where $\lambda$ is the wavelength of light obtained from the light-emitting layer 193.

Note that in this specification and the like, the wavelength k of the light obtained from the light-emitting layer 193 can be a peak wavelength (particularly, a maximum peak wavelength) of the light-emitting layer 193. Furthermore, in this specification and the like, the neighborhood of a wavelength X refers to a range within ±20 nm of X, preferably within ±10 nm of X.

The light-emitting device may have a single structure in which one light-emitting unit is provided between the pixel electrode 191 and the common electrode 115, or a tandem structure in which a plurality of light-emitting units are provided between them.

The light-emitting device preferably has a single structure because productivity is increased. It is preferable that the light-emitting device have a tandem structure in terms of advantages that, for example, optimization of the optical path length is facilitated and the emission intensity is increased.

FIG. 2A, FIG. 2B, FIG. 3A, FIG. 3B, and FIG. 4 illustrate examples in which the light-emitting devices each have a single structure.

Figure 2A:
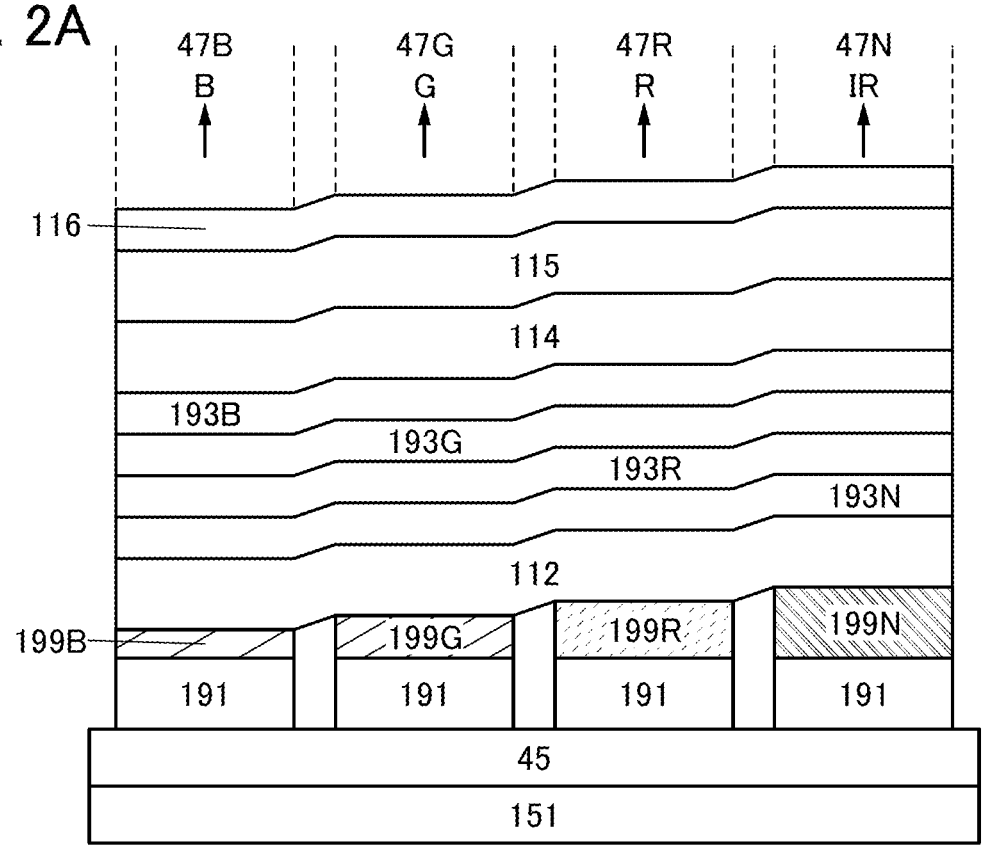
FIG. 2A and FIG. 2B each illustrate a stacked-layer structure of a light-emitting device.

The light-emitting devices in FIG. 2A have the same structure except for the optical adjustment layer 199.

Specifically, the light-emitting devices illustrated in FIG. 2A each include the pixel electrode 191, the optical adjustment layer 199, a common layer 112, a light-emitting layer 193N, the light-emitting layer 193R, the light-emitting layer 193G, a light-emitting layer 193B, a common layer 114, the common electrode 115, and a buffer layer 116, which are over the substrate 151 with the layer 45 including transistors therebetween.

The light-emitting layer 193N includes a light-emitting material that emits infrared light. The light-emitting layer 193R includes a light-emitting material that emits red light. The light-emitting layer 193G includes a light-emitting material that emits green light. The light-emitting layer 193B includes a light-emitting material that emits blue light.

The light-emitting device 47B illustrated in FIG. 2A includes the optical adjustment layer 199B between the pixel electrode 191 and the common layer 112. In the light-emitting device 47B, the thickness of the optical adjustment layer 199B is adjusted so that the optical path length between the pair of electrodes becomes an optical path length that intensifies blue light emission. Thus, blue light emitted by the light-emitting layer 193B can be extracted from the light-emitting device 47B.

Similarly, the light-emitting device 47G illustrated in FIG. 2A includes the optical adjustment layer 199G between the pixel electrode 191 and the common layer 112. In the light-emitting device 47G, the thickness of the optical adjustment layer 199G is adjusted so that the optical path length between the pair of electrodes becomes an optical path length that intensifies green light emission. Thus, green light emitted by the light-emitting layer 193G can be extracted from the light-emitting device 47G.

The light-emitting device 47R illustrated in FIG. 2A includes the optical adjustment layer 199R between the pixel electrode 191 and the common layer 112. In the light-emitting device 47R, the thickness of the optical adjustment layer 199R is adjusted so that the optical path length between the pair of electrodes becomes an optical path length that intensifies red light emission. Thus, red light emitted by the light-emitting layer 193R can be extracted from the light-emitting device 47R.

The light-emitting device 47N illustrated in FIG. 2A includes the optical adjustment layer 199N between the pixel electrode 191 and the common layer 112. In the light-emitting device 47N, the thickness of the optical adjustment layer 199N is adjusted so that the optical path length between the pair of electrodes becomes an optical path length that intensifies infrared light emission. Thus, infrared light emitted by the light-emitting layer 193N can be extracted from the light-emitting device 47N.

The light-emitting unit may further include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like, in addition to the light-emitting layer 193.

For example, the common layer 112 provided between the pixel electrode 191 and the light-emitting layer 193 preferably includes one or both of a hole-injection layer and a hole-transport layer. For example, the common layer 114 provided between the light-emitting layer 193 and the common electrode 115 preferably includes one or both of an electron-transport layer and an electron-injection layer. The common layer 112 and the common layer 114 may each have a single-layer structure or a stacked-layer structure.

In each of the light-emitting devices illustrated in FIG. 2A, the light-emitting layer 193N is provided over the common layer 112, the light-emitting layer 193R is provided over the light-emitting layer 193N, the light-emitting layer 193G is provided over the light-emitting layer 193R, the light-emitting layer 193B is provided over the light-emitting layer 193G, and the common layer 114 is provided over the light-emitting layer 193B. In other words, the light-emitting layer 193N, the light-emitting layer 193R, the light-emitting layer 193G, and the light-emitting layer 193B are stacked in this order from the optical adjustment layer 199 side.

Figure 2B:
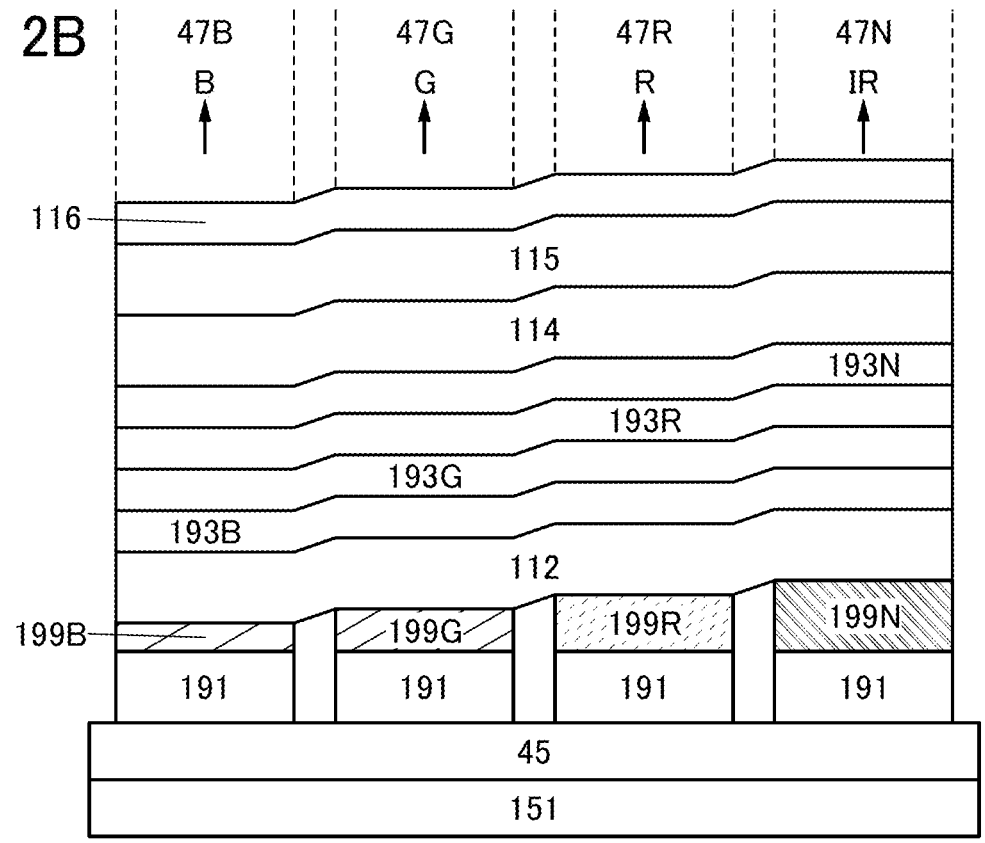

On the other hand, the light-emitting devices in FIG. 2B differ from the light-emitting devices in FIG. 2A in that the light-emitting layer 193B, the light-emitting layer 193G, the light-emitting layer 193R, and the light-emitting layer 193N are stacked in this order from the optical adjustment layer 199 side. Specifically, in each of the light-emitting device in FIG. 2B, the light-emitting layer 193B is provided over the common layer 112, the light-emitting layer 193G is provided over the light-emitting layer 193B, the light-emitting layer 193R is provided over the light-emitting layer 193G, the light-emitting layer 193N is provided over the light-emitting layer 193R, and the common layer 114 is provided over the light-emitting layer 193N.

Here, a preferred stacking order of the light-emitting layers is described with reference to FIG. 5. Specifically, a preferred stacking order of the light-emitting layers in one light-emitting unit is described.

In a microcavity structure, light with a wavelength having a value obtained by dividing a multiple of the optical path length between a pair of electrodes (including a phase shift due to reflection) by an integer can be intensified and extracted. For example, in the case where the optical path length is 500 nm, it is possible to intensify and extract light with (500×2/1=) 1000 nm, (500×2/2=) 500 nm, (500×2/3=) 333 nm, (500×2/4=) 250 nm, or the like. In addition, in the case where the optical path length is 500 nm, it is also possible to intensify and extract light with (500×3/1=) 1500 nm, (500×3/2=) 750 nm, (500×3/3=) 500 nm, (500×3/4=) 375 nm, or the like.

In order to increase the light extraction efficiency of the light-emitting device, not only the optical path length between the pair of electrodes but also the optical path length between a region where desired light of the light-emitting layer 193 is obtained (light-emitting region) and the electrode where reflection occurs is important. Specifically, light can be extracted efficiently when the optical path length between the pixel electrode 191 and the light-emitting region is $(2m'+1)\lambda/4$ or the neighborhood thereof and the optical path length between the common electrode 115 and the light-emitting region is $(2M+1)\lambda/4$ or the neighborhood thereof (m' and M each represent 0 or a natural number and n=m'+M+1). Here, the light-emitting region refers to a region where holes and electrons are recombined in the light-emitting layer.

For this reason, a preferred value of each of the optical path length between the pair of electrodes, the optical path length between the pixel electrode 191 and the light-emitting region, and the optical path length between the common electrode 115 and the light-emitting region varies depending on the wavelength of light to be extracted.

Note that when a certain metal film (e.g., a metal film containing a noble metal such as silver) is used as a reflective electrode, light extraction efficiency may be decreased by the influence of surface plasmon resonance (SPR). This is because light resonates with specific plasmon oscillation of the metal on a surface of the metal film or its vicinity, so that light with a wavelength corresponding to the specific oscillation cannot be extracted. This is more likely to occur as the optical path length between the reflective electrode and a light-emitting region of the light-emitting layer becomes shorter. In addition, it is likely to occur in a light-emitting device emitting blue light.

Therefore, in the top-emission light-emitting device, the optical path length from the pixel electrode 191 to the light-emitting region of the light-emitting layer 193B is preferably adjusted to $(2m'+1)\lambda/4$ (m' is a natural number) or the neighborhood thereof. Since the optical path length from the pixel electrode 191 (reflective electrode) to the light-emitting region of the blue-light-emitting layer 193B can be long, the influence of surface plasmon resonance can be reduced and the light extraction efficiency can be increased.

Meanwhile, in the bottom-emission light-emitting device, a reflective electrode is used as the common electrode 115. Therefore, in the bottom-emission light-emitting device, the optical path length from the common electrode 115 to the light-emitting region of the light-emitting layer 193B is preferably adjusted to $(2M+1)\lambda/4$ (M is a natural number) or the neighborhood thereof.

It is preferable that all the light-emitting layers be positioned close to each other in a light-emitting device with a single structure, in terms of emission efficiency. In a light-emitting device with a tandem structure, a plurality of light-emitting layers can be provided away from each other by separation of light-emitting units, and therefore, optimization of the optical path length is easier than in the light-emitting device with a single structure. Furthermore, the stacking order of the light-emitting units in the light-emitting device with a tandem structure is not particularly limited. However, in the case where one light-emitting unit includes a plurality of light-emitting layers in the light-emitting device with a tandem structure, these light-emitting layers need to be positioned close to each other in terms of emission efficiency in a manner similar to that in the light-emitting device with a single structure.

Figure 5:
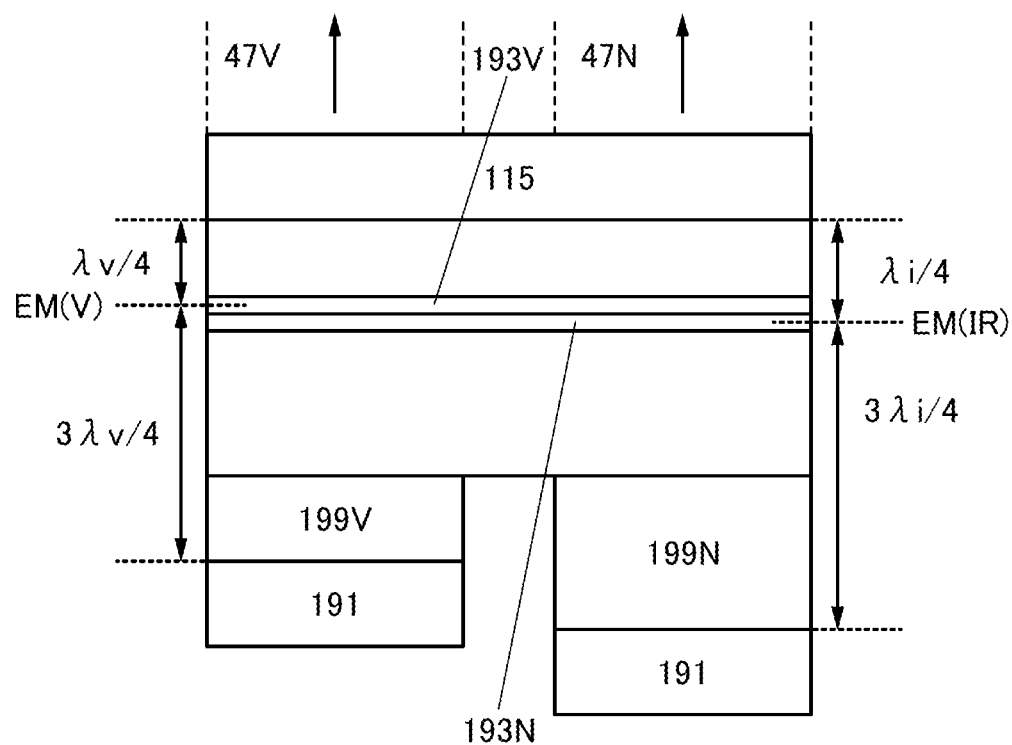
FIG. 5 illustrates a positional relation of light-emitting regions.

FIG. 5 illustrates the case where secondary light (n=2) of visible light $\lambda v$ is extracted from a light-emitting device 47V that emits visible light and secondary light (n=2) of infrared light $\lambda i$ is extracted from the light-emitting device 47N that emits infrared light.

The optical path length between a pair of electrodes in the light-emitting device 47V in FIG. 5 is $\lambda v$ (i.e., $n\lambda v/2$ and n=2). The optical path length between the pixel electrode 191 and a light-emitting region EM(V) of visible light is $3\lambda v/4$, and the optical path length between the common electrode 115 and the light-emitting region EM(V) of visible light is $\lambda v/4$.

Similarly, the optical path length between the pair of electrodes in the light-emitting device 47N in FIG. 5 is $\lambda i$. The optical path length between the pixel electrode 191 and a light-emitting region EM(IR) of infrared light is $3\lambda i/4$, and the optical path length between the common electrode 115 and the light-emitting region EM(IR) of infrared light is $\lambda i/4$.

The optical path length between the pixel electrode 191 and the light-emitting region EM can be adjusted with the use of the thickness of the optical adjustment layer 199. In the case where the same nth light (here, secondary light) is extracted, as the wavelength of the light becomes longer, the optical path length between the pixel electrode 191 and the light-emitting region EM is increased. Therefore, it is preferable that the thickness of the optical adjustment layer 199 be larger in the light-emitting device that emits light with a longer wavelength. That is, the thickness of the optical adjustment layer 199N of the light-emitting device emitting infrared light is preferably larger than the thickness of an optical adjustment layer 199V of the light-emitting device emitting visible light.

No optical adjustment layer is provided between the light-emitting layer and the common electrode 115; therefore, it is preferable that the optical path length between the common electrode 115 and the light-emitting region EM in each light-emitting device be adjusted with the stacking order of the light-emitting layers. In the case where the same nth light (here, secondary light) is extracted, as the wavelength of the light becomes longer, the optical path length between the common electrode 115 and the light-emitting region EM is increased. Therefore, it is preferable that a light-emitting layer emitting longer-wavelength light be farther from the common electrode 115, that is, closer to the optical adjustment layer 199.

As described above, the structure in which the light-emitting layers are stacked in descending order of the wavelength of emitted light from the optical adjustment layer 199 side (FIG. 2A) is preferable as compared to the structure in which the light-emitting layers are stacked in ascending order of the wavelength of emitted light from the optical adjustment layer 199 side (FIG. 2B). Thus, the optical path length between the pair of electrodes, the optical path length between the pixel electrode 191 and the light-emitting region, and the optical path length between the common electrode 115 and the light-emitting region can be adjusted to preferable values in the light-emitting devices, so that light with each wavelength can be extracted efficiently.

It is possible to provide an optical adjustment layer between the light-emitting layer and the pixel electrode 191 and between the light-emitting layer and the common electrode 115, in which case, however, the number of manufacturing steps of the light-emitting apparatus is increased. Therefore, it is preferable to provide an optical adjustment layer in only one of the positions. Furthermore, when the light-emitting layers are provided in descending order of the wavelength of emitted light from a side close to the optical adjustment layer, the optical path length between the other electrode and the light-emitting region can be adjusted to an appropriate value.

By such optical adjustment, the spectrum of specific monochromatic light obtained from the light-emitting layer 193 can be narrowed and light emission with high color purity can be obtained. In addition, a decrease in light extraction efficiency of the light-emitting device can be prevented and power consumption of the light-emitting apparatus can be reduced.

Strictly speaking, the optical path length between the pixel electrode 191 and the common electrode 115 is expressed by a value obtained by adding a phase shift generated due to reflection to the product of the refractive index and the distance from a reflecting surface of the pixel electrode 191 to a reflecting surface of the common electrode 115. However, it is difficult to precisely determine the reflecting surfaces of the pixel electrode 191 and the common electrode 115 and the phase shift. Therefore, the above effect can be regarded as being obtained sufficiently when certain positions in the pixel electrode 191 and common electrode 115 are assumed to be the reflecting surfaces and a certain phase shift is assumed.

In the same manner, strictly speaking, the optical path length between the pixel electrode 191 and the light-emitting region is expressed by a value obtained by adding a phase shift generated due to reflection to the product of the refractive index and the distance from the reflecting surface of the pixel electrode 191 to the light-emitting region in the light-emitting layer. However, it is difficult to precisely determine the reflecting surface and the phase shift in the pixel electrode 191 and the light-emitting region in the light-emitting layer. Therefore, the above effect is regarded as being obtained sufficiently when a certain position in the pixel electrode 191 is assumed to be a reflecting surface, a certain phase shift is assumed, and a certain position in the light-emitting layer is assumed to be the light-emitting region.

The light-emitting region in the light-emitting layer 193 can be assumed to be a surface on the pixel electrode 191 side, a surface on the common electrode 115 side, or the center of the light-emitting layer 193, for example.

As a specific example, the following is an estimate of the optical distance in the case where secondary light (n=2) of the visible light $\lambda v$ (v=467 nm, blue light) is extracted from the light-emitting device 47V and secondary light (n=2) of the infrared light $\lambda i$ ($\lambda i$=800 nm) is extracted from the light-emitting device 47N in FIG. 5.

The optical path length between the pixel electrode 191 and the light-emitting region EM(V) of visible light can be estimated to be approximately 350 mm and the optical path length between the pixel electrode 191 and the light-emitting region EM(IR) of infrared light can be estimated to be approximately 600 nm. Therefore, it is preferable that the thickness of the optical adjustment layer 199N be larger than the thickness of the optical adjustment layer 199V.

The optical path length between the common electrode 115 and the light-emitting region EM(V) of visible light can be estimated to be approximately 117 nm, and the optical path length between the common electrode 115 and the light-emitting region EM(IR) of infrared light can be estimated to be approximately 200 nm. Therefore, it is preferable that the light-emitting layer emitting infrared light be farther from the common electrode 115, i.e., be positioned closer to the optical adjustment layer 199 than the light-emitting layer emitting visible light (blue light in the specific example) is.

Note that in the above-described specific example, the light-emitting device 47V has a structure in which blue light ($\lambda v$=467 nm) emitted by a light-emitting layer 193V is extracted to the common electrode 115 side. Accordingly, as described above, when the optical path length from the pixel electrode 191 to the light-emitting region of the light-emitting layer 193V is adjusted to $3\lambda v/4$ (i.e., $(2m'+1)\lambda/4$ and m'=1) or the neighborhood thereof, the optical path length from the pixel electrode 191 (reflective electrode) to the light-emitting region of the light-emitting layer 193V can be long. Thus, the influence of surface plasmon resonance can be reduced and the extraction efficiency of blue light can be increased.

The optical adjustment layer 199 can be provided between the pixel electrode 191 and the common electrode 115 (between the pair of reflective electrodes in the case where the semi-transmissive and semi-reflective electrode has a stacked-layer structure of a reflective electrode and a transparent electrode), as appropriate.

A conductive film that transmits visible light and infrared light can be used as the optical adjustment layer 199.

For example, a material containing one or more kinds selected from indium (In), zinc (Zn), and tin (Sn) is preferably used as the conductive material transmitting visible light and infrared light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, zinc oxide containing gallium, and the like are given. Note that a film containing graphene can be used as well. The film containing graphene can be formed, for example, by reducing a film containing graphene oxide.

A conductive film that transmits visible light and infrared light can be formed using an oxide semiconductor (hereinafter, also referred to as an oxide conductive layer). For example, the oxide conductive layer preferably includes indium and further preferably includes an In-M-Zn oxide (M is Al, Ti, Ga, Y, Zr, La, Ce, Nd, Sn, or Hf).

An oxide semiconductor is a semiconductor material whose resistance can be controlled by oxygen vacancies in the film and/or the concentration of impurities such as hydrogen and water in the film. Thus, the resistivity of the oxide conductive layer can be controlled by selecting treatment for increasing oxygen vacancies and/or impurity concentration or treatment for reducing oxygen vacancies and/or impurity concentration, for an oxide semiconductor layer.

Note that such an oxide conductive layer formed using an oxide semiconductor can also be referred to as an oxide semiconductor layer having a high carrier density and a low resistance, an oxide semiconductor layer having conductivity, or an oxide semiconductor layer having high conductivity.

Alternatively, a layer containing a substance with a high hole-injection property, a substance with a high hole-transport property, a hole-blocking material, a substance with a high electron-transport property, a substance with a high electron-injection property, a substance with a bipolar property (a substance with high electron-transport and hole-transport properties), or the like can be used as the optical adjustment layer 199. Specifically, the optical adjustment layer 199 may also serve as any of a hole-injection layer, a hole-transport layer, an electron-transport layer, and an electron-injection layer.

A conductive film that transmits visible light and infrared light can be used as the optical adjustment layer 199 in FIG. 2A and FIG. 2B. One or both of a hole-injection layer and a hole-transport layer can be used as the common layer 112. Alternatively, the optical adjustment layer 199 in FIG. 2A and FIG. 2B may include a hole-injection layer, and the common layer 112 may include a hole-transport layer.

Figure 3A:
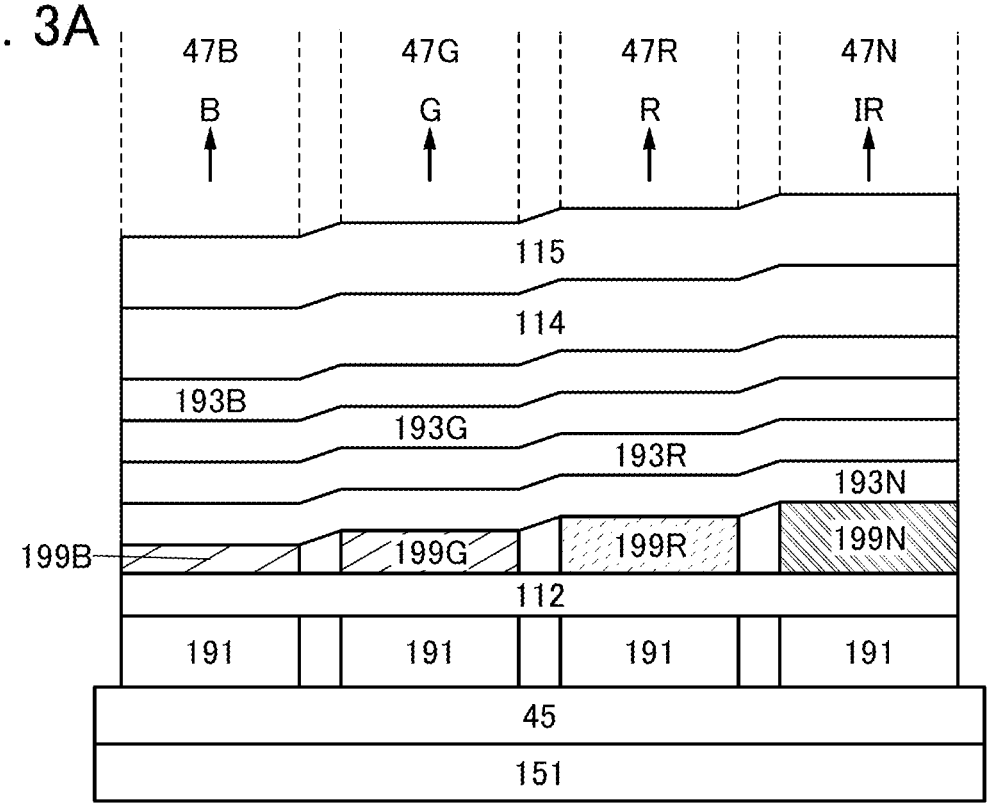
FIG. 3A and FIG. 3B each illustrate a stacked-layer structure of a light-emitting device.

FIG. 3A illustrates an example in which the optical adjustment layer 199 is provided between the common layer 112 and the light-emitting layer 193N. For example, a hole-injection layer can be used as the common layer 112, and a hole-transport layer can be used as the optical adjustment layer 199. Alternatively, one or both of a hole-injection layer and a hole-transport layer may be used as the optical adjustment layer 199 without providing the common layer 112.

Figure 3B:
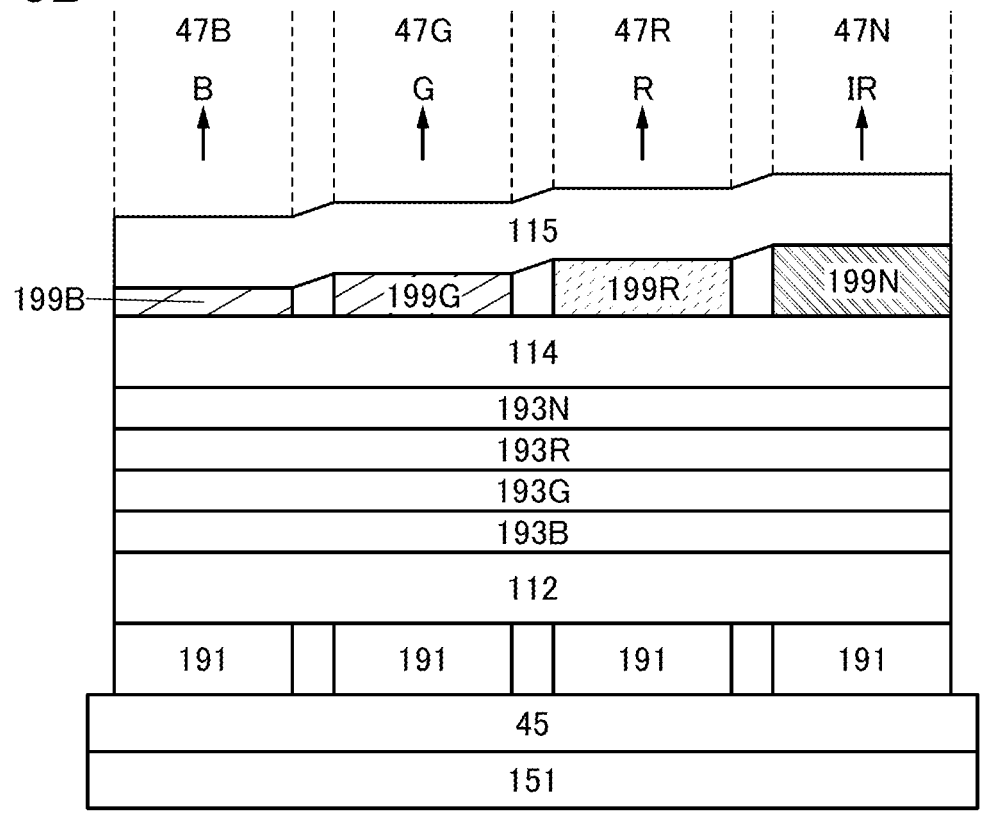

FIG. 3B illustrates an example in which the optical adjustment layer 199 is provided between the common layer 114 and the common electrode 115. For example, an electron-transport layer can be used as the common layer 114, and an electron-injection layer can be used as the optical adjustment layer 199. Alternatively, one or both of an electron-injection layer and an electron-transport layer may be used as the optical adjustment layer 199 without providing the common layer 114.

FIG. 4 illustrates an example of a bottom-emission light-emitting apparatus in which light-emitting devices emit light to the substrate 151 side. In FIG. 4, a reflective electrode is used as the pixel electrode 191, and a transparent electrode is used as the optical adjustment layer 199. The pixel electrode 191 and the optical adjustment layer 199 can constitute a semi-transmissive and semi-reflective electrode. Alternatively, a semi-transmissive and semi-reflective electrode may be used as the pixel electrode 191, and one or both of a hole-injection and a hole-transport layer may be used as the optical adjustment layer 199.

The light-emitting apparatuses illustrated in FIG. 2A and FIG. 2B each include the buffer layer 116 over the common electrode 115. An organic film, a semiconductor film, an inorganic insulating film, or the like can be given as the buffer layer 116. Since the light-emitting apparatuses illustrated in FIG. 2A and FIG. 2B each have a structure in which light emission of the light-emitting device is extracted to the buffer layer 116 side, the buffer layer 116 preferably has a function of transmitting visible light and infrared light. Thus, light absorption by the buffer layer 116 can be inhibited and the light extraction efficiency of the light-emitting device can be increased. As the organic film, a layer containing a substance with a high hole-injection property, a substance with a high hole-transport property, a hole-blocking material, a substance with a high electron-transport property, a substance with a high electron-injection property, a substance with a bipolar property, or the like that can be used in the light-emitting device can be given. As the semiconductor film, a semiconductor film that transmits visible light and infrared light can be given. As the organic insulating film, a silicon nitride film can be given, for example. The buffer layer 116 preferably has a passivation function. This can inhibit the entry of impurities such as moisture into the light-emitting device. In the case where the common electrode 115 has a function of reflecting visible light and infrared light, the buffer layer 116 is provided, whereby loss of optical energy due to a surface plasmon in the common electrode 115 can be reduced.

[Structure of Light-Emitting Device (Tandem Structure)]

Next, a structure of the light-emitting device included in the light-emitting apparatus of one embodiment of the present invention will be described with reference to FIG. 6.

FIG. 6A to FIG. 6D illustrate examples of a stacked-layer structure of a plurality of light-emitting units included in a light-emitting device with a tandem structure.

FIG. 6A and FIG. 6B illustrate examples in which a light-emitting unit 48a and a light-emitting unit 48b are stacked with an intermediate layer 198 therebetween.

FIG. 6C illustrates an example in which a light-emitting unit 48c and a light-emitting unit 48d are stacked with an intermediate layer 198a therebetween, and the light-emitting unit 48d and a light-emitting unit 48e are stacked with an intermediate layer 198b therebetween.

FIG. 6D illustrates an example in which the light-emitting unit 48e and the light-emitting unit 48c are stacked with the intermediate layer 198a therebetween, and the light-emitting unit 48c and the light-emitting unit 48d are stacked with the intermediate layer 198b therebetween.

The intermediate layers 198, 198a, and 198b each include at least a charge generation layer. The charge-generation layer is positioned between two light-emitting units. The charge-generation layer has a function of injecting electrons into one of the adjacent light-emitting units and injecting holes into the other light-emitting unit when a voltage is applied between the pair of electrodes. The intermediate layers 198, 198a, and 198b may each further include a layer containing a substance with a high hole-injection property, a substance with a high hole-transport property, a hole-blocking material, a substance with a high electron-transport property, a substance with a high electron-injection property, a substance with a bipolar property, or the like.

In the case of a single structure in which a plurality of light-emitting layers are included in one light-emitting unit, the plurality of light-emitting layers share excitons with each other, which may result in a reduction in the emission intensity of each light-emitting layer. When a plurality of light-emitting layers are separately provided in a plurality of light-emitting units, the emission intensity of each light-emitting layer can be increased. Note that as the number of light-emitting units is reduced, the number of layers included in the light-emitting device can be reduced, so that a reduction in the productivity can be inhibited. Therefore, the number of light-emitting units is preferably greater than or equal to one and less than or equal to three, further preferably one or two.

FIG. 6A to FIG. 6D are examples of the stacked light-emitting layers 193 in the case where a fluorescent material is used as a material emitting blue light, and phosphorescent materials are used as materials emitting infrared light, red light, and green light.

It is preferable that the light-emitting layer using a fluorescent material and the light-emitting layer using a phosphorescent material be separately provided in different light-emitting units. This can increase the emission intensity of the light-emitting layer using a fluorescent material.

In FIG. 6A and FIG. 6B, the light-emitting unit 48a is a fluorescent light-emitting unit, and the light-emitting unit 48b is a phosphorescent light-emitting unit. Here, the stacking order of the fluorescent light-emitting unit and the phosphorescent light-emitting unit does not matter. FIG. 6A illustrates an example in which the light-emitting unit 48a (fluorescent light-emitting unit) is positioned on the optical adjustment layer 199 side, and FIG. 6B illustrates an example in which the light-emitting unit 48b (phosphorescent light-emitting unit) is positioned on the optical adjustment layer 199 side.

The light-emitting unit 48b (phosphorescent light-emitting unit) includes the light-emitting layer 193N emitting infrared light, the light-emitting layer 193R emitting red light, and the light-emitting layer 193G emitting green light. These three light-emitting layers are preferably arranged in descending order of the wavelength of emitted light from a side close to the optical adjustment layer 199, as described above. Accordingly, in the light-emitting unit 48b, a light-emitting layer that is the closest to the optical adjustment layer 199 is preferably the light-emitting layer 193N emitting infrared light, and a light-emitting layer that is the farthest from the optical adjustment layer 199 is preferably the light-emitting layer 193G emitting green light. Thus, each of infrared light, red light, and green light can be extracted efficiently.

It is preferable that the light-emitting layer emitting infrared light and the light-emitting layer emitting visible light be separately provided in different light-emitting units. For example, in the case where the light-emitting layer emitting infrared light has lower emission intensity than the light-emitting layer emitting visible light, they are separately provided in different light-emitting units, whereby the emission intensity of infrared light can be increased.

In FIG. 6C and FIG. 6D, the light-emitting unit 48c is a fluorescent light-emitting unit of visible light, the light-emitting unit 48d is a phosphorescent light-emitting unit of visible light, and the light-emitting unit 48e is a phosphorescent light-emitting unit of infrared light. Here, the stacking order of the three light-emitting units does not matter. FIG. 6C illustrates an example in which the light-emitting unit 48c (fluorescent light-emitting unit) is the closest to the optical adjustment layer 199 and the light-emitting unit 48e (phosphorescent light-emitting unit of infrared light) is the farthest from the optical adjustment layer 199, and FIG. 6D illustrates an example in which the light-emitting unit 48e (phosphorescent light-emitting unit of infrared light) is the closet to the optical adjustment layer 199 and the light-emitting unit 48d (phosphorescent light-emitting unit of visible light) is the farthest from the optical adjustment layer 199.

The light-emitting unit 48d (phosphorescent light-emitting unit of visible light) includes the light-emitting layer 193R emitting red light and the light-emitting layer 193G emitting green light. These two light-emitting layers are preferably arranged in descending order of the wavelength of emitted light from a side close to the optical adjustment layer 199, as described above. Accordingly, in the light-emitting unit 48d, the light-emitting layer 193R emitting red light is preferably closer to the optical adjustment layer 199 than the light-emitting layer 193G emitting green light is. Thus, both red light and green light can be extracted efficiently.

A light-emitting apparatus illustrated in FIG. 6E includes the light-emitting device 47B that emits blue (B) light, the light-emitting device 47G that emits green (G) light, the light-emitting device 47R that emits red (R) light, and the light-emitting device 47N that emits infrared light (IR), which are over the substrate 151 with the layer 45 including transistors therebetween.

FIG. 6E illustrates an example to which the stacked-layer structure of the light-emitting units illustrated in FIG. 6A is applied.

The light-emitting devices illustrated in FIG. 6E each include the pixel electrode 191, the optical adjustment layer 199, the common layer 112, the light-emitting layer 193B, the intermediate layer 198, the light-emitting layer 193N, the light-emitting layer 193R, the light-emitting layer 193G, the common layer 114, the common electrode 115, and the buffer layer 116, which are over the substrate 151 with the layer 45 including transistors therebetween.

The blue light-emitting layer and the light-emitting layers of the other colors are provided in different light-emitting units, whereby the emission intensity and emission efficiency of each light-emitting layer can be increased even when a fluorescent material is used only in the blue light-emitting layer. In addition, the light-emitting layers are stacked in descending order of the wavelength of emitted light from the optical adjustment layer 199 side in one light-emitting unit, which facilitates optical adjustment using the optical adjustment layers 199N, 199R, and 199G, so that each of red light, green light, and infrared light can be extracted with high efficiency.

Modification Examples

The light-emitting apparatus of one embodiment of the present invention can have a structure in which one subpixel emits both visible light and infrared light. For example, any of three subpixels exhibiting red, green, and blue can have a structure that emits infrared light. When a subpixel emitting visible light also serves as a subpixel emitting infrared light, it is not necessary to provide another subpixel emitting infrared light. Therefore, the light-emitting apparatus can emit both visible light and infrared light without an increase in the number of subpixels included in one pixel. Accordingly, a decrease in the aperture ratio of a pixel can be inhibited, so that the emission efficiency of the light-emitting apparatus can be increased.

Figure 7A:
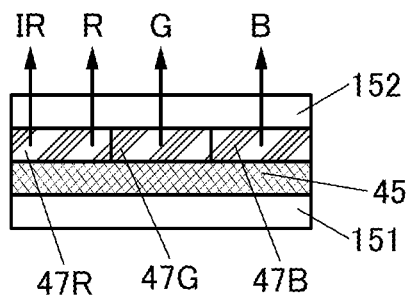
FIG. 7A to FIG. 7C are cross-sectional views illustrating examples of a light-emitting apparatus.
Figure 7B:
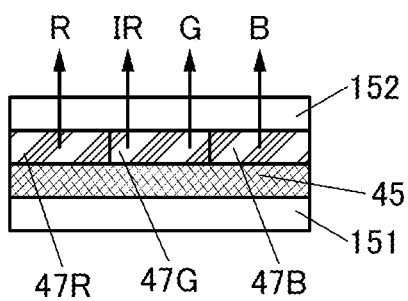
Figure 7C:
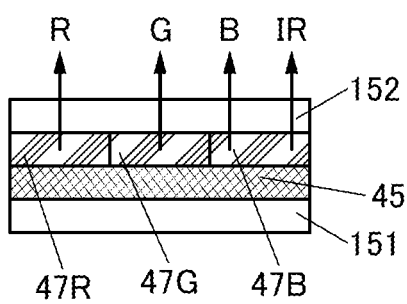

FIG. 7A to FIG. 7C are cross-sectional views of light-emitting apparatuses of one embodiment of the present invention.

A light-emitting apparatus 40C to a light-emitting apparatus 40E illustrated in FIG. 7A to FIG. 7C each have a structure from which red (R) light, green (G) light, blue (B) light, and infrared light (IR) are emitted.

In the light-emitting apparatus 40C to the light-emitting apparatus 40E, a light-emitting device that emits any one of red light, green light, and blue light can also emit infrared light.

The light-emitting apparatus 40C to the light-emitting apparatus 40E illustrated in FIG. 7A to FIG. 7C each include the layer 45 including transistors, the light-emitting device 47R, the light-emitting device 47G, and the light-emitting device 47B between the substrate 151 and the substrate 152.

In the light-emitting apparatus 40C, the light-emitting device 47R can emit both red (R) light and infrared light (IR), the light-emitting device 47G can emit green (G) light, and the light-emitting device 47B can emit blue (B) light.

In the light-emitting apparatus 40D, the light-emitting device 47G can emit both green (G) light and infrared light (IR), the light-emitting device 47R can emit red (R) light, and the light-emitting device 47B can emit blue (B) light.

In the light-emitting apparatus 40E, the light-emitting device 47B can emit both of blue (B) light and infrared light (IR), the light-emitting device 47R can emit red (R) light, and the light-emitting device 47G can emit green (G) light.

FIG. 7D to FIG. 7H illustrate structure examples of a pixel.

Figure 7D:
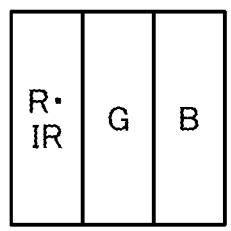
FIG. 7D to FIG. 7H are top views illustrating examples of a pixel.
Figure 7E:
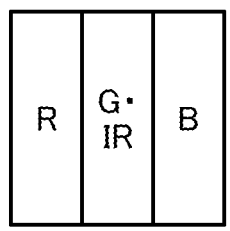
Figure 7F:
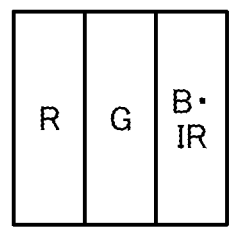

Pixels illustrated in FIG. 7D to FIG. 7F each include subpixels of three colors (three light-emitting devices) of red (R), green (G), and blue (B). In the light-emitting apparatus of one embodiment of the present invention, at least one of these subpixels that form a pixel emits infrared light in addition to visible light.

FIG. 7D illustrates a structure in which the red (R) subpixel emits infrared light (IR), FIG. 7E illustrates a structure in which the green (G) subpixel emits infrared light (IR), and FIG. 7F illustrates a structure in which the blue (B) subpixel emits infrared light (IR).

Figure 7G:
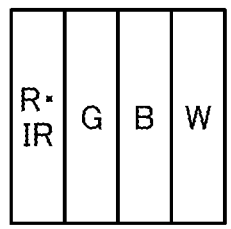
Figure 7H:
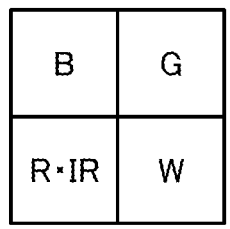

Pixels illustrated in FIG. 7G and FIG. 7H each include subpixels of four colors (four light-emitting devices) of red (R), green (G), blue (B), and white (W). Although FIG. 7G and FIG. 7H each illustrate a structure in which the red (R) subpixel emits infrared light (IR), the structure is not limited thereto; a subpixel of another color may emit infrared light. FIG. 7G illustrates an example in which the four subpixels are arranged in a horizontal line, and FIG. 7H illustrates an example in which the four subpixels are arranged in a matrix of 2×2.

As described above, in a microcavity structure, light with a wavelength having a value obtained by dividing a multiple of the optical path length between a pair of electrodes (including a phase shift due to reflection) by an integer can be intensified and extracted. Accordingly, when the optical path length that is a common multiple of visible light and infrared light is employed, both visible light and infrared light can be extracted efficiently.

Here, some standards are established as quality indicators for full-color display. For example, the sRGB standard, which is an international standard for color spaces defined by the International Electrotechnical Commission (IEC) to standardize color reproductions different between devices such as displays, printers, digital cameras, and scanners, is widely used. As other standards, the NTSC standard, which is a color gamut standard for analog television systems defined by the National Television System Committee in America, the DCI-P3 (Digital Cinema Initiatives) standard, which is the international unified standard used in distributing digital movies (cinema), Recommendation ITU-R BT.2020 (hereinafter referred to as BT.2020), which is the standard defined by NHK and used for high-definition UHDTV (Ultra High Definition Television, also referred to as Super Hi-Vision), and the like can be given. The wavelengths of R, G, and B are defined by such standards, and therefore, the wavelength of infrared light that can be extracted together with visible light is limited.

For example, the wavelengths of light corresponding to R, G, and B defined by BT.2020 and nth light thereof (n is a natural number) are listed in Table 1. In Table 1, wavelengths of infrared light that can be extracted by application of nth light of R, G, and B are shown in parentheses.

TABLE 1

| n | 1 | 2 | 3 | 4 |
|---|---|---|---|---|
| R | 630 nm | 1260 nm (1260 nm) | 1890 nm (945 nm) | 2520 nm (840 nm) |
| G | 532 nm | 1064 nm (1064 nm) | 1596 nm (798 nm) | 2128 nm (709 nm) |
| B | 467 nm | 934 nm (934 nm) | 1401 nm (700 nm) | 1868 nm (934 nm) |

As shown in Table 1, the wavelength of infrared light that can be intensified and extracted together with any of R, G, and B light defined by BT.2020 owing to a microcavity structure can be estimated. Note that n is preferably greater than or equal to one and less than or equal to four because the light extraction efficiency is decreased when n is too large. Thus, it is found that, 934 nm, 1064 nm, and 1260 nm, which are wavelengths corresponding to those of R, G, and B in the case of n=2; 798 nm and 945 nm, which are wavelengths obtained by dividing the wavelengths of R and G in the case of n=3 by two; 840 nm, which is a wavelength obtained by dividing the wavelength of R in the case of n=4 by three; and the like are infrared light that can be intensified and extracted together with any of R, G, and B light.

From the above, it is preferable that the color of nth light be determined appropriately in accordance with a wavelength of infrared light that is desired to be extracted. In addition, it is preferable to adjust the thickness of the optical adjustment layer so that the light-emitting device emitting both visible light and infrared light can have an optical path length that intensifies both visible light (red, green or blue) and infrared light.

Figure 8A:
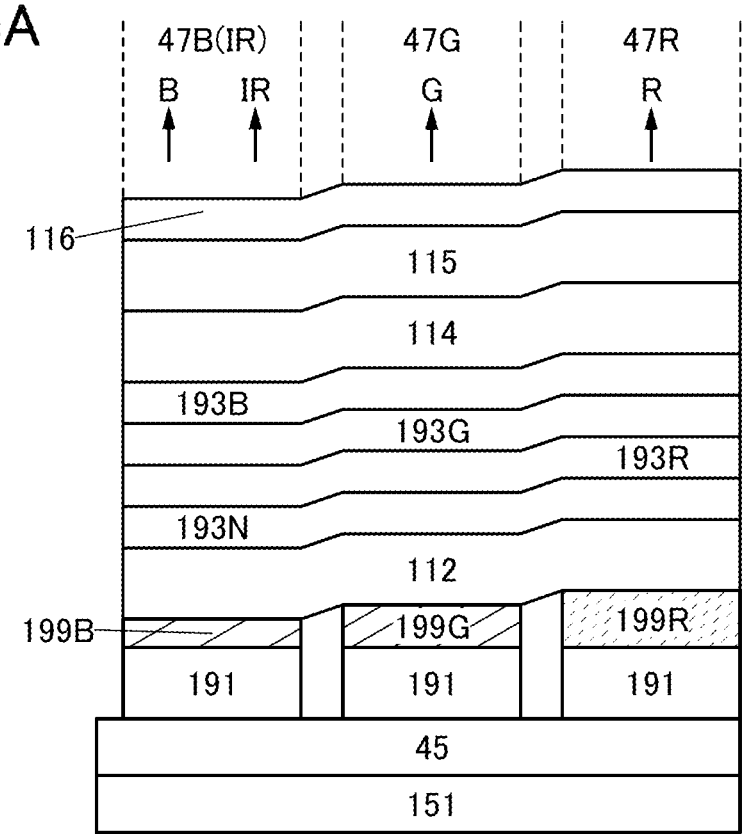
FIG. 8A and FIG. 8B each illustrate a stacked-layer structure of a light-emitting device.

A light-emitting apparatus illustrated in FIG. 8A includes the light-emitting device 47R emitting red (R) light, the light-emitting device 47G emitting green (G) light, and a light-emitting device 47B(IR) emitting blue (B) light and infrared light, which are over the substrate 151 with the layer 45 including transistors therebetween.

The light-emitting apparatus illustrated in FIG. 8A has a structure in which the light-emitting device 47B(IR) emits blue light and infrared light.

The light-emitting devices in FIG. 8A have structures similar to those of the light-emitting devices in FIG. 2A. In the light-emitting device 47B(IR), when the thickness of the optical adjustment layer 199B is adjusted so that the optical path length between the pair of electrodes becomes an optical path length that intensifies both blue light emission and infrared light emission, blue light and infrared light can be extracted efficiently.

Alternatively, light-emitting devices with the same structure may be used as the light-emitting device emitting light of any of R, G, and B and the light-emitting device 47N emitting infrared light (IR).

Figure 8B:
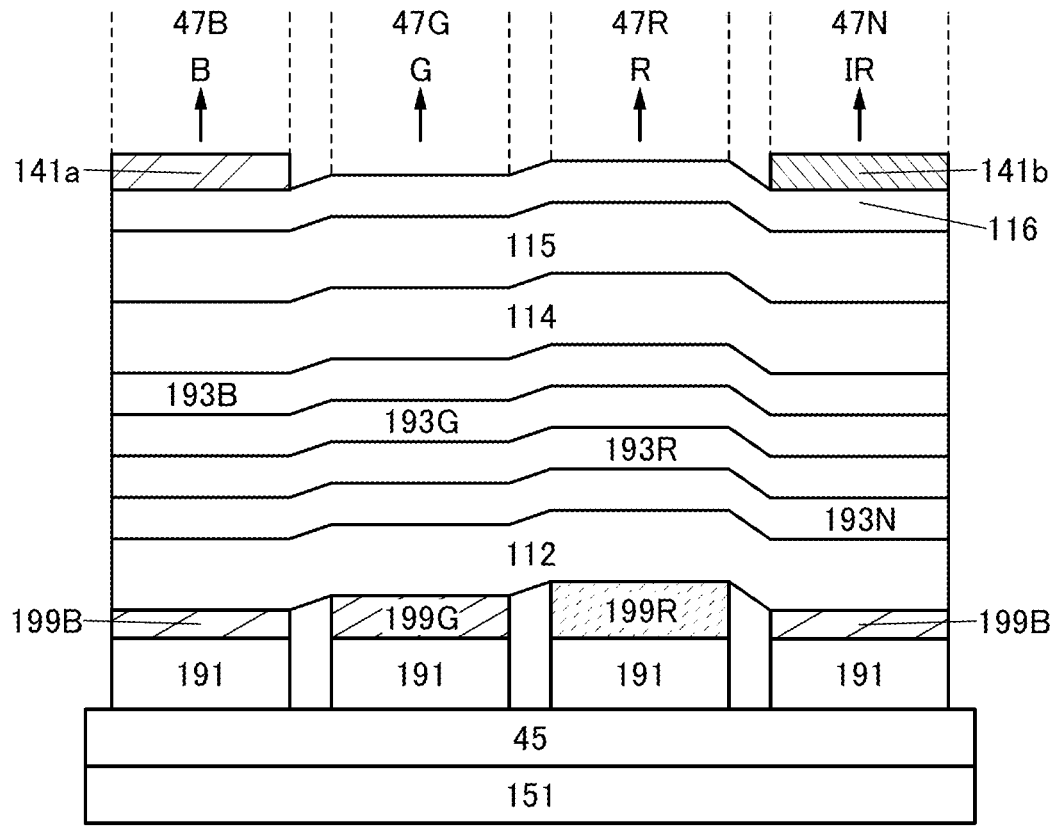

FIG. 8B illustrates an example in which light-emitting devices with the same structure are applied to the light-emitting device 47B emitting blue (B) light and the light-emitting device 47N emitting infrared light (IR).

A light-emitting apparatus illustrated in FIG. 8B includes the light-emitting device 47R emitting red (R) light, the light-emitting device 47G emitting green (G) light, the light-emitting device 47B emitting blue (B) light, and the light-emitting device 47N emitting infrared light (IR), which are over the substrate 151 with the layer 45 including transistors therebetween.

A structure that emits blue light and infrared light is applied to each of the light-emitting device 47R and the light-emitting device 47N. In the light-emitting device 47B, infrared light is blocked by a filter 141a provided over the buffer layer 116 and only blue light is extracted to the outside. In the light-emitting device 47N, blue light is blocked by a filter 141b provided over the buffer layer 116 and only infrared light is extracted to the outside.

As described above, the light-emitting device emitting visible light and the light-emitting device emitting infrared light include and share a plurality of light-emitting layers. In addition, it is possible to separately form the light-emitting device emitting visible light and the light-emitting device emitting infrared light by varying the thicknesses of the optical adjustment layers. Thus, a subpixel that emits infrared light can be provided without a significant increase in the number of manufacturing steps of the light-emitting apparatus.

The structure of the light-emitting apparatus of one embodiment of the present invention will be described below with reference to FIG. 9 and FIG. 10. Of four devices that emit infrared light, red light, green light, and blue light, the light-emitting device emitting infrared light and the light-emitting device emitting blue light are mainly described below. The light-emitting devices emitting red light and green light can have the same structure as the light-emitting device emitting infrared light and the light-emitting device emitting blue light except for the thickness of the optical adjustment layer.

[Light-Emitting Apparatus 30A and Light-Emitting Apparatus 30B]

FIG. 9A illustrates a cross-sectional view of a light-emitting apparatus 30A, and FIG. 9B illustrates a cross-sectional view of a light-emitting apparatus 30B.

The light-emitting apparatus 30A and the light-emitting apparatus 30B each include a light-emitting device 190B and a light-emitting device 190N. The light-emitting device 190B has a function of emitting blue light 21B. The light-emitting device 190N has a function of emitting infrared light 21N.

The light-emitting device 190B and the light-emitting device 190N each include the pixel electrode 191, the common layer 112, the light-emitting layer 193, the common layer 114, and the common electrode 115.

The light-emitting device 190B includes the optical adjustment layer 199B between the pixel electrode 191 and the common layer 112. In the light-emitting device 190B, the thickness of the optical adjustment layer 199B is adjusted so that the optical path length between the pair of electrodes becomes an optical path length that intensifies blue light emission. Thus, blue light can be extracted from the light-emitting device 190B.

The light-emitting device 190N includes the optical adjustment layer 199N between the pixel electrode 191 and the common layer 112. In the light-emitting device 190N, the thickness of the optical adjustment layer 199N is adjusted so that the optical path length between the pair of electrodes becomes an optical path length that intensifies infrared light emission. Thus, infrared light can be extracted from the light-emitting device 190N.

It is preferable that visible light extracted from the light-emitting device be extracted to the outside of the light-emitting apparatus through an optical filter such as a coloring layer (e.g., a color filter). FIG. 9A illustrates an example in which the light 21B is extracted from the light-emitting device 190B through a blue coloring layer CFB. Similarly, infrared light extracted from the light-emitting device may also be extracted to the outside of the light-emitting apparatus through an optical filter. The light-emitting apparatus 30B in FIG. 9B is an example in which the infrared light 21N is extracted from the light-emitting device 190N through an optical filter IRF.

Note that in FIG. 9A and the like, a plurality of light-emitting layers are denoted by one light-emitting layer 193. The light-emitting layer 193 includes a light-emitting layer that emits infrared light and a light-emitting layer that emits visible light. The light-emitting layer 193 preferably includes a plurality of light-emitting layers that emit visible light. A combination by which white light emission is obtained, e.g., three light-emitting layers of R, G, and B or three light-emitting layers of Y, C, and M, is preferably used for the light-emitting layers emitting visible light.

Since the light-emitting device 190B and the light-emitting device 190N each have a single structure, it is preferable that the plurality of light-emitting layers be stacked in descending order of the wavelength of emitted light from the optical adjustment layer 199 side, as described above. In other words, a light-emitting layer that is the closest to the optical adjustment layer 199 is preferably the light-emitting layer emitting infrared light.

The pixel electrode 191, the optical adjustment layer 199, the common layer 112, the light-emitting layer 193, the common layer 114, and the common electrode 115 may each have a single-layer structure or a stacked-layer structure.

The pixel electrode 191 is positioned over an insulating layer 214. The pixel electrodes 191 included in the light-emitting devices can be formed using the same material in the same step.

As the common layer 112, one or both of a hole-injection layer and a hole-transport layer can be formed, for example.

As the common layer 114, one or both of an electron-injection layer and an electron-transport layer can be formed, for example.

The common electrode 115 includes a portion overlapping with the pixel electrode 191 with the optical adjustment layer 199B, the common layer 112, the light-emitting layer 193, and the common layer 114 therebetween. The common electrode 115 includes a portion overlapping with the pixel electrode 191 with the optical adjustment layer 199N, the common layer 112, the light-emitting layer 193, and the common layer 114 therebetween. The common electrode 115 is a layer shared by the light-emitting device 190B and the light-emitting device 190N.

The light-emitting apparatus 30A and the light-emitting apparatus 30B each include the light-emitting device 190B, the light-emitting device 190N, a transistor 42, and the like between the pair of substrates (the substrate 151 and the substrate 152).

A light-blocking layer BM is preferably provided on a surface of the substrate 152 on the substrate 151 side. The light-blocking layer BM has openings in positions overlapping with the light-emitting devices.

For the light-blocking layer BM, a material that blocks light emitted from the light-emitting device 190 can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

In the light-emitting device 190, the common layer 112, the light-emitting layer 193, and the common layer 114, which are positioned between the pixel electrode 191 and the common electrode 115, can each be referred to as an EL layer.

The pixel electrode 191 preferably has a function of reflecting visible light and infrared light. An end portion of the pixel electrode 191 is covered with a partition 216. The common electrode 115 has a function of transmitting visible light and infrared light. The light-emitting device 190 is an electroluminescent device that emits light to the substrate 152 side by applying a voltage between the pixel electrode 191 and the common electrode 115 (see the light 21B and the infrared light 21N).

The pixel electrode 191 is electrically connected to a source or a drain of the transistor 42 through an opening provided in the insulating layer 214. The end portion of the pixel electrode 191 is covered with the partition 216. The transistor 42 has a function of controlling the driving of the light-emitting device 190.

The light-emitting device 190 is preferably covered with a protective layer 195. In FIG. 9A, the protective layer 195 is provided on and in contact with the common electrode 115. With the protective layer 195, entry of impurities such as water into the light-emitting device 190 can be inhibited, leading to an increase in the reliability of the light-emitting device 190. The protective layer 195 and the substrate 152 are bonded to each other with an adhesive layer 142. Note that the protective layer 195 may include the buffer layer 116 or may also have the function of the buffer layer 116. Alternatively, the protective layer 195 may be provided over the common electrode 115 with the buffer layer 116 therebetween.

Note that as illustrated in FIG. 9B, the protective layer is not necessarily provided over the light-emitting device 190. In FIG. 9B, the common electrode 115 and the substrate 152 are attached to each other with the adhesive layer 142.

[Light-Emitting Apparatus 30C]

Figure 10A:
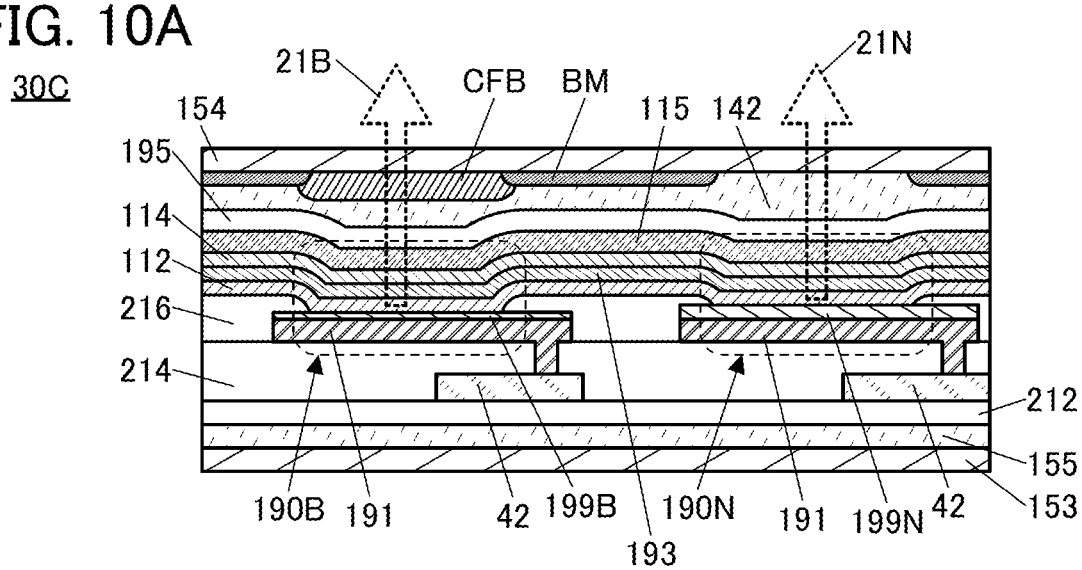
FIG. 10A and FIG. 10B are cross-sectional views illustrating examples of a light-emitting apparatus.

FIG. 10A illustrates a cross-sectional view of a light-emitting apparatus 30C.

The light-emitting apparatus 30C illustrated in FIG. 10A differs from the light-emitting apparatus 30A in that the substrate 151 and the substrate 152 are not included and a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The light-emitting apparatus 30C has a structure formed in such a manner that the insulating layer 212, the transistor 42, the light-emitting device 190, and the like that are formed over a formation substrate are transferred onto the substrate 153. The substrate 153 and the substrate 154 are preferably flexible. Accordingly, the flexibility of the light-emitting apparatus 30C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the light-emitting apparatus of this embodiment, a film having high optical isotropy may be used. Examples of a highly optically isotropic film include a triacetyl cellulose (TAC, also referred to as cellulose triacetate) film, a cycloolefin polymer (COP) film, a cycloolefin copolymer (COC) film, and an acrylic film.

[Light-Emitting Apparatus 30D]

Figure 10B:
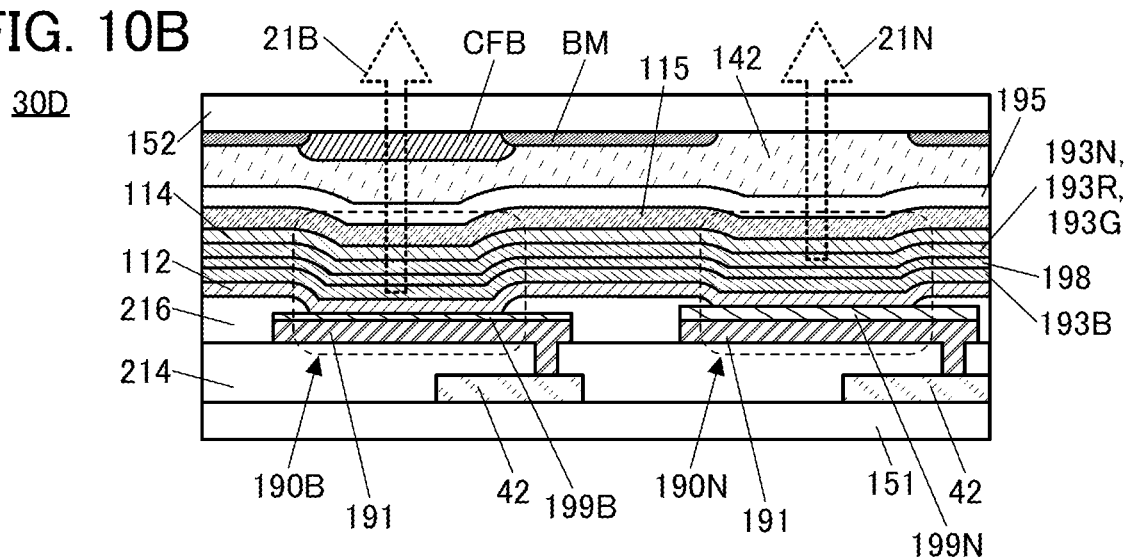

FIG. 10B illustrates a cross-sectional view of a light-emitting apparatus 30D.

The light-emitting apparatus 30D differs from the light-emitting apparatus 30A in including the intermediate layer 198 between the light-emitting layer 193B and the light-emitting layers 193N, 193R, and 193G. In other words, the light-emitting device 190 of the light-emitting apparatus 30A has a single structure, whereas the light-emitting device 190 of the light-emitting apparatus 30D has a tandem structure.

It is preferable that the light-emitting device have a tandem structure in terms of advantages that, for example, optimization of the optical path length is facilitated and the emission intensity is increased.

A more detailed structure of the light-emitting apparatus of one embodiment of the present invention will be described below with reference to FIG. 11 to FIG. 13.

[Light-Emitting Apparatus 200A]

Figure 11:
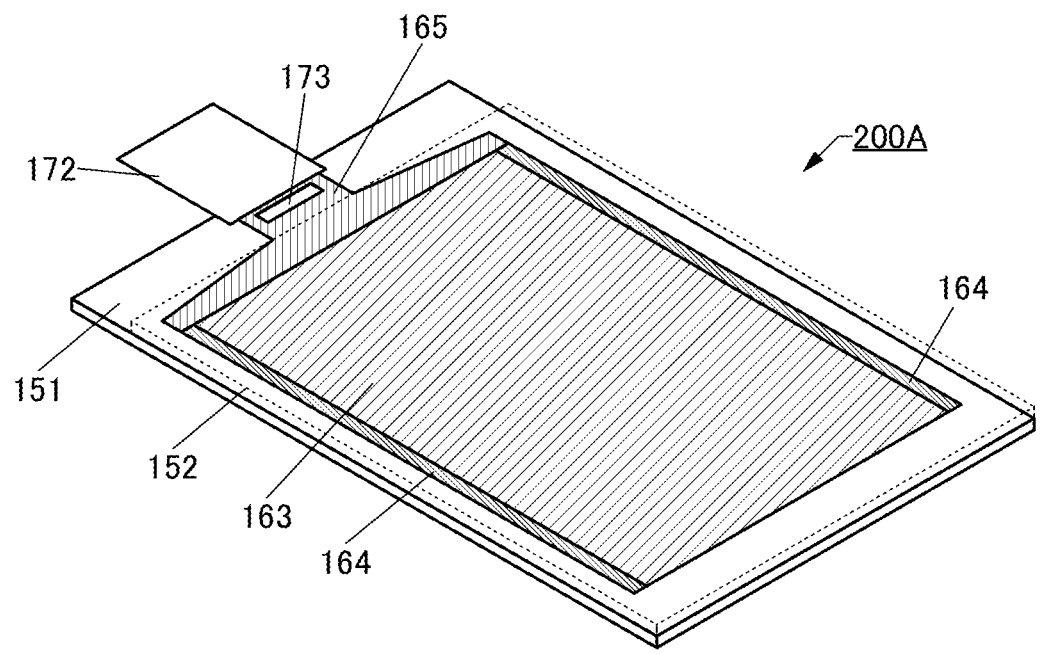
FIG. 11 is a perspective view illustrating an example of a light-emitting apparatus.

FIG. 11 illustrates a perspective view of a light-emitting apparatus 200A, and FIG. 12A illustrates a cross-sectional view of the light-emitting apparatus 200A.

The light-emitting apparatus 200A has a structure in which the substrate 152 and the substrate 151 are bonded to each other. In FIG. 11, the substrate 152 is denoted by a dashed line.

The light-emitting apparatus 200A includes a light-emitting portion 163, a circuit 164, a wiring 165, and the like. FIG. 11 illustrates an example in which the light-emitting apparatus 200A is provided with an IC (integrated circuit) 173 and an FPC 172. Thus, the structure illustrated in FIG. 11 can be regarded as a light-emitting module including the light-emitting apparatus 200A, the IC, and the FPC.

As the circuit 164, for example, a scan line driver circuit can be used.

The wiring 165 has a function of supplying a signal and power to the light-emitting portion 163 and the circuit 164. The signal and power are input to the wiring 165 from the outside through the FPC 172 or from the IC 173.

FIG. 11 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the light-emitting apparatus 200A and the light-emitting module may have a structure that is not provided with an IC. The IC may be provided over the FPC by a COF method or the like.

FIG. 12A illustrates an example of cross sections of part of a region including the FPC 172, part of a region including the circuit 164, part of a region including the light-emitting portion 163, and part of a region including an end portion in the light-emitting apparatus 200A illustrated in FIG. 11.

The light-emitting apparatus 200A illustrated in FIG. 12A includes a transistor 201, a transistor 206, a transistor 207, the light-emitting device 190B, the light-emitting device 190N, the protective layer 195, and the like between the substrate 151 and the substrate 152.

The substrate 151 and the substrate 152 are bonded to each other with the adhesive layer 142 therebetween. A solid sealing structure, a hollow sealing structure, or the like can be employed to seal the light-emitting device 190B and the light-emitting device 190N. In FIG. 12A, a hollow sealing structure is employed in which a space 143 surrounded by the substrate 151, the adhesive layer 142, and the substrate 152 is filled with an inert gas (e.g., nitrogen or argon). The adhesive layer 142 may be provided to overlap with the light-emitting device 190. The space 143 surrounded by the substrate 151, the adhesive layer 142, and the substrate 152 may be filled with a resin different from that of the adhesive layer 142.

The light-emitting device 190B has a stacked-layer structure in which a pixel electrode 191B, the optical adjustment layer 199B, the common layer 112, the light-emitting layer 193, the common layer 114, and the common electrode 115 are stacked in this order from the insulating layer 214 side. The pixel electrode 191B is connected to a conductive layer 222b included in the transistor 206 through an opening provided in the insulating layer 214. The transistor 206 has a function of controlling the driving of the light-emitting device 190B.

The light-emitting device 190N has a stacked-layer structure in which a pixel electrode 191N, the optical adjustment layer 199N, the common layer 112, the light-emitting layer 193, the common layer 114, and the common electrode 115 are stacked in this order from the insulating layer 214 side. The pixel electrode 191N is connected to the conductive layer 222b included in the transistor 207 through an opening provided in the insulating layer 214. The transistor 207 has a function of controlling the driving of the light-emitting device 190N.

An end portion of the pixel electrode 191B and an end portion of the pixel electrode 191N are each covered with the partition 216. The pixel electrode 191B and the pixel electrode 191N contain a material that reflects visible light and infrared light, and the common electrode 115 contains a material that transmits visible light and infrared light.

The optical adjustment layer 199B and the optical adjustment layer 199N are preferably conductive films that transmit visible light and infrared light.

In the light-emitting device 190B, the thickness of the optical adjustment layer 199B is adjusted so that the optical path length between the pair of electrodes becomes an optical path length that intensifies blue light emission. In the light-emitting device 190N, the thickness of the optical adjustment layer 199N is adjusted so that the optical path length between the pair of electrodes becomes an optical path length that intensifies infrared light emission.

The light-emitting device 190 may further include a layer containing a substance with a high hole-injection property, a substance with a high hole-transport property, a hole-blocking material, a substance with a high electron-transport property, a substance with a high electron-injection property, a substance with a bipolar property, or the like in addition to the light-emitting layer 193. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114, and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

Light emitted by the light-emitting device 190 is emitted to the substrate 152 side. For the substrate 152, a material having a high transmitting property with respect to visible light and infrared light is preferably used.

The pixel electrode 191B and the pixel electrode 191N can be formed using the same material in the same step. The optical adjustment layer 199B and the optical adjustment layer 199N can be formed using the same material to have different thicknesses from each other. The common layer 112, the common layer 114, and the common electrode 115 are used by both of the light-emitting device 190B and the light-emitting device 190N. At least part of the structure other than the optical adjustment layer 199 can be shared by the light-emitting device 190B and the light-emitting device 190N. Thus, it is possible to add a function of emitting infrared light to the light-emitting apparatus 200A without significantly increasing the number of manufacturing steps.

The light-emitting device 190 is covered with the protective layer 195. The protective layer 195 can inhibit entry of impurities such as water into the light-emitting device 190, leading to an increase in the reliability of the light-emitting device 190.

In a region 228 in the vicinity of an end portion of the light-emitting apparatus 200A, an insulating layer 215 and the protective layer 195 are preferably in contact with each other through an opening of the insulating layer 214. In particular, the inorganic insulating film included in the insulating layer 215 and the inorganic insulating film included in the protective layer 195 are preferably in contact with each other. Thus, entry of impurities from the outside into the light-emitting portion 163 through the organic insulating film can be inhibited. Thus, the reliability of the light-emitting apparatus 200A can be increased.

FIG. 12B illustrates an example in which the protective layer 195 has a three-layer structure. In FIG. 12B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening of the insulating layer 214 (organic insulating layer). Accordingly, the insulating layer 215 and protective layer 195 can surround the light-emitting device 190, whereby the reliability of the light-emitting device 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The light-blocking layer BM and the coloring layer CFB are provided on the surface of the substrate 152 on the substrate 151 side. The light-blocking layer BM has an opening in a position overlapping with the light-emitting device 190. The coloring layer CFB is provided in a position overlapping with the light-emitting device 190B. Light emitted by the light-emitting device 190B is extracted to the outside of the light-emitting apparatus 200A through the coloring layer CFB.

The transistor 201, the transistor 206, and the transistor 207 are formed over the substrate 151. These transistors can be manufactured using the same material in the same process.

An insulating layer 211, an insulating layer 213, the insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, the insulating layer can function as a barrier layer. Such a structure can effectively inhibit diffusion of impurities into the transistors from the outside and increase the reliability of the light-emitting apparatus.

An inorganic insulating film is preferably used as each of the insulating layer 211, the insulating layer 213, and the insulating layer 215. As the inorganic insulating film, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the light-emitting apparatus 200A. This can inhibit entry of impurities from the end portion of the light-emitting apparatus 200A through the organic insulating film. Alternatively, the organic insulating film may be formed so that an end portion of the organic insulating film is positioned on the inner side compared to the end portion of the light-emitting apparatus 200A, to prevent the organic insulating film from being exposed at the end portion of the light-emitting apparatus 200A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In the region 228 illustrated in FIG. 12A, an opening is formed in the insulating layer 214. Thus, the entry of impurities into the light-emitting portion 163 from the outside through the insulating layer 214 can be inhibited even when an organic insulating film is used as the insulating layer 214. Accordingly, the reliability of the light-emitting apparatus 200A can be increased.

The transistor 201, the transistor 206, and the transistor 207 each include a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistor included in the light-emitting apparatus of this embodiment. For example, a planar transistor, a staggered transistor, or an inverted staggered transistor can be used. A top-gate or bottom-gate transistor structure may be employed. Alternatively, gates may be provided above and below a semiconductor layer where a channel is formed.

The structure in which the semiconductor layer where a channel is formed is provided between two gates is used for the transistor 201, the transistor 206, and the transistor 207. The two gates may be connected to each other and supplied with the same signal to operate the transistor. The two gates may be connected to each other and supplied with the same signal to drive the transistor; or a potential for adjusting the threshold voltage may be supplied to one of the two gates and a potential for driving may be supplied to the other to adjust the threshold voltage of the transistor.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio in the deposited semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be deposited is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistors included in the circuit 164 and the transistors included in the light-emitting portion 163 may have the same structure or different structures. The plurality of transistors included in the circuit 164 may have the same structure or two or more kinds of structures. Similarly, the plurality of transistors included in the light-emitting portion 163 may have the same structure or two or more kinds of structures.

A connection portion 204 is provided in a region of the substrate 151 not overlapping with the substrate 152. In the connection portion 204, the wiring 165 is electrically connected to the FPC 172 through a conductive layer 166 and a connection layer 242. On a top surface of the connection portion 204, the conductive layer 166 obtained by processing the same conductive film as the pixel electrode 191B and the pixel electrode 191N is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorption layer, or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the light-emitting apparatus can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

As materials that can be used for conductive layers such as a variety of wirings and electrodes that constitute the light-emitting apparatus, in addition to a gate, a source, and a drain of a transistor, metals such as aluminum, titanium, chromium, nickel, copper, yttrium, zirconium, molybdenum, silver, tantalum, or tungsten, or an alloy containing any of these metals as its main component can be given. A film including any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers such as a variety of wirings and electrodes that constitute the light-emitting apparatus, and conductive layers (conductive layers functioning as a pixel electrode or a common electrode) included in the light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Light-Emitting Apparatus 200B]

Figure 13A:
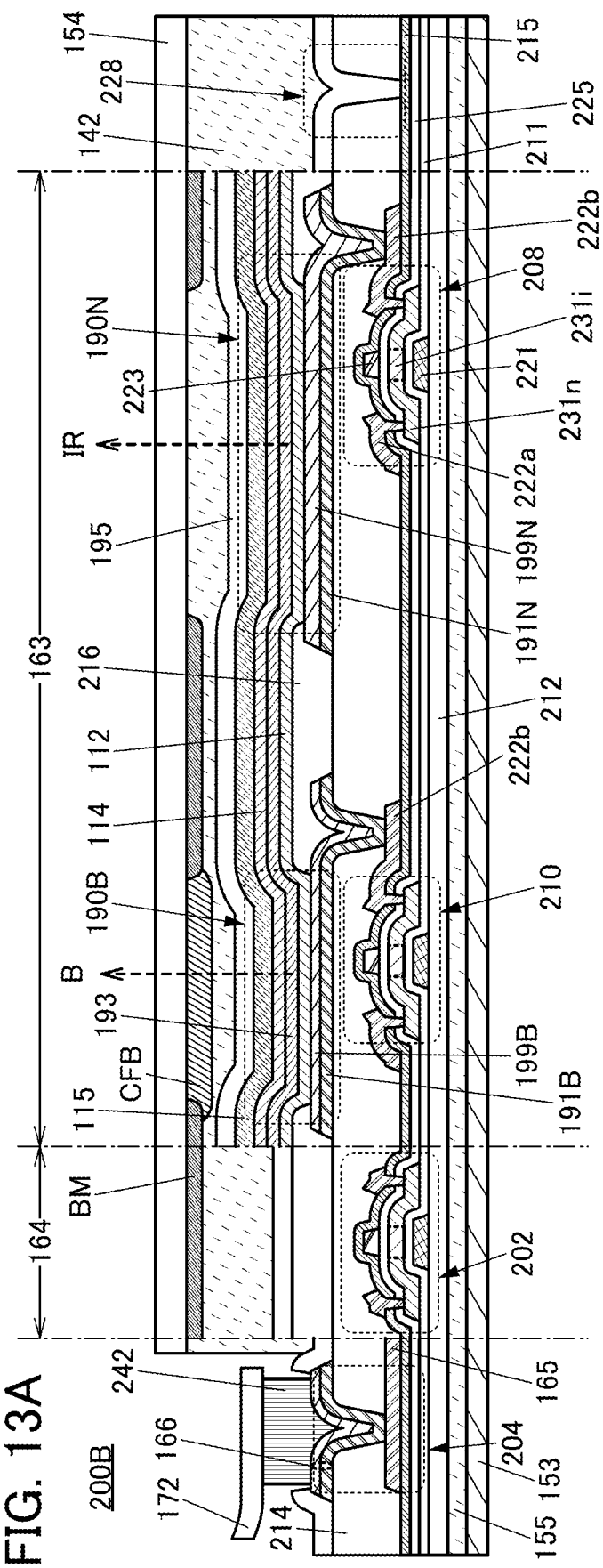
FIG. 13A is a cross-sectional view illustrating an example of a light-emitting apparatus.

FIG. 13A illustrates a cross-sectional view of a light-emitting apparatus 200B.

The structures of the transistors in the light-emitting apparatus 200B are different from those in the light-emitting apparatus 200A.

The light-emitting apparatus 200B includes a transistor 202, a transistor 208, and a transistor 210 over the substrate 151.

The transistor 202, the transistor 208, and the transistor 210 each include the conductive layer 221 functioning as a gate, the insulating layer 211 functioning as a gate insulating layer, a semiconductor layer including a channel formation region 231$i$ and a pair of low-resistance regions 231$n$, the conductive layer 222$a$ connected to one of the pair of low-resistance regions 231$n$, the conductive layer 222$b$ connected to the other of the pair of low-resistance regions 231$n$, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231$i$. The insulating layer 225 is positioned between the conductive layer 223 and the channel formation region 231$i$.

The conductive layer 222$a$ and the conductive layer 222$b$ are each connected to the corresponding low-resistance region 231$n$ through openings provided in the insulating layer 225 and the insulating layer 215. One of the conductive layer 222$a$ and the conductive layer 222$b$ serves as a source, and the other serves as a drain.

The pixel electrode 191B of the light-emitting device 190B is electrically connected to one of the pair of low-resistance regions 231$n$ of the transistor 210 through the conductive layer 222$b$.

The pixel electrode 191N of the light-emitting device 190N is electrically connected to one of the pair of low-resistance regions 231$n$ of the transistor 208 through the conductive layer 222$b$.

Figure 13B:
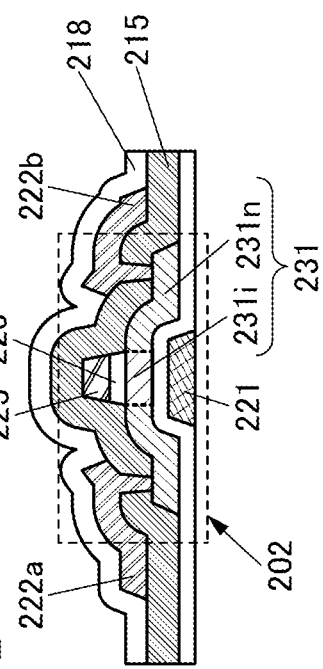
FIG. 13B illustrates an example of a transistor.

FIG. 13A illustrates an example in which the insulating layer 225 covers a top surface and a side surface of the semiconductor layer. Meanwhile, in FIG. 13B, the insulating layer 225 overlaps with the channel formation region 231$i$ of the semiconductor layer 231 and does not overlap with the low-resistance regions 231$n$. The structure illustrated in FIG. 13B can be obtained by processing the insulating layer 225 with the conductive layer 223 as a mask, for example. In FIG. 13B, the insulating layer 215 is provided to cover the insulating layer 225 and the conductive layer 223, and the conductive layer 222$a$ and the conductive layer 222$b$ are connected to the low-resistance regions 231$n$ through the openings in the insulating layer 215. Furthermore, an insulating layer 218 covering the transistor may be provided.

In addition, the light-emitting apparatus 200B differs from the light-emitting apparatus 200A in that neither the substrate 151 nor the substrate 152 is included and that the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The light-emitting apparatus 200B is formed in such a manner that the insulating layer 212, the transistor 202, the transistor 208, the transistor 210, the light-emitting device 190, and the like that are formed over a formation substrate are transferred onto the substrate 153. The substrate 153 and the substrate 154 are preferably flexible. Accordingly, the flexibility of the light-emitting apparatus 200B can be increased.

The inorganic insulating film that can be used as the insulating layer 211, the insulating layer 213, and the insulating layer 215 can be used as the insulating layer 212.

In the light-emitting apparatus 200B, the protective layer 195 and the substrate 154 are bonded to each other with the adhesive layer 142. The adhesive layer 142 is provided to overlap with the light-emitting device 190, and a solid sealing structure is used in the light-emitting apparatus in FIG. 13A.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) and CAC (Cloud-Aligned Composite) may be stated. Note that CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and highly reliable.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter, referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, the light-emitting apparatus of this embodiment includes a light-emitting device emitting visible light and a light-emitting device emitting visible light. Since the light-emitting apparatus of this embodiment can emit both visible light and infrared light, the light-emitting apparatus can be used as a light source in any of a sensor that uses visible light as a light source, a sensor that uses infrared light as a light source, and a sensor that uses both visible light and infrared light as a light source and therefore is highly convenient.

In the light-emitting apparatus of this embodiment, the light-emitting device emitting infrared light and the light-emitting device emitting visible light include and share a plurality of light-emitting layers and the light-emitting devices can share the layers other than the optical adjustment layer. Thus, it is possible to add a function of emitting infrared light to the light-emitting apparatus without significantly increasing the number of manufacturing steps.

The light-emitting apparatus of this embodiment can have a structure in which one subpixel emits both visible light and infrared light. Therefore, it is possible to add a function of emitting infrared light to the light-emitting apparatus without significantly changing the pixel layout (e.g., increasing the number of subpixels included in one pixel) of the light-emitting apparatus.

This embodiment can be combined with the other embodiments as appropriate. In this specification, in the case where a plurality of structure examples are shown in one embodiment, the structure examples can be combined as appropriate.

Embodiment 2

In this embodiment, display devices of embodiments of the present invention will be described with reference to FIG. 14 to FIG. 21.

The display device of one embodiment of the present invention includes, in a display portion, a light-emitting device that emits infrared light, a light-emitting device that emits visible light, and a light-receiving device that detects at least part of visible light and infrared light. As the visible light, light with a wavelength greater than or equal to 400 nm and less than 750 nm, e.g., red light, green light, or blue light, can be given. As the infrared light, near-infrared light can be given, specifically, light with a wavelength greater than or equal to 750 nm and less than or equal to 1300 nm can be given.

The display device of one embodiment of the present invention includes, in a display portion, a first light-emitting device, a second light-emitting device, and a light-receiving device. The first light-emitting device includes a first pixel electrode, a first optical adjustment layer, a first light-emitting layer, a second light-emitting layer, and a common electrode. The second light-emitting device includes a second pixel electrode, a second optical adjustment layer, a first light-emitting layer, a second light-emitting layer, and the common electrode. The first optical adjustment layer is positioned between the first pixel electrode and the common electrode. The second optical adjustment layer is positioned between the second pixel electrode and the common electrode. The first light-emitting layer and the second light-emitting layer each include a region positioned between the first pixel electrode and the common electrode and a region positioned between the second pixel electrode and the common electrode. The light-receiving device includes a third pixel electrode, an active layer, and the common electrode. The active layer is positioned between the third pixel electrode and the common electrode. The active layer contains an organic compound. The first light-emitting device emits infrared light emitted by the first light-emitting layer. The second light-emitting device emits visible light emitted by the second light-emitting layer. The light-receiving device has a function of absorbing at least part of visible light and infrared light.

The display device of one embodiment of the present invention can display an image by using visible light emitted by the light-emitting devices. Specifically, the light-emitting devices are arranged in a matrix in the display portion, and an image can be displayed on the display portion.

Furthermore, in the display device of one embodiment of the present invention, the light-emitting device can be used as a light source of a sensor (e.g., an image sensor or an optical touch sensor). Since the display device of one embodiment of the present invention can emit both visible light and infrared light, the display device can be combined with either a sensor that uses visible light as a light source or a sensor that uses infrared light as a light source and therefore is highly convenient. In addition, the display device can be used as a light source of a sensor that uses both visible light and infrared light as a light source, so that the functionality of the sensor can be increased.

Moreover, the light-receiving devices are arranged in a matrix in the display portion, so that the display portion also has a function of a light-receiving portion. The light-receiving device can detect one or both of visible light and infrared light. The light-receiving portion can be used as an image sensor or a touch sensor. That is, by detecting light with the light-receiving portion, an image can be taken and the approach or contact of an object (e.g., a finger or a stylus) can be detected.

When light with a wavelength detected by the light-receiving device is emitted from the light-emitting device, the display device of one embodiment of the present invention can function as a sensor. Accordingly, a light-receiving portion and a light source do not need to be provided separately from the display device; hence, the number of components of an electronic device can be reduced.

In the display device of one embodiment of the present invention, when an object reflects light emitted from the light-emitting device included in the display portion, the light-receiving device can detect the reflected light; thus, detection of imaging and touch (and approach) can be performed even in a dark place.

In the display device of one embodiment of the present invention, the three devices, i.e., the light-emitting device emitting infrared light, the light-emitting device emitting visible light, and the light-receiving device, can share the layers. Therefore, a function of emitting infrared light can be added to the display device and the light-receiving device can be incorporated in the display device without a significant increase in the number of manufacturing steps. For example, at least one of a hole-injection layer, a hole-transport layer, an electron-transport layer, and an electron-injection layer can have the same structure for the three devices.

Note that a layer shared by the light-receiving device and the light-emitting device may have functions different in the light-receiving device and the light-emitting device. In this specification, the name of a component is based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. Note that a hole-transport layer functions as a hole-transport layer in both of the light-emitting device and the light-receiving device. Similarly, an electron-transport layer functions as an electron-transport layer in both of the light-emitting device and the light-receiving device.

The light-emitting device described in Embodiment 1 can be used in the display device of one embodiment of the present invention. Embodiment 1 can be referred to for the structure and feature of the light-emitting device included in the display device of this embodiment; thus, detailed description thereof will be omitted in some cases.

When the light-receiving device is used as an image sensor, the display device of this embodiment can capture an image using the light-receiving device.

For example, data on a fingerprint, a palm print, an iris, or the like can be obtained with the use of the image sensor. That is, a biological authentication sensor can be incorporated into the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

In addition, data on facial expression, eye movement, change of the pupil diameter, or the like of the user can be obtained with the use of the image sensor. By analysis of the data, data on the user's physical and mental state can be obtained. Changing the output contents of one or both of display and sound on the basis of the information allows the user to safely use a device for VR (Virtual Reality), AR (Augmented Reality), or MR (Mixed Reality), for example.

When the light-receiving device is used as a touch sensor, the display device of this embodiment can detect the approach or contact of an object with the use of the light-receiving device.

As the light-receiving device, a pn or pin photodiode can be used, for example. The light-receiving device functions as a photoelectric conversion device that detects light entering the light-receiving device and generates charge. The amount of generated charge depends on the amount of incident light.

It is particularly preferable to use an organic photodiode including a layer containing an organic compound as the light-receiving device. An organic photodiode, which is easily made thin, lightweight, and large in area and has a high degree of freedom for shape and design, can be used in a variety of display devices.

In one embodiment of the present invention, an organic EL device is used as the light-emitting device, and an organic photodiode is used as the light-receiving device. A large number of layers of the organic photodiode can be shared with the organic EL device. Accordingly, the light-receiving device can be incorporated into the display device without a significant increase in the number of manufacturing steps. For example, an active layer of the light-receiving device and a light-emitting layer of the light-emitting device are separately formed, and the other layers can be shared by the light-emitting device and the light-receiving device.

FIG. 14A to FIG. 14D are cross-sectional views of display devices of one embodiment of the present invention.

Figure 14A:
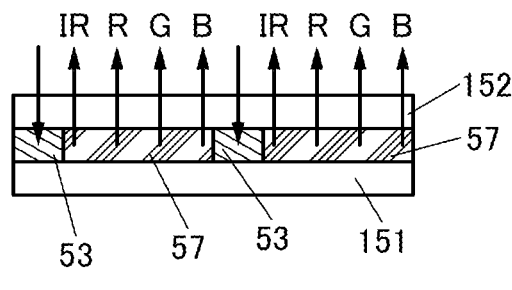
FIG. 14A to FIG. 14D are cross-sectional views illustrating examples of a display device.

A display device 50A illustrated in FIG. 14A includes a layer 53 including a light-receiving device and a layer 57 including light-emitting devices between the substrate 151 and the substrate 152.

Figure 14B:
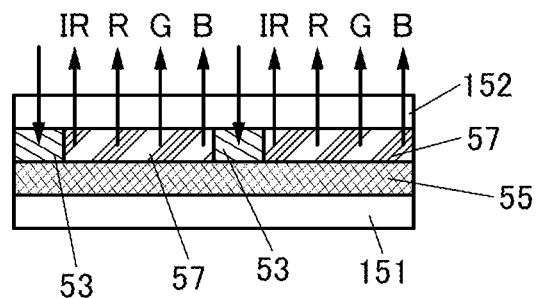

A display device 50B illustrated in FIG. 14B includes the layer 53 including a light-receiving device, a layer 55 including transistors, and the layer 57 including light-emitting devices between the substrate 151 and the substrate 152.

In the display device 50A and the display device 50B, red (R) light, green (G) light, blue (B) light, and infrared light (IR) are emitted from the layer 57 including light-emitting devices.

For the structure of the layer 57 including light-emitting devices, the structure of the light-emitting apparatus in Embodiment 1 can be referred to. In other words, the light-emitting devices included in the light-emitting apparatus in Embodiment 1 can be applied to the layer 57 including light-emitting devices.

The layer 55 including transistors preferably includes a first transistor and a second transistor. The first transistor is electrically connected to the light-receiving device. The second transistor is electrically connected to the light-emitting device.

The layer 53 including a light-receiving device can have a structure that detects visible light, a structure that detects infrared light, or a structure that detects both visible light and infrared light. The wavelength of light that the light-receiving device detects can be determined depending on the application of the sensor.

Figure 14C:
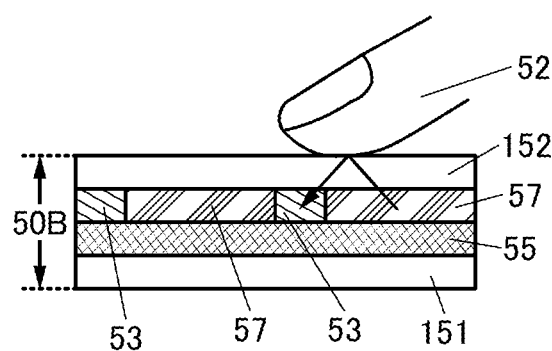

The display device of one embodiment of the present invention may have a function of detecting an object such as a finger that is touching the display device. For example, light emitted from the light-emitting device in the layer 57 including light-emitting devices is reflected by a finger 52 that touches the display device 50B as illustrated in FIG. 14C, and the light-receiving device in the layer 53 including the light-receiving device detects the reflected light. Thus, the touch of the finger 52 on the display device 50B can be detected.

Figure 14D:
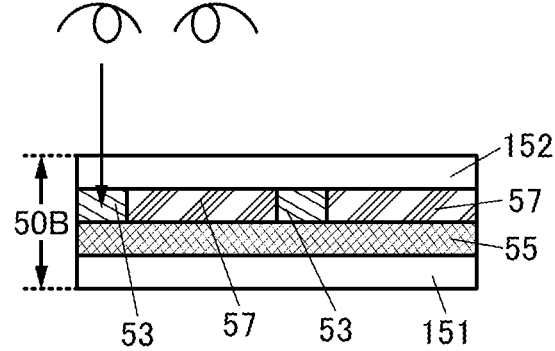

The display device of one embodiment of the present invention may have a function of detecting an object that is approaching to (but is not touching) the display device 50B as illustrated in FIG. 14D or capturing an image of such an object.

[Pixel]

FIG. 15A to FIG. 15F illustrate examples of a pixel.

The display device of one embodiment of the present invention includes a plurality of pixels arranged in a matrix. One pixel includes one or more subpixels. One subpixel includes one light-emitting device. For example, a pixel includes three subpixels, and any of the three subpixels can have a structure that emits infrared light in addition to visible light (e.g., three colors of R, G, and B or three colors of yellow (Y), cyan (C) and magenta (M)). Alternatively, a pixel includes four subpixels, and any of the four subpixels can have a structure that emits infrared light in addition to visible light (e.g., four colors of R, G, B, and white (W) or four colors of R, G, B, and Y). Further alternatively, a pixel may have a structure including four subpixels (e.g., three colors of R, G, and B and infrared light or three colors of Y, C, and M and infrared light) or a structure including five subpixels (e.g., four colors of R, G, B, and W and infrared light or four colors of R, G, B, and Y and infrared light).

The pixel further includes a light-receiving device. The light-receiving device may be provided in all the pixels or may be provided in some of the pixels. In addition, one pixel may include a plurality of light-receiving devices.

The pixel illustrated in FIG. 15A includes four subpixels (four light-emitting devices) of red (R), green (G), blue (B), and infrared light (IR) and a light-receiving device PD.

The pixels illustrated in FIG. 15B to FIG. 15E each include three subpixels (three light-emitting devices) of R, G, and B and the light-receiving element PD. FIG. 15B and FIG. 15E each illustrate a structure in which the red (R) subpixel emits infrared light (IR), FIG. 15C illustrates a structure in which the green (G) subpixel emits infrared light (IR), and FIG. 15D illustrates a structure in which the blue (B) subpixel emits infrared light (IR).

The display device of one embodiment of the present invention can have a structure in which one subpixel emits both visible light and infrared light. For example, any of three subpixels exhibiting red, green, and blue can emit infrared light. When a subpixel emitting visible light also serves as a subpixel emitting infrared light, it is not necessary to provide another subpixel emitting infrared light. Therefore, the display device can emit both visible light and infrared light without an increase in the number of subpixels included in one pixel. Accordingly, a decrease in the aperture ratio of a pixel can be inhibited, so that the light extraction efficiency of the display device can be increased.

FIG. 15B to FIG. 15D each illustrate an example in which the three subpixels and the light-receiving device PD are arranged in a matrix of 2×2, and FIG. 15E illustrates an example in which the three subpixels and the light-receiving device PD are provided in a horizontal line.

The pixel illustrated in FIG. 15F includes four subpixels (four light-emitting devices) of R, G, B, and white (W) and the light-receiving device PD.

Although the subpixel of red (R) emits infrared light (IR) in FIG. 15E and FIG. 15F, the structure is not limited thereto; a subpixel of another color may emit infrared light.

The structure of the display device of one embodiment of the present invention will be described below with reference to FIG. 16 and FIG. 21. Of four devices that emit infrared light, red light, green light, and blue light, the light-emitting device emitting infrared light and the light-emitting device emitting blue light are mainly described below. The light-emitting devices emitting red light and green light can have the same structure as the light-emitting device emitting infrared light and the light-emitting device emitting blue light except for the thickness of the optical adjustment layer.

[Display Device 10A]

Figure 16A:
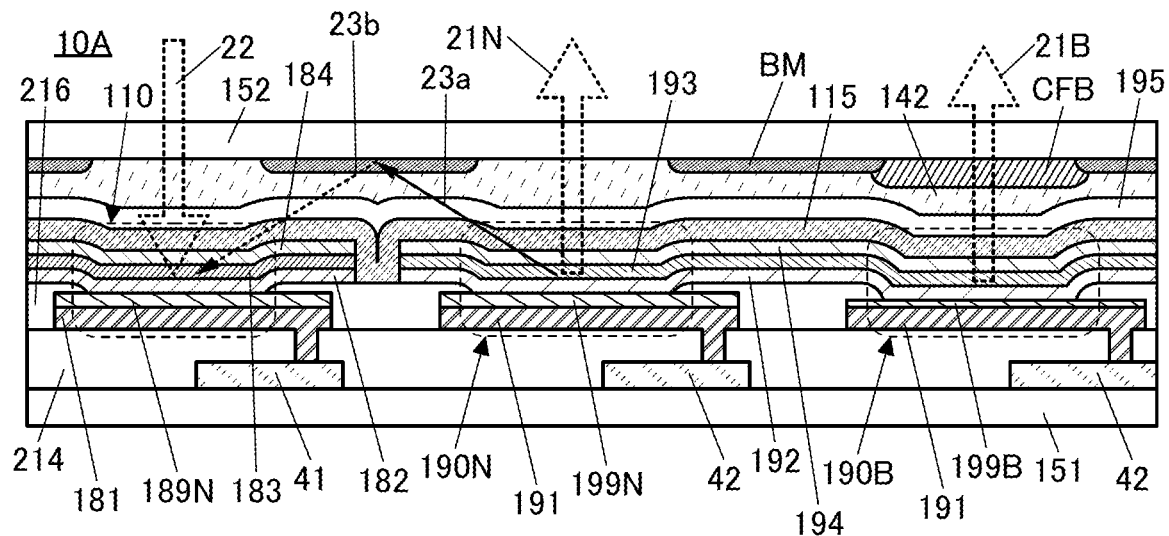
FIG. 16A to FIG. 16C are cross-sectional views illustrating examples of a display device.

FIG. 16A illustrates a cross-sectional view of a display device 10A.

The display device 10A includes a light-receiving device 110, the light-emitting device 190N, and the light-emitting device 190B. The light-receiving device 110 has a function of detecting the infrared light 21N. The light-emitting device 190N has a function of emitting the infrared light 21N. The light-emitting device 190B has a function of emitting the blue light 21B.

Note that the light-receiving device 110 may also have a function of detecting visible light in addition to infrared light.

The light-emitting device 190B and the light-emitting device 190N each include the pixel electrode 191, a buffer layer 192, the light-emitting layer 193, a buffer layer 194, and the common electrode 115. The buffer layer 192, the light-emitting layer 193, the buffer layer 194, and the common electrode 115 are shared by the light-emitting device 190B and the light-emitting device 190N.

The light-emitting device 190N includes the optical adjustment layer 199N between the pixel electrode 191 and the buffer layer 192. In the light-emitting device 190N, the thickness of the optical adjustment layer 199N is adjusted so that the optical path length between the pair of electrodes is an optical path length that intensifies infrared light emission. Thus, infrared light can be extracted from the light-emitting device 190N.

The light-emitting device 190B includes the optical adjustment layer 199B between the pixel electrode 191 and the buffer layer 192. In the light-emitting device 190B, the thickness of the optical adjustment layer 199B is adjusted so that the optical path length between the pair of electrodes is an optical path length that intensifies blue light emission. Thus, blue light can be extracted from the light-emitting device 190B.

It is preferable that the optical path length between the pair of electrodes be adjusted using the optical adjustment layer 199 in each light-emitting device and other layers (the buffer layer 192, the light-emitting layer 193, and the buffer layer 194) be shared by the plurality of light-emitting devices, as described above. Accordingly, the number of deposition steps in manufacturing the display device can be reduced, so that the manufacturing cost of the display device can be reduced and the manufacturing process can be simplified.

It is preferable that visible light extracted from the light-emitting device be extracted to the outside of the light-emitting apparatus through an optical filter such as a coloring layer (e.g., a color filter). FIG. 16A illustrates an example in which the light 21B is extracted from the light-emitting device 190B through the blue coloring layer CFB. Similarly, infrared light extracted from the light-emitting device may also be extracted to the outside of the light-emitting apparatus through an optical filter.

Note that in FIG. 16A and the like, a plurality of light-emitting layers are denoted by one light-emitting layer 193. The light-emitting layer 193 includes a light-emitting layer that emits infrared light and a light-emitting layer that emits visible light. The light-emitting layer 193 preferably includes a plurality of light-emitting layers that emit visible light. A combination by which white emission is obtained, such as three light-emitting layers of R, G, and B or three light-emitting layers of Y, C, and M, is preferably used for the light-emitting layers emitting visible light.

Since the light-emitting device 190B and the light-emitting device 190N each have a single structures it is preferable that the plurality of light-emitting layers be stacked in descending order of the wavelength of emitted light from the optical adjustment layer 199 side, as described in Embodiment 1. In other words, a light-emitting layer that is the closest to the optical adjustment layer 199 is preferably the light-emitting layer emitting infrared light. Note that a light-emitting device with a tandem structure can be used in the display device of one embodiment of the present invention.

The light-receiving device 110 includes a pixel electrode 181, a buffer layer 182, an active layer 183, a buffer layer 184, and the common electrode 115.

The light-receiving device 110 may further include an optical adjustment layer 189N between the pixel electrode 181 and the buffer layer 182. When the optical adjustment layer 189N is provided, the range of wavelengths that the light-receiving device 110 senses is narrowed. Therefore, the thickness of the optical adjustment layer 189N is preferably set in accordance with a wavelength that is desired to be sensed. The optical adjustment layer 189N may have the same thickness as or a different thickness from any of the optical adjustment layers 199 included in the light-emitting devices. In addition, the optical adjustment layer 189N is not necessarily provided.

The pixel electrode 181, the buffer layer 182, the buffer layer 192, the active layer 183, the buffer layer 184, the buffer layer 194, and the common electrode 115 may each have a single-layer structure or a stacked-layer structure.

The pixel electrode 181 and the pixel electrode 191 are positioned over the insulating layer 214. The pixel electrode 181 and the pixel electrode 191 can be formed using the same material in the same step.

The display device 10A has a structure in which not only the active layer 183 included in the light-receiving device 110 and the light-emitting layer 193 included in the light-emitting device 190 but also other layers (buffer layers) are separately formed. Specifically, an example is shown in which the light-receiving device 110 and the light-emitting device 190 do not include a common layer between the pair of electrodes (the pixel electrode 181 or the pixel electrode 191 and the common electrode 115).

The light-receiving device 110 and the light-emitting device 190 can be manufactured in the following manner: the pixel electrode 181 and the pixel electrode 191 are formed over the insulating layer 214 using the same material in the same step; the buffer layer 182, the active layer 183, and the buffer layer 184 are formed over the pixel electrode 181; the buffer layer 192, the light-emitting layer 193, and the buffer layer 194 are formed over the pixel electrode 191; and then, the common electrode 115 is formed to cover the pixel electrode 181, the pixel electrode 191, the buffer layer 182, the buffer layer 192, the active layer 183, the light-emitting layer 193, the buffer layer 184, and the buffer layer 194. Note that the manufacturing order of the stacked-layer structure of the buffer layer 182, the active layer 183, and the buffer layer 184 and the stacked-layer structure of the buffer layer 192, the light-emitting layer 193, and the buffer layer 194 is not particularly limited. For example, after the buffer layer 182, the active layer 183, and the buffer layer 184 are deposited, the buffer layer 192, the light-emitting layer 193, and the buffer layer 194 may be formed. In contrast, the buffer layer 192, the light-emitting layer 193, and the buffer layer 194 may be formed before the buffer layer 182, the active layer 183, and the buffer layer 184 are deposited. Alternatively, alternate deposition of the buffer layer 182, the buffer layer 192, the active layer 183, and the light-emitting layer 193 in this order may be performed.

As the buffer layer 182, for example, a hole-transport layer can be formed. As the buffer layer 192, one or both of a hole-injection layer and a hole-transport layer can be formed, for example.

The active layer 183 overlaps with the pixel electrode 181 with the buffer layer 182 therebetween. The active layer 183 overlaps with the common electrode 115 with the buffer layer 184 therebetween. The active layer 183 contains an organic compound. Specifically, the active layer 183 contains an organic compound different from an organic compound contained in the light-emitting layer 193 of the light-emitting device 190.

The light-emitting layer 193 overlaps with the pixel electrode 191 with the buffer layer 192 therebetween. The light-emitting layer 193 overlaps with the common electrode 115 with the buffer layer 194 therebetween.

As the buffer layer 184, for example, an electron-transport layer can be formed. As the buffer layer 194, one or both of an electron-injection layer and an electron-transport layer can be formed, for example.

The common electrode 115 includes a portion overlapping with the pixel electrode 181 with the buffer layer 182, the active layer 183, and the buffer layer 184 therebetween. The common electrode 115 further includes a portion overlapping with the pixel electrode 181 with the buffer layer 192, the light-emitting layer 193, and the buffer layer 194 therebetween. The common electrode 115 is a layer shared by the light-receiving device 110 and the light-emitting device 190.

In the display device of this embodiment, an organic compound is used for the active layer 183 of the light-receiving device 110. It is possible to manufacture the light-receiving device 110 only by changing at least part of the structure between the pair of electrodes in the light-emitting device 190 (EL device). Thus, the light-receiving device 110 can be incorporated in the display portion of the display device.

The display device 10A includes the light-receiving device 110, the light-emitting device 190N, the light-emitting device 190B, a transistor 41, the transistor 42, and the like between the pair of substrates (the substrate 151 and the substrate 152).

In the light-receiving device 110, the buffer layer 182, the active layer 183, and the buffer layer 184 that are positioned between the pixel electrode 181 and the common electrode 115 can each be referred to as an organic layer (a layer containing an organic compound). The pixel electrode 181 preferably has a function of reflecting visible light and infrared light. An end portion of the pixel electrode 181 is covered with the partition 216. The common electrode 115 has a function of transmitting visible light and infrared light.

The light-receiving device 110 has a function of detecting light. Specifically, the light-receiving device 110 is a photoelectric conversion device that receives light 22 entering from the outside of the display device 10A and converts it into an electric signal. The light 22 can also be expressed as light that is emitted from the light-emitting device 190 and then reflected by an object. The light 22 may enter the light-receiving device 110 through a lens described later.

The light-blocking layer BM is preferably provided on a surface of the substrate 152 on the substrate 151 side. The light-blocking layer BM has openings at a position overlapping with the light-receiving device 110 and at a position overlapping with the light-emitting device 190. Providing the light-blocking layer BM can control the range where the light-receiving device 110 detects light.

Here, the light-receiving device 110 detects light that is emitted by the light-emitting device 190 and then reflected by an object. However, in some cases, light emitted by the light-emitting device 190 is reflected inside the display device 10A and enters the light-receiving device 110 without via an object. The light-blocking layer BM can reduce the influence of such stray light. For example, in the case where the light-blocking layer BM is not provided, light 23a emitted by the light-emitting device 190 is reflected by the substrate 152 and reflected light 23b enters the light-receiving device 110 in some cases. Providing the light-blocking layer BM can inhibit entry of the reflected light 23b into the light-receiving device 110. Consequently, noise can be reduced, and the sensitivity of a sensor using the light-receiving device 110 can be increased.

In the light-emitting device 190, the buffer layer 192, the light-emitting layer 193, and the buffer layer 194 that are positioned between the pixel electrode 191 and the common electrode 115 can be referred to as EL layers. The pixel electrode 191 preferably has a function of reflecting visible light and infrared light. An end portion of the pixel electrode 191 is covered with the partition 216. The pixel electrode 181 and the pixel electrode 191 are electrically insulated (electrically isolated) from each other by the partition 216. The common electrode 115 has a transmitting property and a reflective property with respect to visible light and infrared light.

The light-emitting device 190N is an electroluminescent device that emits the infrared light 21N to the substrate 152 side when voltage is applied between the pixel electrode 191 and the common electrode 115.

The light-emitting device 190B is an electroluminescent device that emits the blue light 21B to the substrate 152 side when voltage is applied between the pixel electrode 191 and the common electrode 115.

It is preferable that the light-emitting layer 193 be formed not to overlap with a light-receiving region of the light-receiving device 110. Accordingly, it is possible to inhibit the light-emitting layer 193 from absorbing the light 22, so that the amount of light with which the light-receiving device 110 is irradiated can be increased.

The pixel electrode 181 is electrically connected to a source or a drain of the transistor 41 through an opening provided in the insulating layer 214. An end portion of the pixel electrode 181 is covered with the partition 216.

The pixel electrode 191 is electrically connected to a source or a drain of the transistor 42 through an opening provided in the insulating layer 214. An end portion of the pixel electrode 191 is covered with the partition 216. The transistor 42 has a function of controlling the driving of the light-emitting device 190.

The transistor 41 and the transistor 42 are on and in contact with the same layer (the substrate 151 in FIG. 16A).

At least part of a circuit electrically connected to the light-receiving device 110 is preferably formed using the same material in the same steps as a circuit electrically connected to the light-emitting device 190. Accordingly, the thickness of the display device can be smaller and the manufacturing process can be simpler than those in the case where the two circuits are separately formed.

The light-receiving device 110 and the light-emitting device 190 are preferably covered with the protective layer 195. In FIG. 16A, the protective layer 195 is provided on and in contact with the common electrode 115. Providing the protective layer 195 can inhibit entry of impurities such as water into the light-receiving device 110 and the light-emitting device 190, so that the reliability of the light-receiving device 110 and the light-emitting device 190 can be increased. The protective layer 195 and the substrate 152 are bonded to each other with the adhesive layer 142.

Figure 16B:
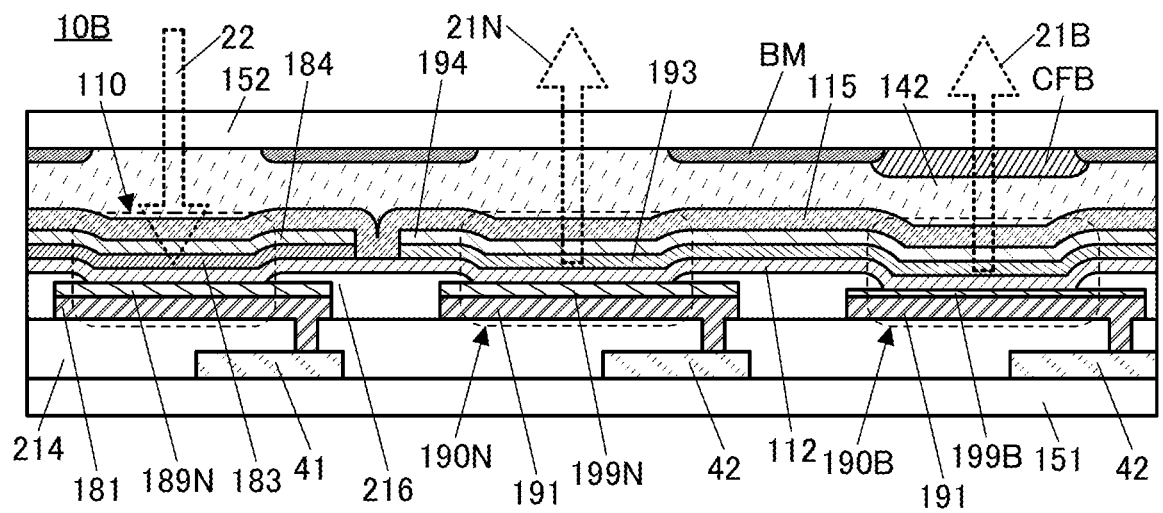

Note that as illustrated in FIG. 16B, the protective layer is not necessarily provided over the light-receiving device 110 and the light-emitting device 190. In FIG. 16B, the common electrode 115 and the substrate 152 are bonded to each other with the adhesive layer 142.

[Display Device 10B]

FIG. 16B illustrates a cross-sectional view of a display device 10B. Note that in the description of the display device below, components similar to those of the above-described display device are not described in some cases.

The display device 10B differs from the display device 10A in that the buffer layer 182 and the buffer layer 192 are not included and the common layer 112 is included.

The common layer 112 is positioned over the pixel electrode 181 and the pixel electrode 191. The common layer 112 is shared by the light-receiving device 110, the light-emitting device 190N, and the light-emitting device 190B.

One or both of a hole-injection layer and a hole-transport layer can be formed as the common layer 112, for example. The common layer 112 may have a single-layer structure or a stacked-layer structure.

It is preferable that at least one of the layers other than the active layer and the light-emitting layer be shared by the light-receiving device and the light-emitting device, in which case the number of manufacturing steps of the display device can be reduced.

[Display Device 10C]

Figure 16C:
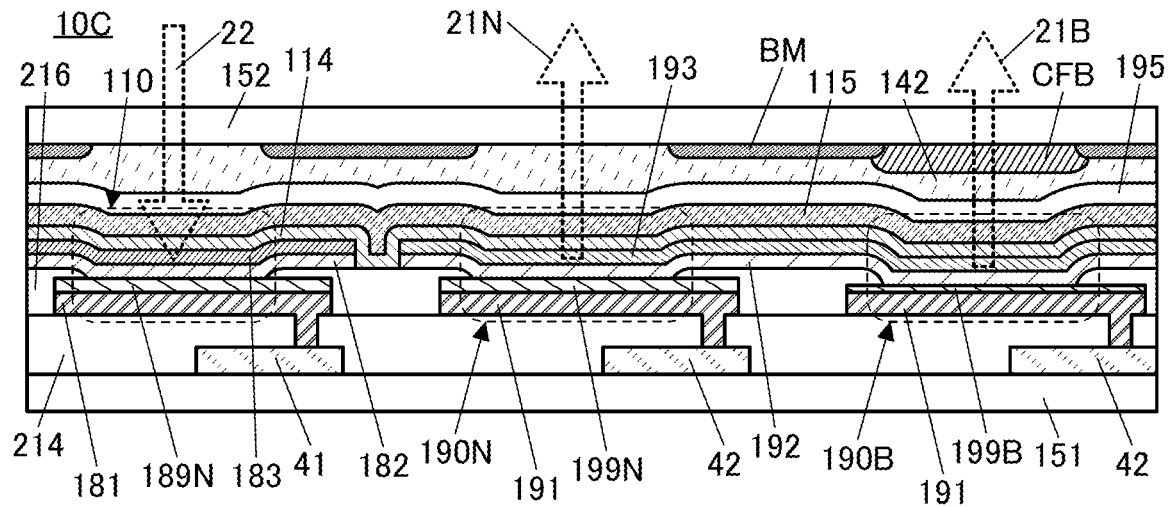

FIG. 16C illustrates a cross-sectional view of a display device 10C.

The display device 10C differs from the display device 10A in that the buffer layer 184 and the buffer layer 194 are not included and the common layer 114 is included.

The common layer 114 is positioned over the partition 216, the active layer 183, and the light-emitting layer 193. The common layer 114 is shared by the light-receiving device 110, the light-emitting device 190N, and the light-emitting device 190B.

One or both of an electron-injection layer and an electron-transport layer can be formed as the common layer 114, for example. The common layer 114 may have a single-layer structure or a stacked-layer structure.

It is preferable that at least one of the layers other than the active layer and the light-emitting layer be shared by the light-receiving device and the light-emitting device, in which case the number of manufacturing steps of the display device can be reduced.

[Display Device 10D]

Figure 17A:
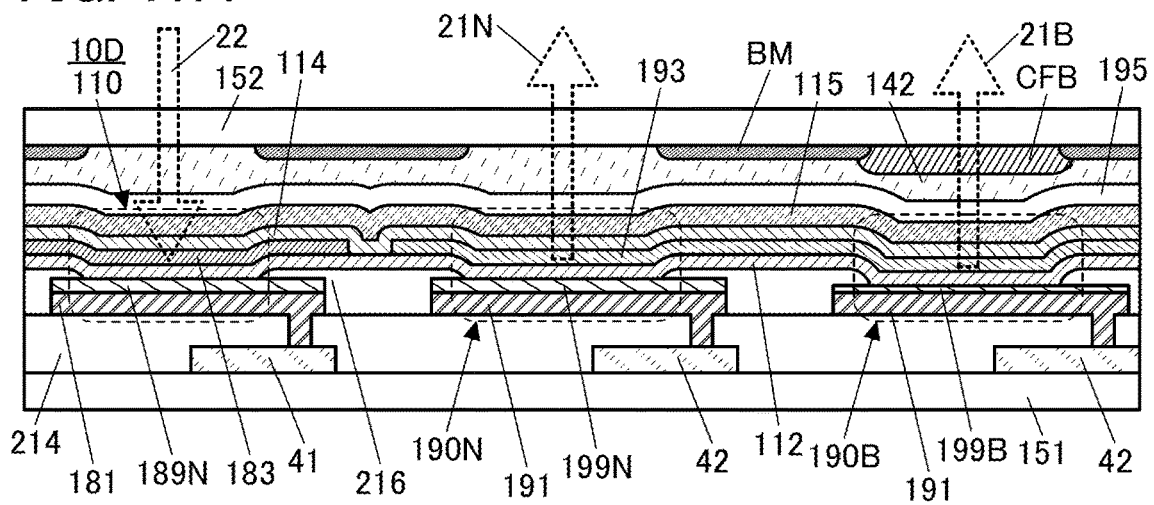
FIG. 17A to FIG. 17C are cross-sectional views illustrating examples of a display device.

FIG. 17A illustrates a cross-sectional view of a display device 10D.

The display device 10D differs from the display device 10A in that the buffer layer 182, the buffer layer 192, the buffer layer 184, and the buffer layer 194 are not included and the common layer 112 and the common layer 114 are included.

In the display device of this embodiment, an organic compound is used for the active layer 183 of the light-receiving device 110. The light-receiving device 110 can have such a structure that the layers other than the active layer 183 are shared with the light-emitting device 190 (the EL device). Therefore, the light-receiving device 110 can be formed concurrently with the formation of the light-emitting device 190 only by adding a step of depositing the active layer 183 in the manufacturing process of the light-emitting device 190. The light-emitting device 190 and the light-receiving device 110 can be formed over one substrate. Accordingly, the light-receiving device 110 can be incorporated into the display device without a significant increase in the number of manufacturing steps.

The display device 10D shows an example in which the light-receiving device 110 and the light-emitting device 190 have a common structure except that the optical adjustment layers are separately formed and that the active layer 183 of the light-receiving device 110 and the light-emitting layer 193 of the light-emitting device 190 are separately formed. Note that the structures of the light-receiving device 110 and the light-emitting device 190 are not limited thereto. The light-receiving device 110 and the light-emitting device 190 may include a separately formed layer other than the optical adjustment layer, the active layer 183, and the light-emitting layer 193 (see the display devices 10A, 10B, and 10C described above). The light-receiving device 110 and the light-emitting device 190 preferably include at least one layer used in common (common layer). Thus, the light-receiving device 110 can be incorporated into the display device without a significant increase in the number of manufacturing steps.

[Display Device 10E]

Figure 17B:
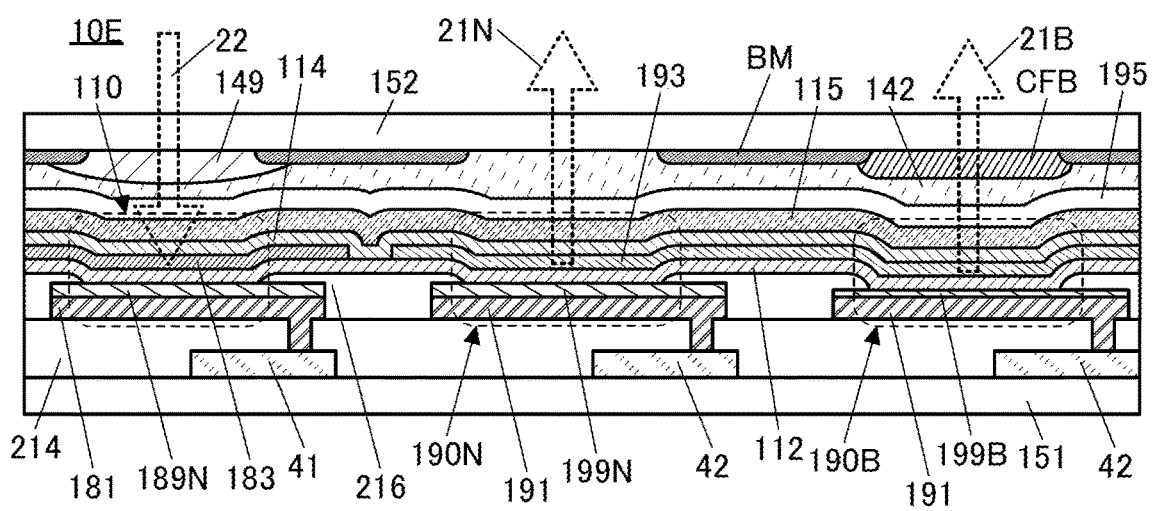

FIG. 17B illustrates a cross-sectional view of a display device 10E.

The display device 10E illustrated in FIG. 17B includes a lens 149 in addition to the components of the display device 10A.

The display device of this embodiment may include the lens 149. The lens 149 is provided at a position overlapping with the light-receiving device 110. In the display device 10E, the lens 149 is provided in contact with the substrate 152. The lens 149 included in the display device 10E has a convex surface on the substrate 151 side. Alternatively, the lens 149 may have a convex surface on the substrate 152 side.

In the case where both the light-blocking layer BM and the lens 149 are formed on the same surface of the substrate 152, their formation order does not matter. FIG. 17B shows an example in which the lens 149 is formed first; alternatively, the light-blocking layer BM may be formed first. In FIG. 17B, an end portion of the lens 149 is covered with the light-blocking layer BM.

In the display device 10E, the light 22 enters the light-receiving device 110 through the lens 149. With the lens 149, the imaging range of the light-receiving device 110 can be narrowed as compared to the case where the lens 149 is not provided, thereby inhibiting overlap between the imaging ranges of the adjacent light-receiving devices 110. Thus, a clear image with little blurring can be captured. In the case where the imaging range of the light-receiving device 110 does not change, the lens 149 allows the size of a pinhole (corresponding to the size of an opening in the light-blocking layer BM that overlaps with the light-receiving device 110 in FIG. 17B) to be increased, compared to the case where the lens 149 is not provided. Hence, providing the lens 149 can increase the amount of light entering the light-receiving device 110.

Alternatively, the lens 149 having a convex surface on the substrate 152 side may be provided in contact with the top surface of the protective layer 195. A lens array may be provided on the display surface side (which is opposite to a surface on the substrate 151 side) of the substrate 152. A lens included in the lens array is provided at the position overlapping with the light-receiving device 110. The light-blocking layer BM is preferably provided on a surface of the substrate 152 on the substrate 151 side.

As a method for forming the lens used in the display device of this embodiment, a lens such as a microlens may be formed directly over the substrate or the light-receiving device, or a lens array formed separately, such as a microlens array, may be bonded to the substrate.

[Display Device 10F]

Figure 17C:
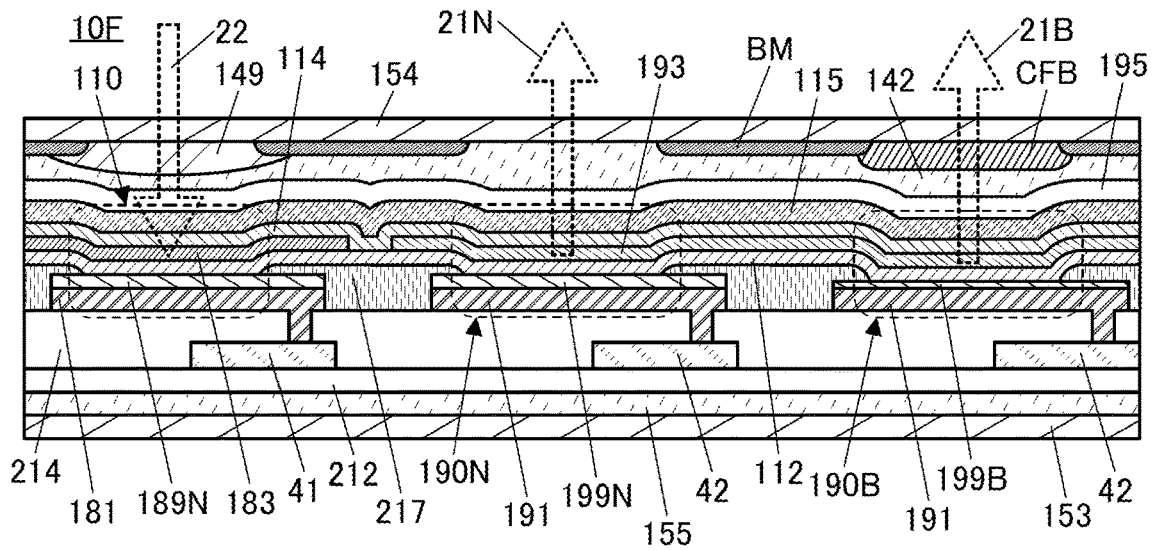

FIG. 17C illustrates a cross-sectional view of a display device 10F.

The display device 10F illustrated in FIG. 17C differs from the display device 10D in that the substrate 151, the substrate 152, and the partition 216 are not included and the substrate 153, the substrate 154, the adhesive layer 155, the insulating layer 212, and a partition 217 are included.

The substrate 153 and the insulating layer 212 are bonded to each other with the adhesive layer 155. The substrate 154 and the protective layer 195 are bonded to each other with the adhesive layer 142.

The display device 10F has a structure formed in such a manner that the insulating layer 212, the transistor 41, the transistor 42, the light-receiving device 110, the light-emitting device 190, and the like that are formed over a formation substrate are transferred onto the substrate 153. The substrate 153 and the substrate 154 are preferably flexible. Accordingly, the flexibility of the display device 10F can be increased. For example, a resin is preferably used for each of the substrate 153 and the substrate 154. As the substrate included in the display device of this embodiment, a film having high optical isotropy may be used.

The partition 217 preferably absorbs light emitted from the light-emitting device. As the partition 217, a black matrix can be formed using a resin material containing a pigment or dye, for example. Moreover, the partition 217 can be formed of a colored insulating layer by using a brown resist material.

In some cases, light emitted by the light-emitting device 190 is reflected by the substrate 152 and the partition 217 and reflected light enters the light-receiving device 110. In other cases, light emitted by the light-emitting device 190 passes through the partition 217 and is reflected by a transistor, a wiring, or the like, and thus reflected light enters the light-receiving device 110. When the partition 217 absorbs light, such reflected light can be inhibited from entering the light-receiving device 110. Consequently, noise can be reduced, and the sensitivity of a sensor using the light-receiving device 110 can be increased.

The partition 217 preferably absorbs at least light with a wavelength that is detected by the light-receiving device 110. For example, in the case where the light-receiving device 110 detects green light 21G emitted by a light-emitting device 190G, the partition 217 preferably absorbs at least green light. For example, when the partition 217 includes a red color filter, the partition 217 can absorb the green light, and thus reflected light can be inhibited from entering the light-receiving device 110.

Note that a colored layer that absorbs light may be provided in contact with one or both of top and side surfaces of the partition 216 that transmits light. The colored layer preferably absorbs light emitted by the light-emitting device. As the colored layer, a black matrix can be formed using a resin material containing a pigment or dye, for example. Moreover, the colored layer can be formed of a colored insulating layer by using a brown resist material.

The colored layer preferably absorbs at least light with a wavelength that is detected by the light-receiving device 110. For example, in the case where the light-receiving device 110 detects the green light 21G emitted by the light-emitting device 190G, the colored layer preferably absorbs at least the green light. For example, when the colored layer includes a red color filter, the colored layer can absorb the green light, and thus reflected light can be inhibited from entering the light-receiving device 110.

When the colored layer absorbs stray light generated in the display device 10F, the amount of stray light entering the light-receiving device 110 can be reduced. Consequently, noise can be reduced, and the sensitivity of a sensor using the light-receiving device 110 can be increased.

In the display device of this embodiment, the colored layer is provided between the light-receiving device 110 and the light-emitting device 190. This can inhibit stray light from entering the light-receiving device 110 from the light-emitting device 190.

A more detailed structure of the display device of one embodiment of the present invention will be described below with reference to FIG. 18 to FIG. 21.

[Display Device 100A]

Figure 18:
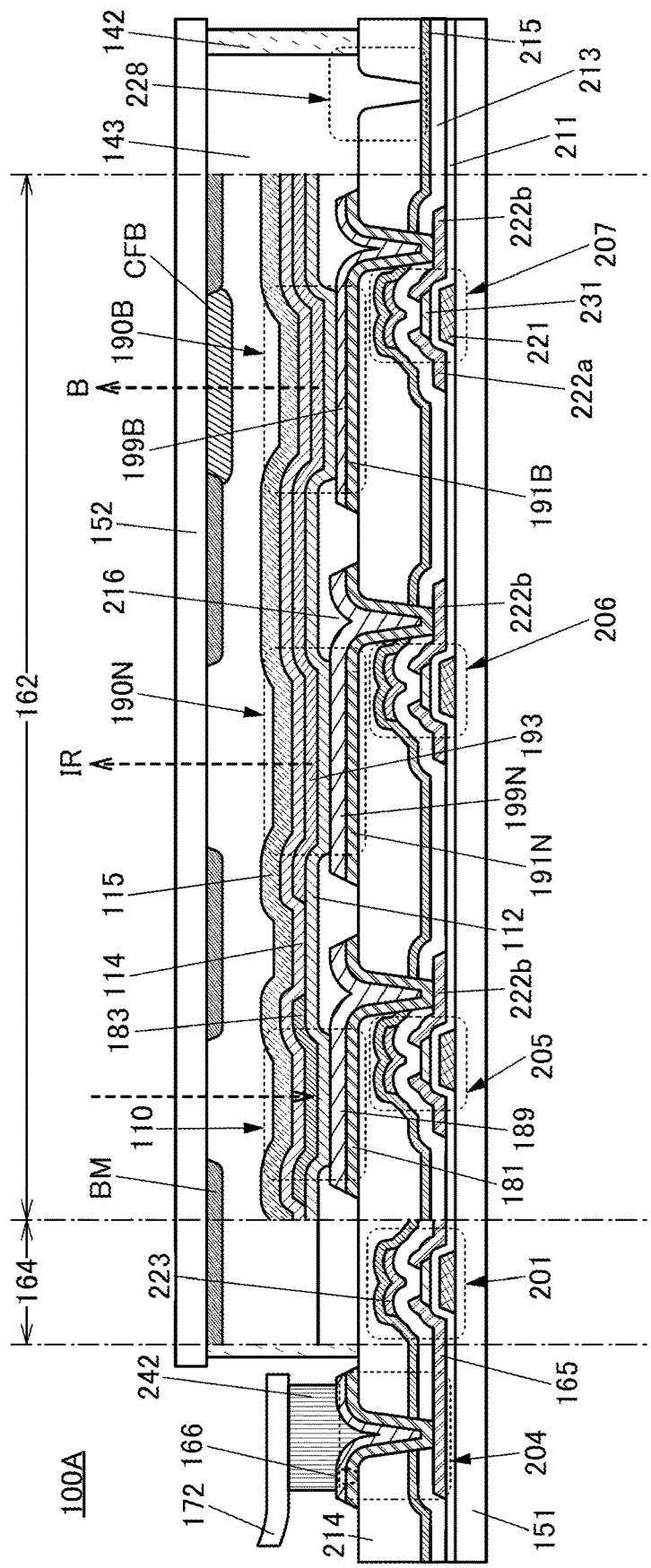
FIG. 18 is a cross-sectional view illustrating an example of a display device.

FIG. 18 is a cross-sectional view of a display device 100A. Note that the display device 100A has a structure in which the light-emitting portion 163 of the light-emitting apparatus 200A illustrated in FIG. 11 is replaced with a display portion 162. In this case, the structure illustrated in FIG. 18 can be regarded as a display module including the display device 100A, an IC, and an FPC.

FIG. 18 illustrates an example of a cross section including part of a region including the FPC 172, part of a region including the circuit 164, part of a region including the display portion 162, and part of a region including an end portion in the display device 100A.

The display device 100A illustrated in FIG. 18 includes the transistor 201, a transistor 205, the transistor 206, the transistor 207, the light-emitting device 190B, the light-emitting device 190N, the light-receiving device 110, and the like between the substrate 151 and the substrate 152.

The substrate 152 and the insulating layer 214 are bonded to each other with the adhesive layer 142. A solid sealing structure, a hollow sealing structure, or the like can be employed to seal the light-emitting device 190B, the light-emitting device 190N, and the light-receiving device 110. In FIG. 18, a hollow sealing structure is employed in which the space 143 surrounded by the substrate 152, the adhesive layer 142, and the insulating layer 214 is filled with an inert gas (e.g., nitrogen or argon). The adhesive layer 142 may be provided to overlap with the light-emitting device 190B, the light-emitting device 190N, and the light-receiving device 110. The space 143 surrounded by the substrate 152, the adhesive layer 142, and the insulating layer 214 may be filled with a resin different from that of the adhesive layer 142.

The light-emitting device 190B has a stacked-layer structure in which the pixel electrode 191B, the optical adjustment layer 199B, the common layer 112, the light-emitting layer 193, the common layer 114, and the common electrode 115 are stacked in this order from the insulating layer 214 side. The pixel electrode 191B is connected to the conductive layer 222*b* included in the transistor 207 through an opening provided in the insulating layer 214. The transistor 207 has a function of controlling the driving of the light-emitting device 190B.

The light-emitting device 190N has a stacked-layer structure in which the pixel electrode 191N, the optical adjustment layer 199N, the common layer 112, the light-emitting layer 193, the common layer 114, and the common electrode 115 are stacked in this order from the insulating layer 214 side. The pixel electrode 191N is connected to the conductive layer 222*b* included in the transistor 206 through an opening provided in the insulating layer 214. The transistor 206 has a function of controlling the driving of the light-emitting device 190N.

An end portion of the pixel electrode 191B and an end portion of the pixel electrode 191N are covered with the partition 216. The pixel electrode 191B and the pixel electrode 191N contain a material that reflects visible light and infrared light, and the common electrode 115 contains a material that transmits and reflects visible light and infrared light.

The light-receiving device 110 has a stacked-layer structure in which the pixel electrode 181, an optical adjustment layer 189, the common layer 112, the active layer 183, the common layer 114, and the common electrode 115 are stacked in this order from the insulating layer 214 side. The pixel electrode 181 is electrically connected to the conductive layer 222*b* included in the transistor 205 through an opening provided in the insulating layer 214. An end portion of the pixel electrode 181 is covered with the partition 216. The pixel electrode 181 contains a material that reflects visible light and infrared light, and the common electrode 115 contains a material that transmits and reflects visible light and infrared light.

Light emitted by the light-emitting device 190B is emitted to the substrate 152 side through the coloring layer CFB. Light emitted by the light-emitting device 190N is emitted to the substrate 152 side. Light enters the light-receiving device 110 through the substrate 152 and the space 143. For the substrate 152, a material having a high transmitting property with respect to visible light and infrared light is preferably used.

The pixel electrode 181 and the pixel electrode 191 can be formed using the same material in the same step. The common layer 112, the common layer 114, and the common electrode 115 are used by both the light-receiving device 110 and the light-emitting device 190. The light-receiving device 110 and the light-emitting device 190 can share all the structure except that the structure of the optical adjustment layer, the active layer 183, and the light-emitting layer 193 is different between them. Thus, the light-receiving device 110 can be incorporated into the display device 100A without a significant increase in the number of manufacturing steps.

The light-blocking layer BM is provided on the surface of the substrate 152 on the substrate 151 side. The light-blocking layer BM has openings at a position overlapping with the light-receiving device 110 and at a position overlapping with the light-emitting device 190. Providing the light-blocking layer BM can control the range where the light-receiving device 110 detects light. Furthermore, with the light-blocking layer BM, light can be prevented from directly entering the light-receiving device 110 from the light-emitting device 190 without through an object. Hence, a sensor with less noise and high sensitivity can be obtained.

The transistor 201, the transistor 205, the transistor 206, and the transistor 207 are formed over the substrate 151. These transistors can be fabricated using the same material in the same process.

The insulating layer 211, the insulating layer 213, the insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, the insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that an end portion of the organic insulating film is positioned on the inner side compared to the end portion of the display device 100A, to prevent the organic insulating film from being exposed at the end portion of the display device 100A.

An organic insulating film is suitable for the insulating layer 214 functioning as a planarization layer. In the region 228 illustrated in FIG. 18, an opening is formed in the insulating layer 214. This can inhibit entry of impurities into the display portion 162 from the outside through the insulating layer 214 even when an organic insulating film is used as the insulating layer 214. Thus, the reliability of the display device 100A can be increased.

Since the transistors included in the display device 100A have the same structure as the transistors included in the light-emitting apparatus 200A (FIG. 12A), detailed description will be omitted.

There is no particular limitation on the structure of the transistors included in the display device of this embodiment. For example, the transistors that can be used in the light-emitting apparatus described in Embodiment 1 can be used for the display device of this embodiment.

The connection portion 204 is provided in a region of the substrate 151 not overlapping with the substrate 152. In the connection portion 204, the wiring 165 is electrically connected to the FPC 172 through the conductive layer 166 and the connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorption layer, or the like may be arranged on the outside of the substrate 152.

The materials that can be used for the components which can be used for the components of the light-emitting apparatus, which are described in Embodiment 1, can be used as materials that can be used for the components of the display device.

The active layer 183 of the light-receiving device 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting device 190 and the active layer 183 of the light-receiving device 110 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and derivatives thereof. Examples of a p-type semiconductor material included in the active layer 183 are electron-donating organic semiconductor materials such as copper(II) phthalocyanine (CuPc) and tetraphenyldibenzoperiflanthene (DBP).

For example, the active layer 183 is preferably formed by co-evaporation of an n-type semiconductor and a p-type semiconductor.

[Display Device 100B]

FIG. 19A illustrates a cross-sectional view of a display device 100B.

The display device 100B differs from the display device 100A mainly in that the lens 149 and the protective layer 195 are included.

Providing the protective layer 195 covering the light-receiving device 110 and the light-emitting device 190 can inhibit entry of impurities such as water into the light-receiving device 110 and the light-emitting device 190, so that the reliability of the light-receiving device 110 and the light-emitting device 190 can be increased.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display device 100B can be increased.

FIG. 19B illustrates an example in which the protective layer 195 has a three-layer structure. In FIG. 19B, the protective layer 195 includes the inorganic insulating layer 195a over the common electrode 115, the organic insulating layer 195b over the inorganic insulating layer 195a, and the inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving device 110 and the light-emitting device 190 can be surrounded by the insulating layer 215 and the protective layer 195, whereby the reliability of the light-receiving device 110 and the light-emitting device 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on a surface of the substrate 152 on the substrate 151 side. The lens 149 has a convex surface on the substrate 151 side. It is preferable that the light-receiving region of the light-receiving device 110 overlap with the lens 149 and do not overlap with the light-emitting layer 193. Thus, the sensitivity and accuracy of the sensor using the light-receiving device 110 can be increased.

The lens 149 preferably has a refractive index of greater than or equal to 1.3 and less than or equal to 2.5. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, and the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, or the like can be used for the lens 149. Alternatively, zinc sulfide or the like can be used for the lens 149.

In the display device 100B, the protective layer 195 and the substrate 152 are bonded to each other with the adhesive layer 142. The adhesive layer 142 is provided to overlap with the light-receiving device 110 and the light-emitting device 190; that is, the display device 100B employs a solid sealing structure.

[Display Device 100C]

FIG. 20A illustrates a cross-sectional view of a display device 100C.

The display device 100C differs from the display device 100B in the structure of the transistors.

The display device 100C includes the transistor 202, the transistor 208, and a transistor 209 over the substrate 151.

Since the transistors included in the display device 100C have the same structure as the transistors included in the light-emitting apparatus 200B (FIG. 13A), detailed description thereof will be omitted.

FIG. 20A illustrates an example in which the insulating layer 225 covers a top and side surfaces of the semiconductor layer. Meanwhile, in FIG. 20B, the insulating layer 225 overlaps with the channel formation region 231$i$ of the semiconductor layer 231 and does not overlap with the low-resistance regions 231$n$. The structure illustrated in FIG. 20B can be obtained by processing the insulating layer 225 using the conductive layer 223 as a mask, for example. In FIG. 20B, the insulating layer 215 is provided to cover the insulating layer 225 and the conductive layer 223, and the conductive layer 222$a$ and the conductive layer 222$b$ are connected to the low-resistance regions 231$n$ through the openings in the insulating layer 215. Furthermore, the insulating layer 218 covering the transistor may be provided.

[Display Device 100D]

Figure 21:
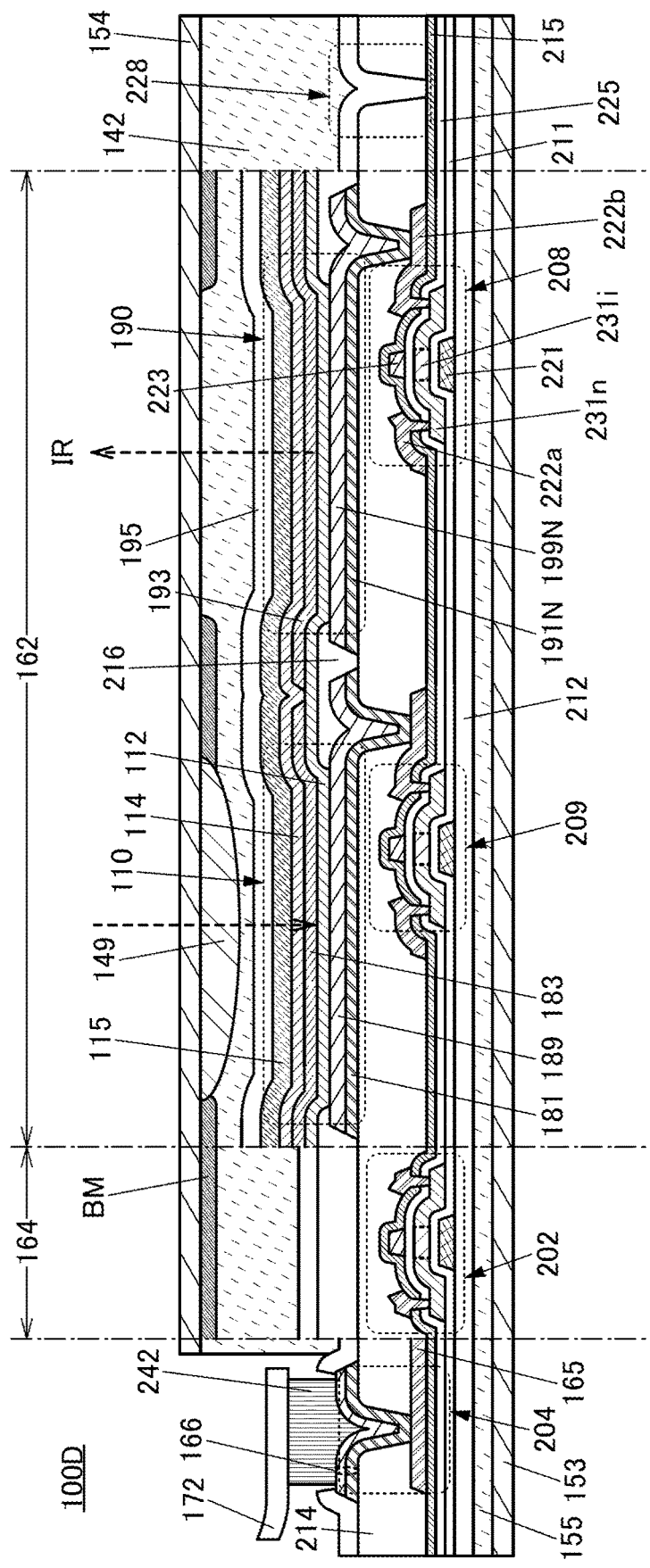
FIG. 21 is a cross-sectional view illustrating an example of a display device.

FIG. 21 illustrates a cross-sectional view of a display device 100D.

The display device 100D differs from the display device 100C in that the substrate 151 and the substrate 152 are not included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display device 100D is formed in such a manner that the insulating layer 212, the transistor 202, the transistor 208, the transistor 209, the light-receiving device 110, the light-emitting device 190, and the like that are formed over a formation substrate are transferred onto the substrate 153. The substrate 153 and the substrate 154 are preferably flexible. Accordingly, the flexibility of the display device 100D can be increased.

The inorganic insulating film that can be used as the insulating layer 211, the insulating layer 213, and the insulating layer 215 can be used as the insulating layer 212.

The display device 100C shows an example in which the lens 149 is not included, and the display device 100D shows an example in which the lens 149 is included. The lens 149 can be provided as appropriate in accordance with the usage of the sensor, or the like.

As described above, the display device of this embodiment includes, in the display portion, the light-emitting device emitting infrared light, the light-emitting device emitting visible light, and the light-receiving device that detects at least part of visible light and infrared light. The display portion has both of a function of displaying an image and a function of detecting light. Thus, the size and weight of an electronic device can be reduced as compared to the case where a sensor is provided outside a display portion or outside a display device. Moreover, an electronic device having more functions can be obtained by combination with a sensor provided outside the display portion or outside the display device.

The light-receiving device can share at least one layer other than the active layer with the light-emitting device (the EL device). Furthermore, the light-receiving device can share all the layers other than the active layer with the light-emitting device (the EL device). With only the addition of the step of depositing the active layer to the manufacturing process of the light-emitting device, the light-emitting device and the light-receiving device can be formed over one substrate, for example. In the light-receiving device and the light-emitting device, their pixel electrodes can be formed using the same material in the same step, and their common electrodes can be formed using the same material in the same step. When a circuit electrically connected to the light-receiving device and a circuit electrically connected to the light-emitting device are formed using the same material in the same process, the manufacturing process of the display device can be simplified. In such a manner, a display device that incorporates a light-receiving device and is highly convenient can be manufactured without complicated steps.

This embodiment can be combined with the other embodiments as appropriate.

Embodiment 3

In this embodiment, materials that can be used for the light-emitting devices of one embodiment of the present invention will be described.

<Electrodes>

As a material that forms the pair of electrodes of the light-emitting device, a metal, an alloy, an electrically conductive compound, a mixture thereof, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

To manufacture a light-emitting device having a microcavity structure, a reflective electrode and a semi-transmissive and semi-reflective electrode are used. Thus, a single layer or stacked layers can be formed using one or more desired conductive materials. For fabrication of the electrodes, a sputtering method or a vacuum evaporation method can be used.

<Hole-Injection Layer and Hole-Transport Layer>

The hole-injection layer is a layer that injects holes from an anode to a light-emitting unit and contains a material with a high hole-injection property.

As the material with a high hole-injection property, a transition metal oxide such as molybdenum oxide, vanadium oxide, ruthenium oxide, tungsten oxide, or manganese oxide or a phthalocyanine-based compound such as phthalocyanine (abbreviation: H₂Pc) or copper phthalocyanine (abbreviation: CuPc) can be used, for example.

As the material with a high hole-injection property, it is possible to use, for example, an aromatic amine compound such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

As the material with a high hole-injection property, it is possible to use, for example, poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), or poly[N,N-bis(4-butylphenyl)-N,N-bis(phenyl)benzidine] (abbreviation: Poly-TPD). Alternatively, it is also possible to use, for example, a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

As the material with a high hole-injection property, a composite material containing a hole-transport material and an acceptor material (an electron-accepting material) can also be used. In this case, the acceptor material extracts electrons from the hole-transport material, so that holes are generated in the hole-injection layer and the holes are injected into the light-emitting layer through the hole-transport layer. Note that the hole-injection layer may be formed using a single layer of a composite material containing a hole-transport material and an acceptor material, or may be formed using a stack including a layer of a hole-transport material and a layer of an acceptor material.

The hole-transport layer is a layer transporting holes, which are injected from the anode by the hole-injection layer, to the light-emitting layer. The hole-transport layer is a layer including a hole-transport material. It is particularly preferable that the HOMO level of the hole-transport material used for the hole-transport layer be the same as or close to the HOMO level of the hole-injection layer.

As the acceptor material used for the hole-injection layer, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Examples of materials having an electron-withdrawing group (halogen group or cyano group) include 7,7,8,8-tetracyano-2,3,5,6-tetrafluoroquinodimethane (abbreviation: F₄-TCNQ), chloranil, 2,3,6,7,10,11-hexacyano-1,4,5,8,9,12-hexaazatriphenylene (abbreviation: HAT-CN), and 1,3,4,5,7,8-hexafluorotetracyano-naphthoquinodimethane (abbreviation: F6-TCNNQ). A compound in which electron-withdrawing groups are bonded to a condensed aromatic ring having a plurality of hetero atoms, such as HAT-CN, is particularly preferable because it is thermally stable. A [3]radialene derivative including an electron-withdrawing group (in particular, a cyano group or a halogen group such as a fluoro group) has a very high electron-accepting property and thus is preferred; specific examples include α,α',α"-1,2,3-cyclopropanetriylidenetris [4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The hole-transport materials used for the hole-injection layer and the hole-transport layer are preferably substances with a hole mobility greater than or equal to $10^{-6}$ cm²/Vs. Note that other substances can also be used as long as they have a property of transporting more holes than electrons.

As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

Examples of the carbazole derivative (a compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: ONCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), PCzPCA1, PCzPCA2, PCzPCN1, 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N-diphenyl-9,9-dimethylfluorene-2,7-diamine (abbreviation: YGA2F), and 4,4',4"-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the thiophene derivative (a compound having a thiophene skeleton) and the furan derivative (a compound having a furan skeleton) include compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), 4,4',4"-(benzene-1,3,5-triyl)tri(dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

Specific examples of the aromatic amine include 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4"-tris[N-(1-naphthyl)-N-phenylamino]triphenylamine (abbreviation: 1-TNATA), TDATA, m-MTDATA, N,N-di(p-tolyl)-NN-diphenyl-p-phenylenediamine (abbreviation: DTDPPA), DPAB, DNTPD, and DPA3B.

As the hole-transport material, a high molecular compound such as PVK, PVTPA, PTPDMA, or Poly-TPD can also be used.

The hole-transport material is not limited to the above examples, and one of or a combination of various known materials can be used as the hole-transport material in the hole-injection layer and the hole-transport layer.

<Light-Emitting Layer>

The light-emitting layer is a layer containing a light-emitting substance. The light-emitting layer can include one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

The light-emitting layer may contain one or more kinds of organic compounds (e.g., a host material and an assist material) in addition to the light-emitting substance (guest material). As the one or more kinds of organic compounds, one or both of the hole-transport material and the electron-transport material described in this embodiment can be used. As the one or more kinds of organic compounds, a bipolar material may be used.

There is no particular limitation on the light-emitting substance that can be used for the light-emitting layer, and it is possible to use a light-emitting substance that converts singlet excitation energy into light emission in the visible light range or the near-infrared light range or a light-emitting substance that converts triplet excitation energy into light emission in the visible light range or the near-infrared light range.

As an example of the light-emitting substance that converts singlet excitation energy into light, a substance that exhibits fluorescence (a fluorescent material) can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-diphenyl-N,N-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine] (abbreviation: 1,6BnfAPrn), N,N-(pyrene-1,6-diyl)bis[(N-phenylbenzo[b]naphtho[1,2-d]furan)-8-amine] (abbreviation: 1,6BnfAPrn-02), and N,N-(pyrene-1,6-diyl)bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

Examples of the light-emitting substance that converts triplet excitation energy into light include a substance that exhibits phosphorescence (a phosphorescent material) and a thermally activated delayed fluorescence (TADF) material that exhibits thermally activated delayed fluorescence.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine skeleton including an electron-withdrawing group as a ligand; a platinum complex; and a rare earth metal complex.

As a phosphorescent material that exhibits blue or green and whose emission spectrum has a peak wavelength at greater than or equal to 450 nm and less than or equal to 570 nm, the following substances can be given.

The examples include: organometallic complexes having a 4H-triazole skeleton, such as tris{2-[5-(2-methylphenyl)-4-(2,6-dimethylphenyl)-4H-1,2,4-triazol-3-yl-N²]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C²']iridium (III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C²'}iridium(III) picolinate (abbreviation: [Ir(CF$_3$ppy)$_2$(pic)]), and bis[2-(4',6'-difluorophenyl)pyridinato-N,C²']iridium(III) acetylacetonate (abbreviation: FIr(acac)).

As a phosphorescent material that exhibits green or yellow and whose emission spectrum has a peak wavelength at greater than or equal to 495 nm and less than or equal to 590 nm, the following substances can be given.

The examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN³]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C²')iridium(III) (abbreviation: [Ir(ppy)$_3$]), bis(2-phenylpyridinato-N,C²')iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C²')iridium(III) (abbreviation: [Ir(pq)$_3$]), bis(2-phenylquinolinato-N,C²')iridium(III) acetylacetonate (abbreviation: [Ir(pq)$_2$(acac)]), [2-(4-phenyl-2-pyridinyl-κN)phenyl-κC]bis[2-(2-pyridinyl-κN)phenyl-κC]iridium(III) (abbreviation: [Ir(ppy)$_2$(4dppy)]), and bis[2-(2-pyridinyl-κN)phenyl-κC][2-(4-methyl-5-phenyl-2-pyridinyl-κN)phenyl-κC]; organometallic complexes such as bis(2,4-diphenyl-1,3-oxazolato-N,C²')iridium(III) acetylacetonate (abbreviation: [Ir(dpo)$_2$(acac)]), bis{2-[4'-(perfluorophenyl)phenyl]pyridinato-N,C²'}iridium(III) acetylacetonate (abbreviation: [Ir(p-PF-ph)$_2$(acac)]), and bis(2-phenylbenzothiazolato-N,C²')iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]).

As a phosphorescent material that exhibits yellow or red and whose emission spectrum has a peak wavelength at greater than or equal to 570 nm and less than or equal to 750 nm, the following substances can be given.

The examples include organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di(naphthalen-1-yl)pyrimidinato](dipivaloylmethanato)iridium(III) (abbreviation: [Ir(d1npm)$_2$(dpm)]), and tris(4-t-butyl-6-phenylpyrimidinato)iridium(III) (abbreviation: [Ir(tBuppm)$_3$]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-N]phenyl-κC}(2,6-dimethyl-3,5-heptanedionato-κ2O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-N]phenyl-κC}(2,2,6,6-tetramethyl-3,5-heptanedionato-κ2O,O')iridium(III) (abbreviation: [Ir(dmdppr-dmCP)$_2$(dpm)]), (acetylacetonato)bis[2-methyl-3-phenylquinoxalinato-N,C²']iridium(III) (abbreviation: [Ir(mpq)$_2$(acac)]), (acetylacetonato)bis(2,3-diphenylquinoxalinato-N,C²')iridium(III) (abbreviation: [Ir(dpq)$_2$(acac)]), (acetylacetonato)bis[2,3-bis(4-fluorophenyl)quinoxalinato]iridium(III) (abbreviation: [Ir(Fdpq)$_2$(acac)]), and bis{4,6-dimethyl-2-[5-(5-cyano-2-methylphenyl)-3-(3,5-dimethylphenyl)-2-pyrazinyl-N]phenyl-κC}(2,2,6,6-tetramethyl-3,5-heptanedionato-κ2O,O')iridium(III) (abbreviation: [Ir(dmdppr-m5CP)$_2$(dpm)]); organometallic complexes having a pyridine skeleton, such as tris(1-phenylisoquinolinato-N,C²')iridium(III) (abbreviation: [Ir(piq)$_3$]), bis(1-phenylisoquinolinato-N,C²')iridium(III) acetylacetonate (abbreviation: [Ir(piq)$_2$(acac)]), and bis[4,6-dimethyl-2-(2-quinolinyl-κN)phenyl-κC](2,4-pentanedionato-κ2O,O')iridium(III); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]).

As the organic compounds (e.g., the host material and the assist material) used in the light-emitting layer, one or more kinds of substances having a larger energy gap than the light-emitting substance can be used.

In the case where the light-emitting substance used in the light-emitting layer is a fluorescent material, an organic compound used in combination with the light-emitting substance is preferably an organic compound that has a high energy level in a singlet excited state and has a low energy level in a triplet excited state.

In terms of a preferable combination with the light-emitting substance (the fluorescent material or the phosphorescent material), specific examples of the organic compounds are shown below though some of them overlap the specific examples shown above.

In the case where the light-emitting substance is a fluorescent material, examples of the organic compound that can be used in combination with the light-emitting substance include fused polycyclic aromatic compounds, such as an anthracene derivative, a tetracene derivative, a phenanthrene derivative, a pyrene derivative, a chrysene derivative, and a dibenzo[g,p]chrysene derivative.

Specific examples of the organic compound (the host material) used in combination with the fluorescent material include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), PCPN, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), CzPA, 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-[4-(9-phenyl-9H-fluoren-9-yl)-biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

In the case where the light-emitting substance is a phosphorescent material, as the organic compound used in combination with the light-emitting substance, an organic compound that has higher triplet excitation energy (energy difference between a ground state and a triplet excited state) than the light-emitting substance is selected.

In the case where a plurality of organic compounds (e.g., a first host material and a second host material (or an assist material)) are used in combination with the light-emitting substance in order to form an exciplex, the plurality of organic compounds are preferably mixed with a phosphorescent material (particularly an organometallic complex).

Such a structure makes it possible to efficiently obtain light emission utilizing ExTET (Exciplex-Triplet Energy Transfer), which is energy transfer from an exciplex to a light-emitting substance. Note that a combination of a plurality of organic compounds that easily forms an exciplex is preferable, and it is particularly preferable to combine a compound that easily accepts holes (a hole-transport material) and a compound that easily accepts electrons (an electron-transport material). As the hole-transport material and the electron-transport material, specifically, any of the materials described in this embodiment can be used. With this structure, high efficiency, low voltage, and a long lifetime of the light-emitting device can be achieved at the same time.

In the case where the light-emitting substance is a phosphorescent material, examples of the organic compounds that can be used in combination with the light-emitting substance include an aromatic amine, a carbazole derivative, a dibenzothiophene derivative, a dibenzofuran derivative, a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

Among the above-described compounds, specific examples of the aromatic amine, (a compound having an aromatic amine skeleton), the carbazole derivative, the dibenzothiophene derivative (thiophene derivative), and the dibenzofuran derivative (furan derivative), which are organic compounds having a high hole-transport property, are the same as the compounds given above as specific examples of the hole-transport material.

Specific examples of the zinc- and aluminum-based metal complexes, which are organic compounds having a high electron-transport property, include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq).

A metal complex having an oxazole-based or thiazole-based ligand such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used.

Specific examples of the oxadiazole derivative, the triazole derivative, the benzimidazole derivative, the quinoxaline derivative, the dibenzoquinoxaline derivative, and the phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOs), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation:

2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), and 1,3,5-tri[3-(3-pyridyl)phenyl]benzene (abbreviation: TmPyPB).

As the organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

The TADF material is a material that can up-convert a triplet excited state into a singlet excited state (reverse intersystem crossing) using a little thermal energy and efficiently exhibits light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2$OEP).

It is possible to use a heterocyclic compound having a π-electron-rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Note that a substance in which a π-electron-rich heteroaromatic ring is directly bonded to a π-electron deficient heteroaromatic ring is particularly preferable because both the donor property of the π-electron-rich heteroaromatic ring and the acceptor property of the π-electron deficient heteroaromatic ring are improved and the energy difference between the singlet excited state and the triplet excited state becomes small.

Note that the TADF material can also be used in combination with another organic compound. In particular, the TADF material can be used in combination with the host material, the hole-transport material, and the electron-transport material described above.

Furthermore, when used in combination with a low molecular material or a high molecular material, the above materials can be used to form the light-emitting layer. For the deposition, a known method (e.g., an evaporation method, a coating method, or a printing method) can be used as appropriate.

<Electron-Transport Layer>

The electron-transport layer is a layer that transports electrons, which are injected from a cathode by the electron-injection layer, to the light-emitting layer. Note that the electron-transport layer is layer that contains an electron-transport material. As the electron-transport material used in the electron-transport layer, a substance having an electron mobility greater than or equal to $1 \times 10^{-6}$ cm$^2$/Vs is preferable. Note that other substances can also be used as long as they have a property of transporting more electrons than holes.

As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

As specific examples of the electron-transport material, the above-described materials can be used.

<Electron-Injection Layer>

The electron-injection layer is a layer that contains a substance having a high electron-injection property. For the electron-injection layer, an alkali metal, an alkaline earth metal, or a compound thereof such as lithium fluoride (LiF), cesium fluoride (CsF), calcium fluoride ($CaF_2$), or lithium oxide ($LiO_x$) can be used. A rare earth metal compound like erbium fluoride ($ErF_3$) can also be used. In addition, an electrode may be used for the electron-injection layer. An example of the electrode is a substance in which electrons are added at high concentration to calcium oxide-aluminum oxide. Any of the above-described substances for forming the electron-transport layer can also be used.

For the electron-injection layer, a composite material containing an electron-transport material and a donor material (an electron-donating material) may be used. Such a composite material is excellent in an electron-injection property and an electron-transport property because electrons are generated in the organic compound by the electron donor. The organic compound here is preferably a material excellent in transporting the generated electrons; specifically, for example, the above-described electron-transport materials used in the electron-transport layer (e.g., a metal complex or a heteroaromatic compound) can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. A Lewis base such as magnesium oxide can be used. An organic compound such as tetrathiafulvalene (abbreviation: TTF) can be used.

<Charge-Generation Layer>

The charge-generation layer is provided between the two light-emitting units. The charge-generation layer has a function of injecting electrons into one of the adjacent light-emitting units and injecting holes into the other thereof when voltage is applied between the anode and the cathode.

The charge-generation layer may contain a hole-transport material and an acceptor material (an electron-accepting material) or may contain an electron-transport material and a donor material. Forming the charge-generation layer with such a structure can suppress an increase in the driving voltage that would be caused by stacking EL layers.

As the hole-transport material, the acceptor material, the electron-transport material, and the donor material, the above-described materials can be used.

For manufacture of the light-emitting device in one embodiment of the present invention, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge-generation layer can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Materials of the functional layers included in the light-emitting device and the charge-generation layer are not limited to the above-described corresponding materials. For example, as the materials of the functional layers, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) may be used. As the quantum dot material, a colloidal quantum dot material, an alloyed quantum dot material, a core-shell quantum dot material, a core quantum dot material, or the like can be used.

This embodiment can be combined with the other embodiments and the example as appropriate.

Embodiment 4

In this embodiment, a display device of one embodiment of the present invention will be described with reference to FIG. 22.

The display device of one embodiment of the present invention includes first pixel circuits including light-receiving devices and second pixel circuits including light-emitting devices. The first pixel circuits and the second pixel circuits are arranged in a matrix.

Figure 22A:
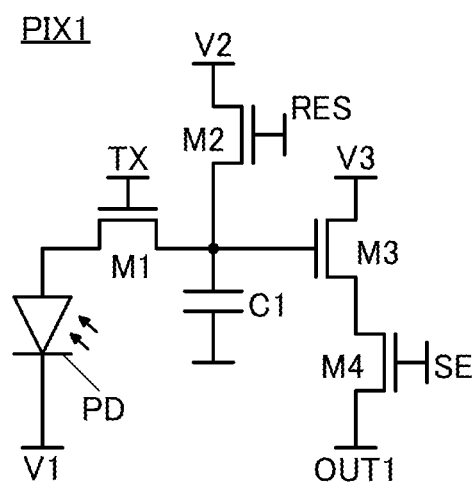
FIG. 22A and FIG. 22B are circuit diagrams illustrating examples of a pixel circuit.
Figure 22B:
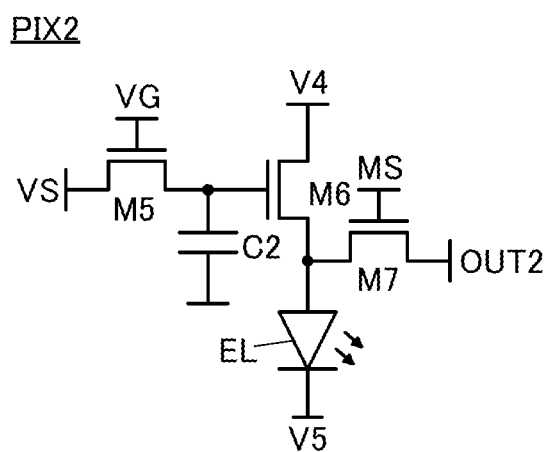

FIG. 22A illustrates an example of the first pixel circuit including a light-receiving device. FIG. 22B illustrates an example of the second pixel circuit including a light-emitting device.

A pixel circuit PIX1 illustrated in FIG. 22A includes a light-receiving device PD, a transistor M1, a transistor M2, a transistor M3, a transistor M4, and a capacitor C1. Here, an example of the case where a photodiode is used as the light-receiving device PD is illustrated.

A cathode of the light-receiving device PD is electrically connected to a wiring V1, and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential can be supplied to the wiring V1, the wiring V2, and the wiring V3. When the light-receiving device PD is driven with a reverse bias, the wiring V2 can be supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving device PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 22B includes a light-emitting device EL, a transistor M5, a transistor M6, a transistor M7, and a capacitor C2. Here, an example in which a light-emitting diode is used as the light-emitting device EL is illustrated. In particular, an organic EL device is preferably used as the light-emitting device EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting device EL and one of a source and a drain of the transistor M7. A gate of the transistor M7 is electrically connected to a wiring MS, and the other of the source and the drain is electrically connected to a wiring OUT2. A cathode of the light-emitting device EL is electrically connected to a wiring V5.

A constant potential is supplied to the wiring V4 and the wiring V5. In the light-emitting device EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting device EL in accordance with a potential supplied to the gate. When the transistor M5 is in an on state, a potential supplied to the wiring VS is supplied to the gate of the transistor M6, and the emission luminance of the light-emitting device EL can be controlled in accordance with the potential. The transistor M7 is controlled by a signal supplied to the wiring MS and has a function of outputting a potential between the transistor M6 and the light-emitting device EL to the outside through the wiring OUT2.

Note that in the display device of this embodiment, the light-emitting device may be made to emit light in a pulsed manner so as to display an image. A reduction in the driving time of the light-emitting device can reduce power consumption of the display device and suppress heat generation of the display device. An organic EL device is particularly preferable because of its favorable frequency characteristics. The frequency can be higher than or equal to 1 kHz and lower than or equal to 100 MHz, for example.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charges accumulated in a capacitor that is connected in series with the transistor for a longtime. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 22A and FIG. 22B, p-channel transistors can be used as appropriate.

The transistors included in the pixel circuit PIX1 and the transistors included in the pixel circuit PIX2 are preferably formed side by side over the same substrate. It is particularly preferable that the transistors included in the pixel circuits PIX1 and the transistors included in the pixel circuits PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a high-resolution light-receiving portion or display portion can be achieved.

This embodiment can be combined with the other embodiments as appropriate.

Embodiment 5

In this embodiment, electronic devices of one embodiment of the present invention will be described with reference to FIG. 23 to FIG. 25.

The electronic device of this embodiment includes the light-emitting apparatus of one embodiment of the present invention. For example, the light-emitting apparatus of one embodiment of the present invention can be used as a display portion of the electronic device. In this case, the electronic device preferably includes an optical sensor separately from the light-emitting apparatus. Since the light-emitting apparatus of one embodiment of the present invention has a function of emitting both visible light and infrared light, the electronic device can not only display an image on the display portion but also emit light (one or both of visible light and infrared light) used as a light source of the optical sensor. It is possible to perform biometric authentication or detect a touch (and approach) with a combination of the light-emitting apparatus and the optical sensor. Accordingly, the electronic device can have improved functionality, convenience, and the like.

Alternatively, the electronic device of this embodiment includes the display device of one embodiment of the present invention. The display device of one embodiment of the present invention can be used as a display portion of the electronic device. Since the display device of one embodiment of the present invention has a function of emitting both visible light and infrared light and a function of detecting light, the electronic device can not only display an image on the display portion but also perform biometric authentication or detect a touch (and approach). Accordingly, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
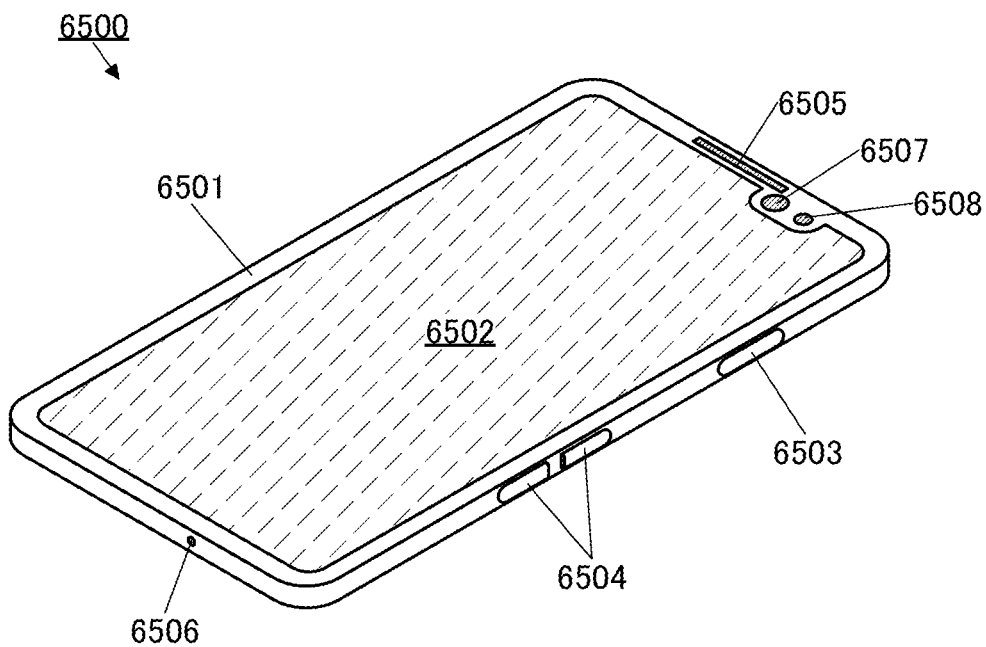
FIG. 23A and FIG. 23B illustrate an example of an electronic device.

An electronic device 6500 illustrated in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The light-emitting apparatus or the display device of one embodiment of the present invention can be used in the display portion 6502.

Figure 23B:
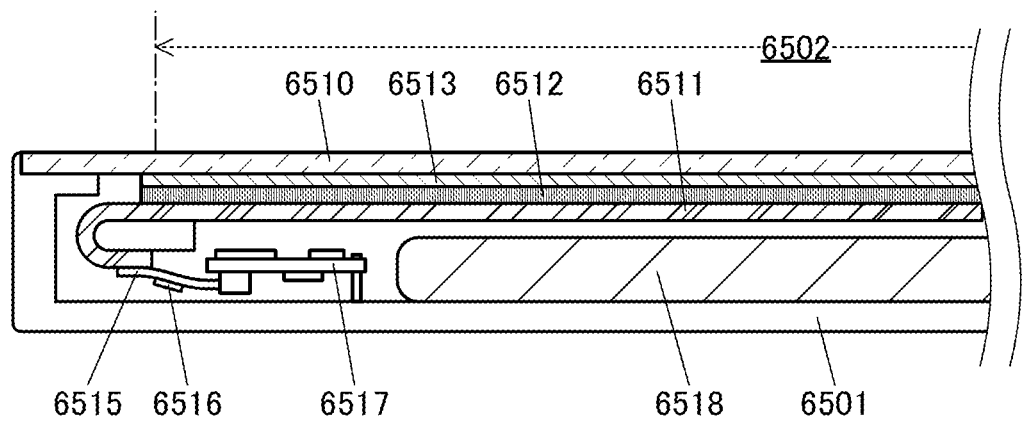

FIG. 23B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible light-emitting apparatus or a flexible display device of one embodiment of the present invention can be used in the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 24A:
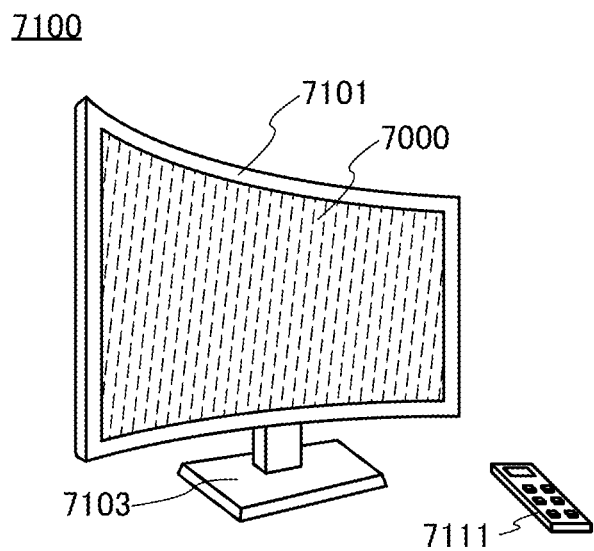
FIG. 24A to FIG. 24D illustrate examples of an electronic device.

FIG. 24A illustrates an example of a television device. In a television device 7100, a display portion 7000 is incorporated in a housing 7101. Here, a structure in which the housing 7101 is supported by a stand 7103 is illustrated.

The light-emitting apparatus or the display device of one embodiment of the present invention can be used in the display portion 7000.

Operation of the television device 7100 illustrated in FIG. 24A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may include a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 24B:
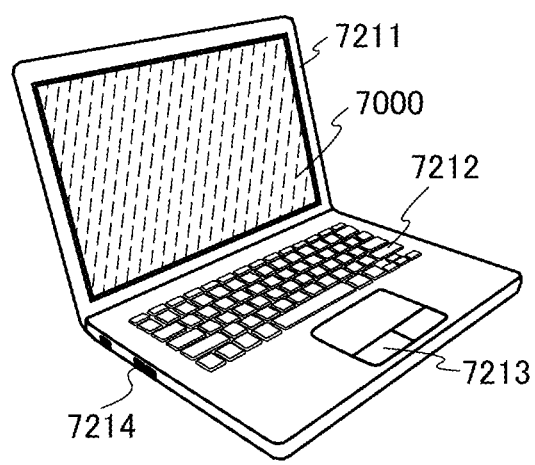

FIG. 24B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The light-emitting apparatus or the display device of one embodiment of the present invention can be used in the display portion 7000.

Figure 24C:
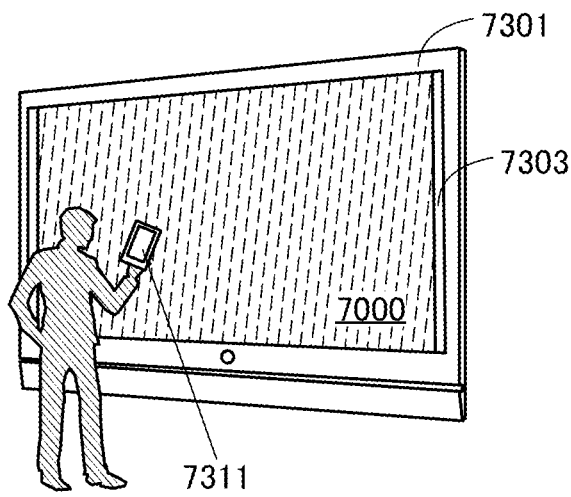
Figure 24D:
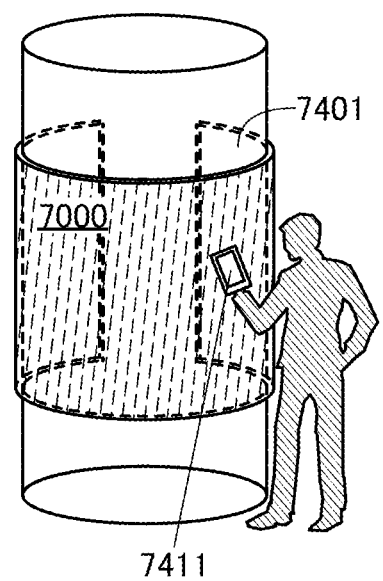

FIG. 24C and FIG. 24D illustrate examples of digital signage.

Digital signage 7300 illustrated in FIG. 24C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 24D is digital signage 7400 attached to a cylindrical pillar 7401. The digital signage 7400 includes the display portion 7000 provided along a curved surface of the pillar 7401.

The light-emitting apparatus or the display device of one embodiment of the present invention can be used in the display portion 7000 in FIG. 24C and FIG. 24D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 24C and FIG. 24D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 25A to FIG. 25F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 25A to FIG. 25F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 25A to FIG. 25F are described below.

Figure 25A:
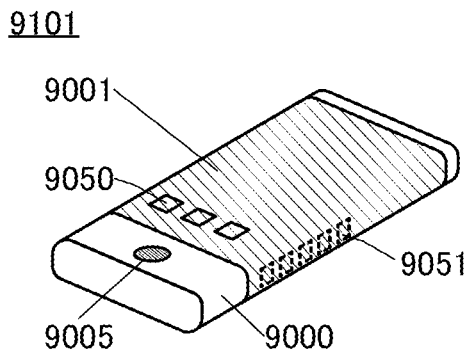
FIG. 25A to FIG. 25F illustrate examples of an electronic device.

FIG. 25A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 25A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 25B:
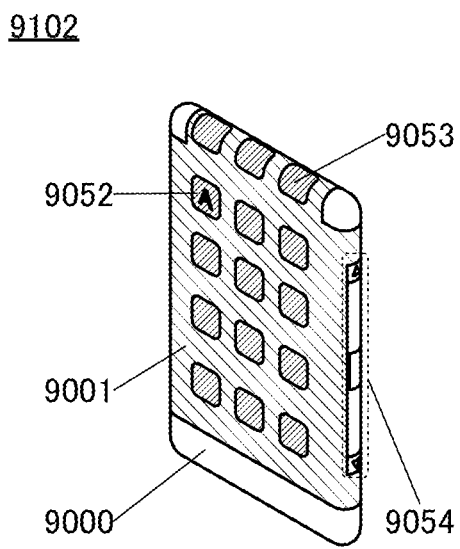

FIG. 25B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer the call, for example.

Figure 25C:
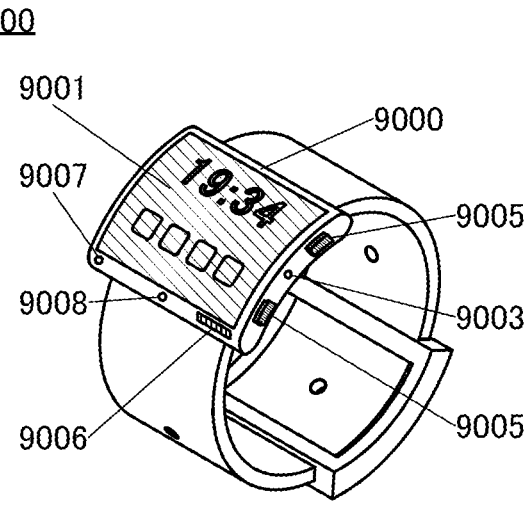

FIG. 25C is a perspective view illustrating a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 25D:
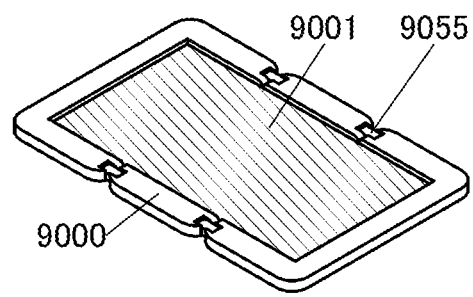
Figure 25E:
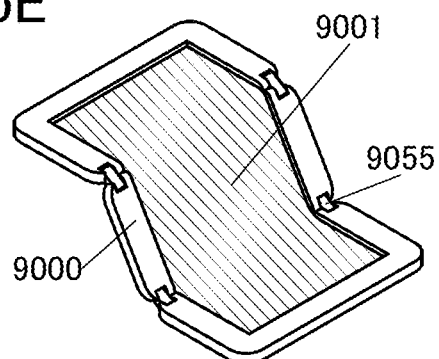
Figure 25F:
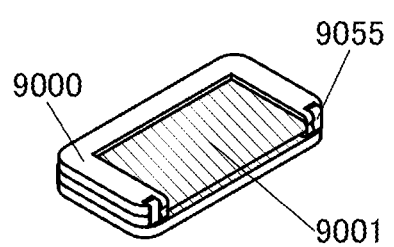

FIG. 25D to FIG. 25F are perspective views illustrating a foldable portable information terminal 9201. FIG. 25D is a perspective view of an opened state of the portable information terminal 9201, FIG. 25F is a perspective view of a folded state thereof, and FIG. 25E is a perspective view of a state in the middle of change from one of FIG. 25D and FIG. 25F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments and the example as appropriate.

Example

This example describes results of examinations with software on the device structures of light-emitting devices that can be used in the light-emitting apparatus or the display device of one embodiment of the present invention.

Figure 26A:
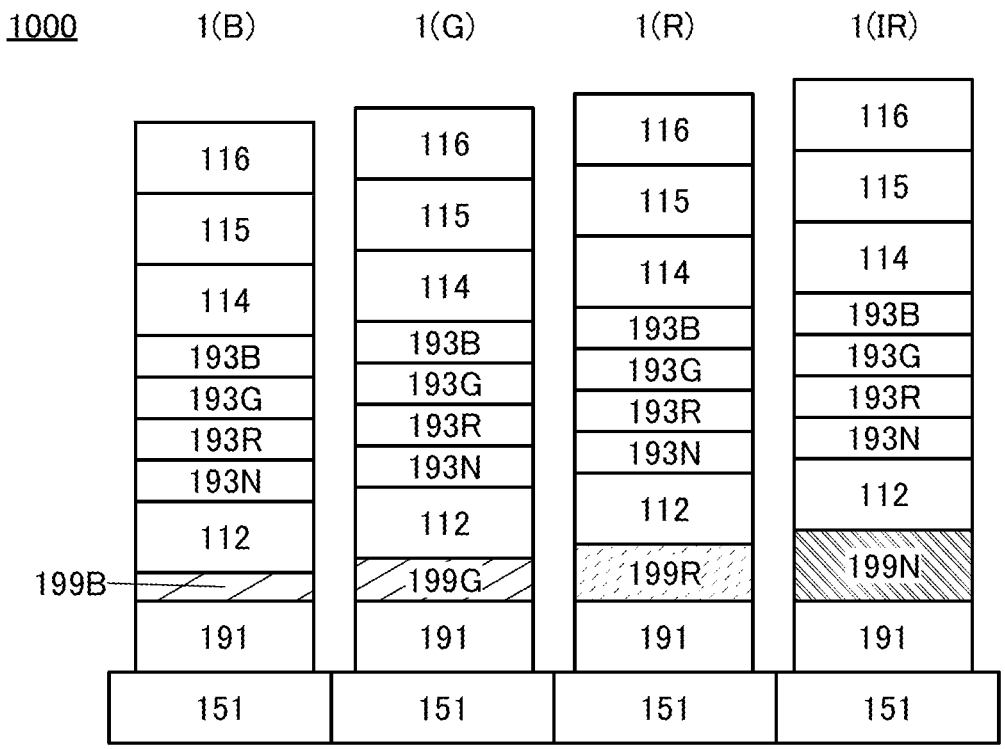
FIG. 26A and FIG. 26B illustrate light-emitting devices of Example.
Figure 26B:
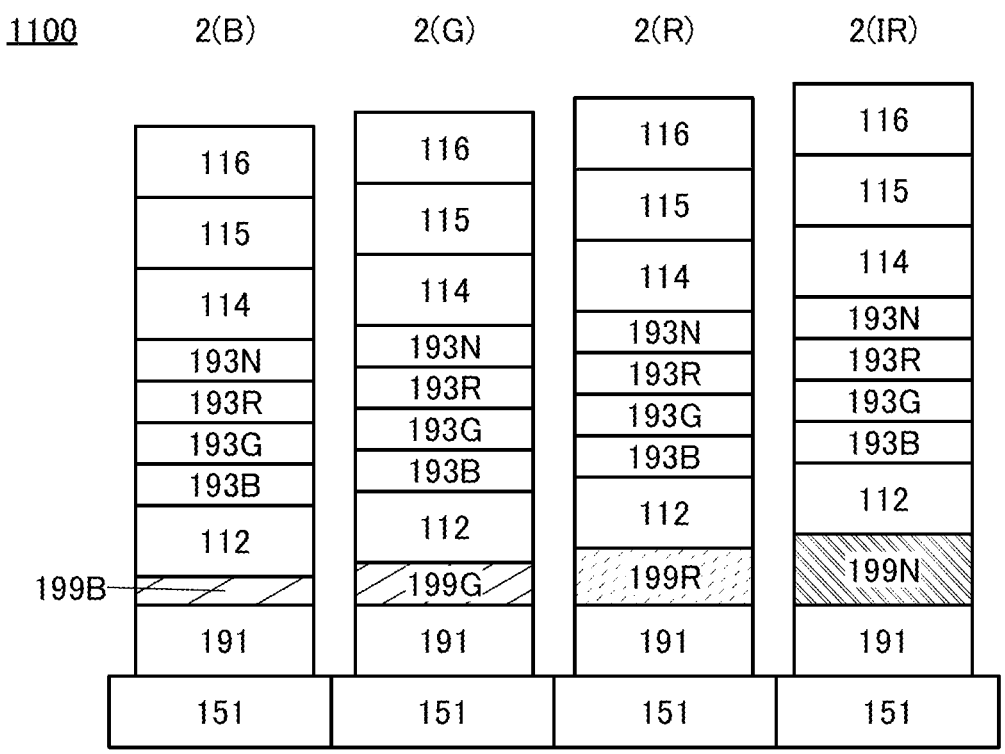

Specifically, this example describes results of examinations on the device structures of a light-emitting apparatus 1000 illustrated in FIG. 26A and a light-emitting apparatus 1100 illustrated in FIG. 26B.

The light-emitting apparatus 1000 includes a light-emitting device 1(B) that emits blue light, a light-emitting device 1(G) that emits green light, a light-emitting device 1(R) that emits red light, and a light-emitting device 1(IR) that emits infrared light. The four light-emitting devices included in the light-emitting apparatus 1000 have the same structure except for the thickness of the optical adjustment layer 199.

The light-emitting devices 1 included in the light-emitting apparatus 1000 each include the pixel electrode 191, the optical adjustment layer 199, the common layer 112, the light-emitting layer 193N, the light-emitting layer 193R, the light-emitting layer 193G, the light-emitting layer 193B, the common layer 114, the common electrode 115, and the buffer layer 116, which are stacked in this order over the substrate 151. In other words, the light-emitting layers are stacked in descending order of the wavelength of emitted light from the optical adjustment layer 199 side.

The light-emitting apparatus 1100 includes a light-emitting device 2(B) that emit blue light, a light-emitting device 2(G) that emits green light, a light-emitting device 2(R) that emits red light, and a light-emitting device 2(IR) that emits infrared light. The four light-emitting devices included in the light-emitting apparatus 1100 have the same structure except for the thickness of the optical adjustment layer 199.

The light-emitting devices 2 included in the light-emitting apparatus 1100 each include the pixel electrode 191, the optical adjustment layer 199, the common layer 112, the light-emitting layer 193B, the light-emitting layer 193G, the light-emitting layer 193R, the light-emitting layer 193N, the common layer 114, the common electrode 115, and the buffer layer 116, which are stacked in this order over the substrate 151. In other words, the light-emitting layers are stacked in ascending order of the wavelength of emitted light from the optical adjustment layer 199 side, i.e., the stacking order of the four light-emitting layers in the light-emitting apparatus 1100 is the reverse of that in the light-emitting apparatus 1000.

The following are structural formulae of organic compounds whose actual measured values (the refractive index n, the extinction coefficient k, the emission spectrum, and the like) were used for calculation in this example.

[Chemical formulae 1]
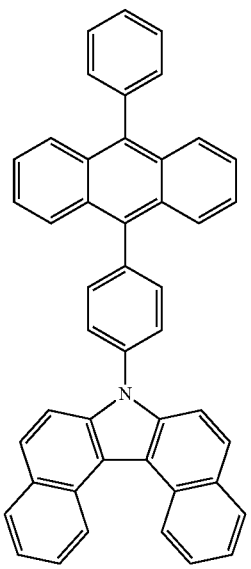
cgDBCzPA
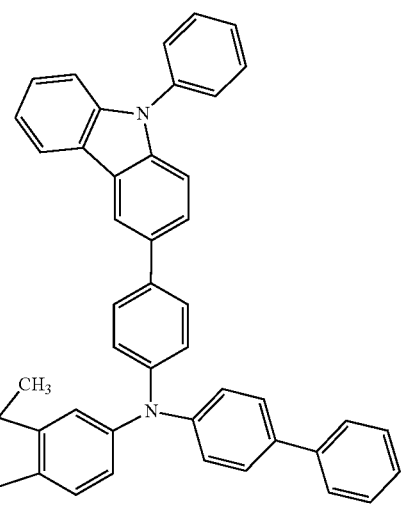
PCBBiF
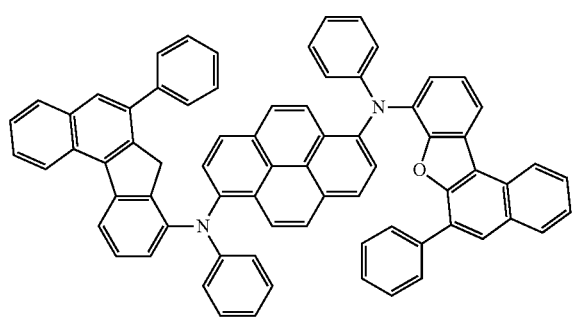
1,6BnfAPrn-03
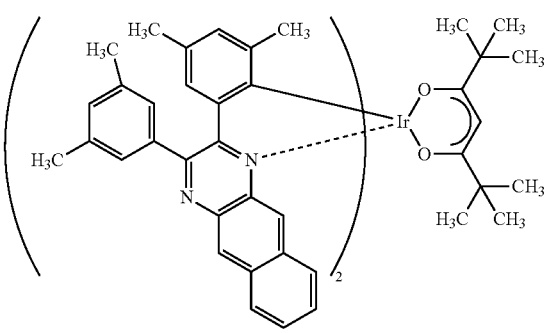
[Ir(dmdpbq)$_2$(dpm)]
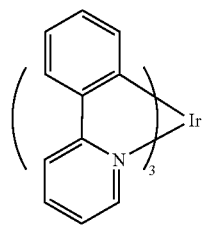
[Ir(ppy)$_3$]
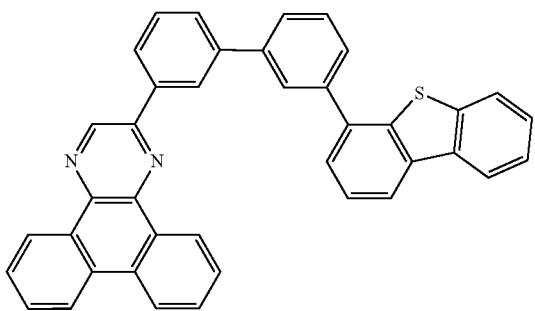
2mDBTBPDBq-II
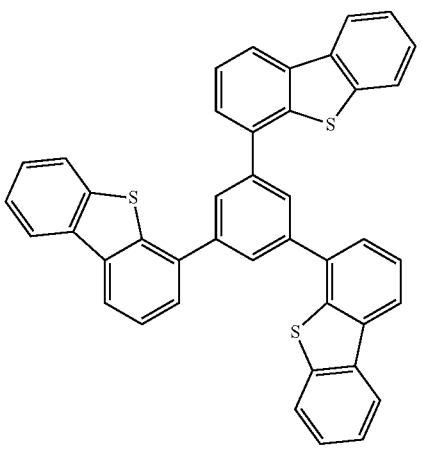
DBT3P-II

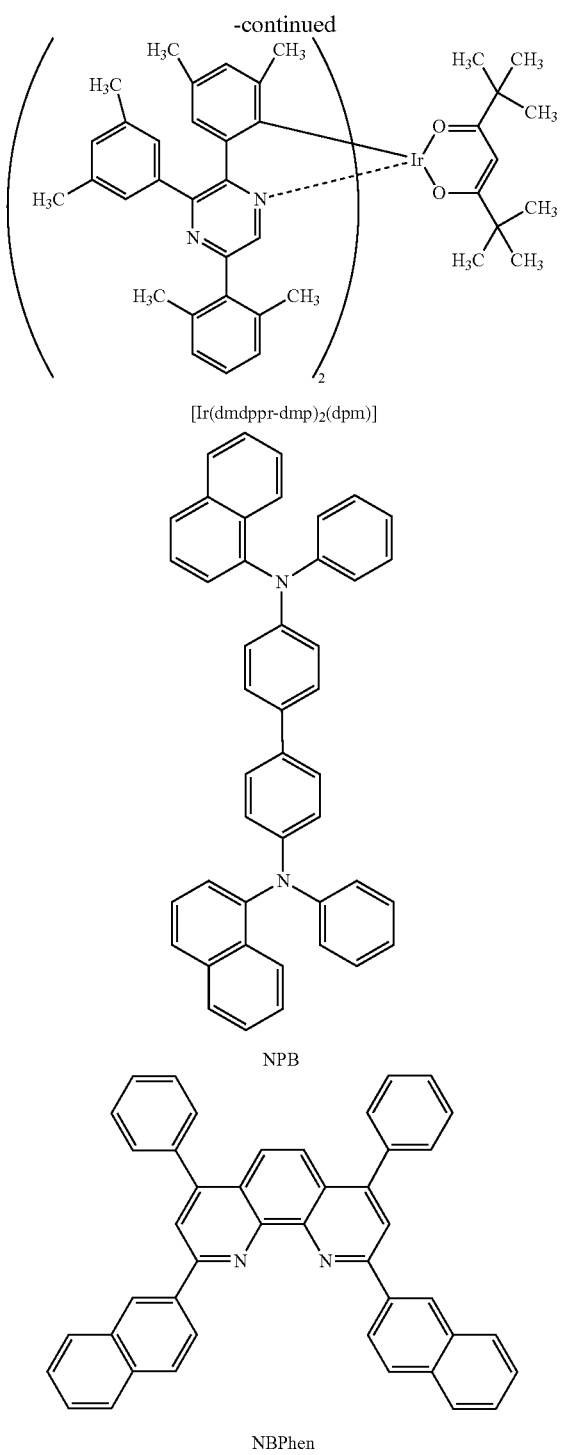

In this example, calculation was performed using an organic device simulator (a semiconducting emissive thin film optics simulator: setfos, produced by Cybernet Systems Co., Ltd.).

In the calculation, the thicknesses, the refractive indices n (actual measured values), and the extinction coefficients k (actual measured values) of layers included in the light-emitting devices, actual measured values of emission spectra (photoluminescence (PL) spectra) of light-emitting materials, and the positions and widths of light-emitting regions were input and multiplied by the Purcell factor to obtain emission intensities and spectrum wavelengths in the front direction in consideration of modulation of the radioactive decay rate of excitons.

The refractive index n and the extinction coefficient k of each layer were measured with a spectroscopic ellipsometer (M-2000U, produced by J.A. Woollam Japan Corp.). A film used for the measurement was formed to a thickness of approximately 50 nm with the material of each layer over a quartz substrate by a vacuum evaporation method.

The emission spectra of the light-emitting materials were measured using a multi-channel spectrometer (C10029-01, produced by Hamamatsu Photonics K.K.) as a detector for visible light, a near-infrared spectroradiometer (SR-NIR, produced by TOPCON TECHNOHOUSE CORPORATION) as a detector for near-infrared light, an ultraviolet LED (NSCU033B, produced by NICHIA CORPORATION) as excitation light, UV U360 (produced by Edmund Optics Inc.) as a bandpass filter, and SCF-50S-42L (produced by SIGMAKOKI CO., LTD.) as a longpass filter.

A film used for measurement of the emission spectrum of blue light was formed in such a manner that 7-[4-(10-phenyl-9-anthryl)phenyl]-7H-dibenzo[c,g]carbazole (abbreviation: cgDBCzPA) and N,N-(pyrene-1,6-diyl)bis[(6,N-diphenylbenzo[b]naphtho[1,2-d]furan)-8-amine] (abbreviation: 1,6BnfAPrn-03) were deposited to a thickness of 50 nm over a quartz substrate at a weight ratio of 1:0.03 by co-evaporation using a vacuum evaporation method.

A film used for measurement of the emission spectrum of green light was formed in such a manner that 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and tris(2-phenylpyridinato-N,C2')iridium(III) (abbreviation: [Ir(ppy)$_3$]) were deposited to a thickness of 50 nm over a quartz substrate at a weight ratio of 0.8:0.2:0.05 by co-evaporation using a vacuum evaporation method.

A film used for measurement of the emission spectrum of red light was formed in such a manner that 2mDBTBPDBq-II, PCBBiF, and bis{2-[5-(2,6-dimethylphenyl)-3-(3,5-dimethylphenyl)-2-pyrazinyl-κN]-4,6-dimethylphenyl-κC}(2,2,6,6-tetramethyl-3,5-heptanedionato-κ$^2$O,O)iridium(III) (abbreviation: [Ir(dmdppr-dmp)$_2$(dpm)]) were deposited to a thickness of 50 nm over a quartz substrate at a weight ratio of 0.8:0.2:0.05 by co-evaporation using a vacuum evaporation method.

A film used for measurement of the emission spectrum of infrared light was formed in such a manner that 2mDBTBPDBq-II, PCBBiF, and bis{4,6-dimethyl-2-[3-(3,5-dimethylphenyl)-2-benzo[g]quinoxalinyl-κN]phenyl-κC}(2,2,6,6-tetramethyl-3,5-heptanedionato-κ2O,O')iridium(III) (abbreviation: [Ir(dmdpbq)$_2$(dpm)]) were deposited to a thickness of 50 nm over a quartz substrate at a weight ratio of 0.7:0.3:0.1 by co-evaporation using a vacuum evaporation method. Note that a synthesis example of [Ir(dmdpbq)$_2$(dpm)] will be described later in Reference example.

Figure 27:
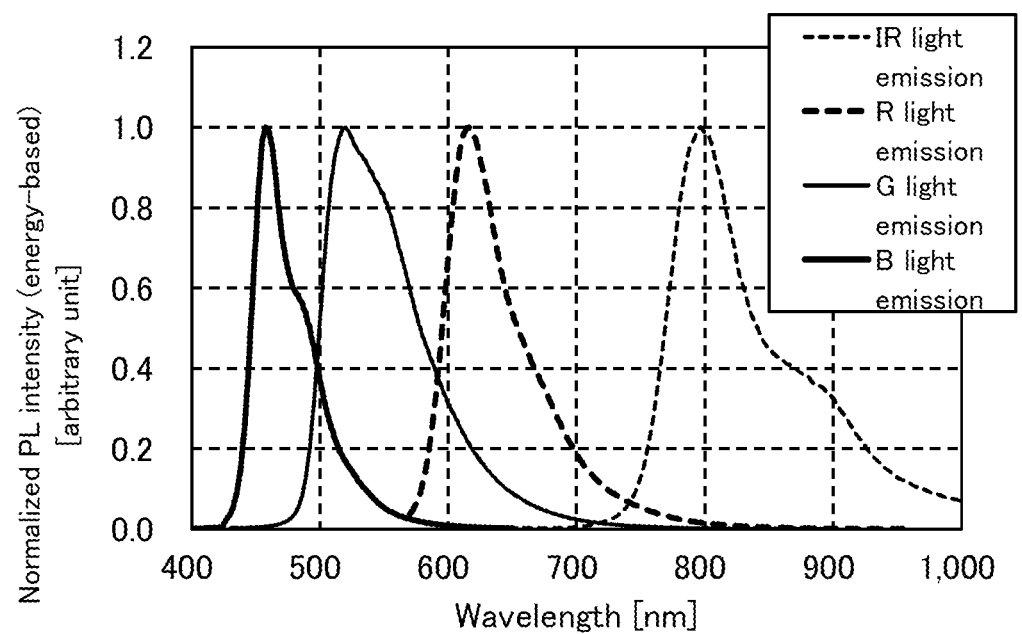
FIG. 27 shows emission spectra used for calculation in Example.

FIG. 27 shows PL spectra used for the calculation. In FIG. 27, the horizontal axis represents the wavelength (unit: nm) and the vertical axis represents energy-based normalized PL intensity (arbitrary unit). Note that it is possible to obtain photon-based PL intensity by multiplying the energy-based PL intensity and the wavelength together.

The light-emitting region was assumed to be the center of the light-emitting layer.

The luminescence quantum yield, the exciton generation probability, and the recombination probability of each of visible light and infrared light were assumed to be 100%. That is, external quantum efficiency (Lambertian assumption) obtained by calculation represents light extraction efficiency calculated from the emission intensity of the front on the assumption of Lambertian distribution.

The device structures of the light-emitting device 1 and the light-emitting device 2 used in this example are described with reference to Table 2 and Table 3.

Note that a hole-injection layer, an electron-injection layer, and a charge-generation layer are omitted for simplification of calculation.

TABLE 2

Light-emitting device 1

| Layer | Material | Film thickness | |
|---|---|---|---|
| Buffer layer 116 | DBT3P-II | 70 nm | Input value |
| Common electrode 115 | Ag | 15 nm | Input value |
| Common layer 114 | NBPhen | 44 nm | Input value |
| Light-emitting layer 193B | NPB | 10 nm | Input value |
| Light-emitting layer 193G | NPB | 10 nm | Input value |
| Light-emitting layer 193R | NPB | 10 nm | Input value |
| Light-emitting layer 193N | NPB | 10 nm | Input value |
| Common layer 112 | PCBBiF | 30 nm | Input value |
| Optical adjustment layer 199 | ITO | Optimized | |
| Pixel electrode 191 | Ag | 100 nm | Input value |

TABLE 3

Light-emitting device 2

| Layer | Material | Film thickness | |
|---|---|---|---|
| Buffer layer 116 | DBT3P-II | 70 nm | Input value |
| Common electrode 115 | Ag | 15 nm | Input value |
| Common layer 114 | NBPhen | 16 nm | Input value |
| Light-emitting layer 193N | NPB | 10 nm | Input value |
| Light-emitting layer 193R | NPB | 10 nm | Input value |
| Light-emitting layer 193G | NPB | 10 nm | Input value |
| Light-emitting layer 193B | NPB | 10 nm | Input value |
| Common layer 112 | PCBBiF | 30 nm | Input value |
| Optical adjustment layer 199 | ITO | Optimized | |
| Pixel electrode 191 | Ag | 100 nm | Input value |

A 0.7-mm-thick glass substrate with a refractive index of 1.5 was assumed as the substrate 151.

A 100-nm-thick silver (Ag) film was used as the pixel electrode 191 (also referred to as a reflective electrode).

An indium tin oxide (ITO) film was used as the optical adjustment layer 199 (also referred to as a transparent electrode). An optimal thickness of the optical adjustment layer 199 was calculated for each of the light-emitting devices of R, G, B, and IR.

As the common layer 112, a hole-transport layer was assumed and 30-nm-thick PCBBiF was used.

The light-emitting layer 193N, the light-emitting layer 193R, the light-emitting layer 193G, and the light-emitting layer 193B each had a thickness of 10 nm, and 4,4'-bis[N-(1-naphthyl)-N-phenylamino]biphenyl (abbreviation: NPB) was used as the host material.

As the common layer 114, an electron-transport layer was assumed and 2,9-bis(naphthalen-2-yl)-4,7-diphenyl-1,10-phenanthroline (abbreviation: NBphen) was used. The thickness of the common layer 114 was calculated and determined so that the external quantum efficiency (Lambertian assumption) of blue became a maximum value. Specifically, the thickness of the common layer 114 was 44 nm in the light-emitting apparatus 1000 and 16 nm in the light-emitting apparatus 1100.

A 15-nm-thick silver film was used as the common electrode 115.

As the buffer layer 116, 1,3,5-tri(dibenzothiophen-4-yl)-benzene (abbreviation: DBT3P-II) with a thickness of 70 nm was used.

Note that air (refractive index 1) was assumed for the upper side (an opposite side of a side in contact with the common electrode 115) of the buffer layer 116.

Under the above conditions, optimal device structures of the light-emitting devices were obtained by calculation.

In the calculation, the thickness of the optical adjustment layer 199 was obtained so that the optical path length between the pixel electrode 191 and the common electrode 115 was approximately k and the external quantum efficiency (Lambertian assumption) of light with each wavelength was maximized.

Table 4 shows calculation results of the thickness of the optical adjustment layer 199 in the light-emitting device 1 and the light-emitting device 2.

TABLE 4

| | Light-emitting device 1 | Light-emitting device 2 |
|---|---|---|
| 199B | 73 nm | 102 nm |
| 199G | 115 nm | 138 nm |
| 199R | 163 nm | 182 nm |
| 199N | 252 nm | 268 nm |

As shown in Table 4, in the light-emitting apparatus 1000, the calculated thicknesses were 73 nm for the optical adjustment layer 199B of the light-emitting device 1(B), 115 nm for the optical adjustment layer 199G of the light-emitting device 1(G), 163 nm for the optical adjustment layer 199R of the light-emitting device 1(R), and 252 nm for the optical adjustment layer 199N of the light-emitting device 1(IR).

In addition, as shown in Table 4, in the light-emitting apparatus 1100, the calculated thicknesses were 102 nm for the optical adjustment layer 199B of the light-emitting device 2(B), 138 nm for the optical adjustment layer 199G of the light-emitting device 2(G), 182 nm for the optical adjustment layer 199R of the light-emitting device 2(R), and 268 nm for the optical adjustment layer 199N of the light-emitting device 2(IR).

Figure 28:
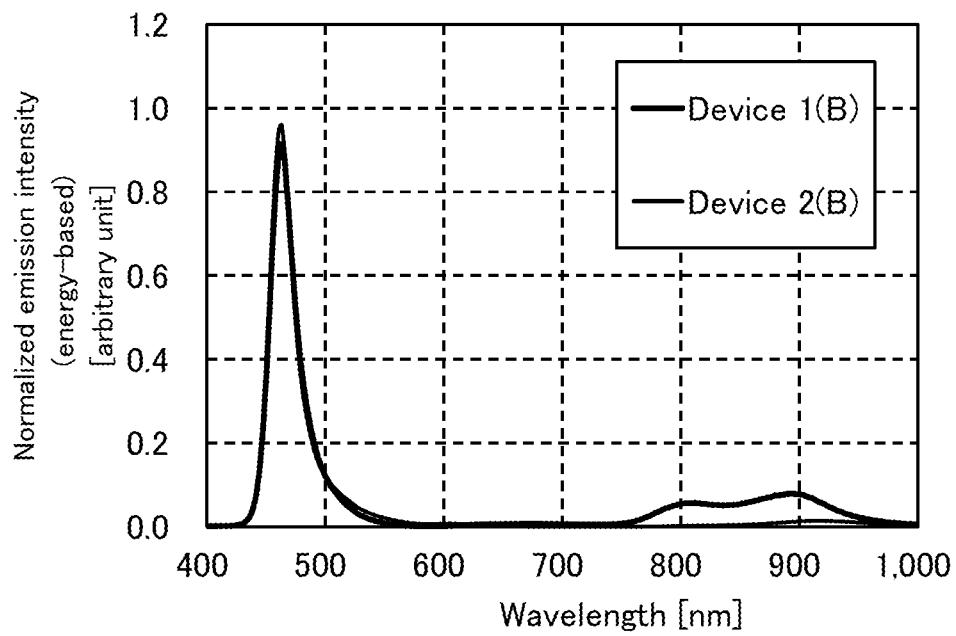
FIG. 28 shows emission spectra that are calculation results in Example.
Figure 29:
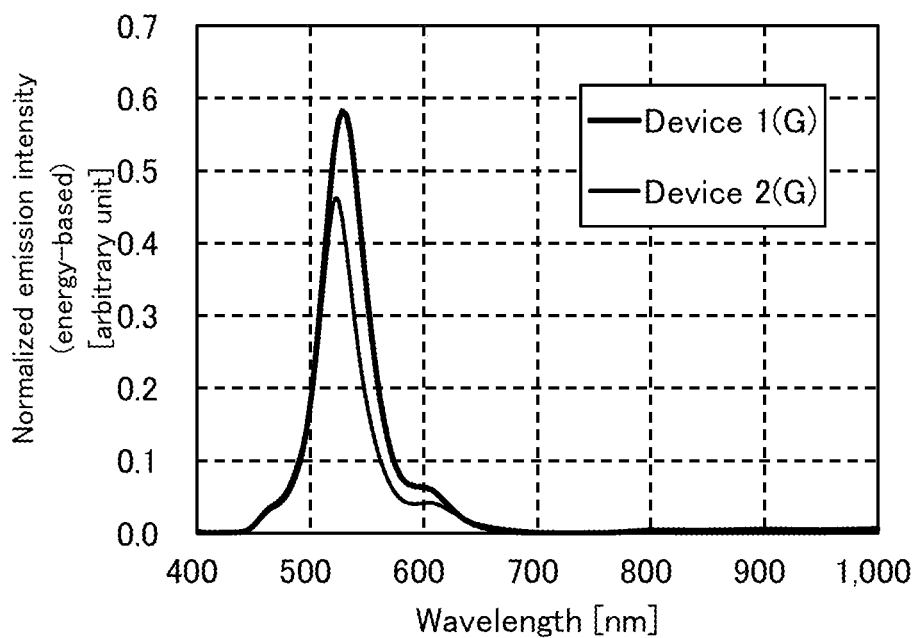
FIG. 29 shows emission spectra that are calculation results in Example.
Figure 30:
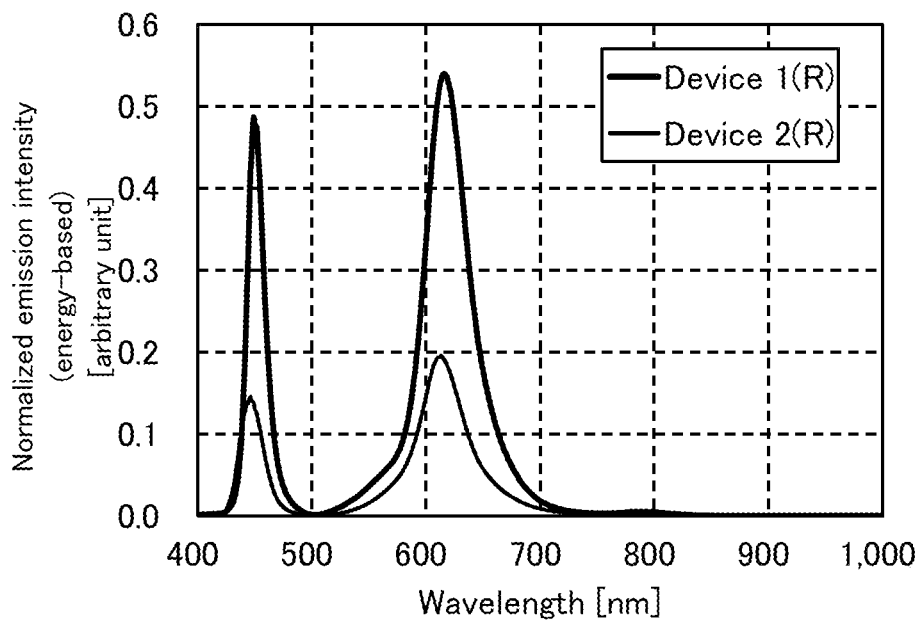
FIG. 30 shows emission spectra that are calculation results in Example.
Figure 31:
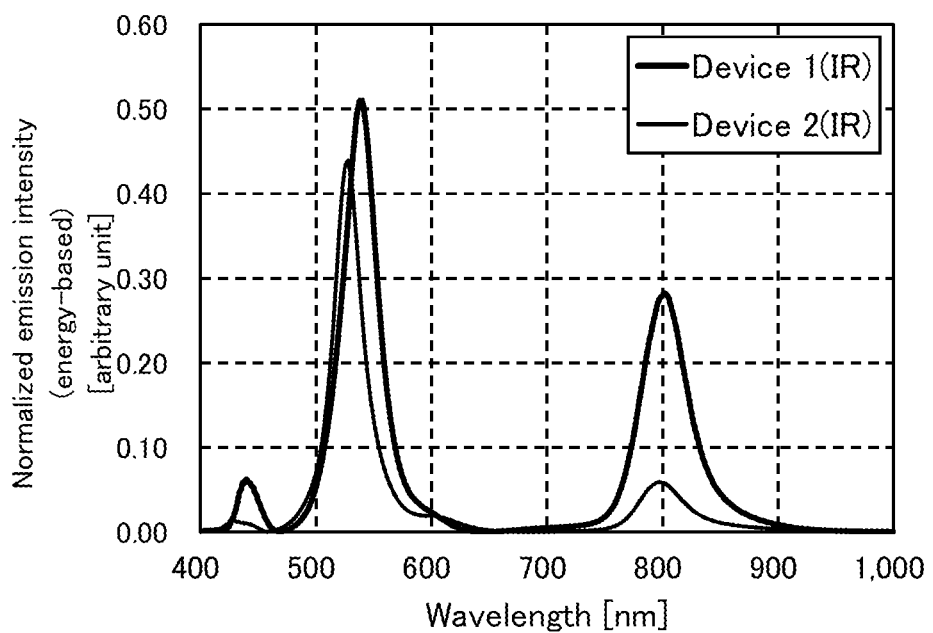
FIG. 31 shows emission spectra that are calculation results in Example.

FIG. 28 shows the emission (EL) spectra of the light-emitting device 1(B) and the light-emitting device 2(B), which were obtained by calculation. FIG. 29 shows the emission (EL) spectra of the light-emitting device 1(G) and the light-emitting device 2(G), which were obtained by calculation. FIG. 30 shows the emission (EL) spectra of the light-emitting device 1(R) and the light-emitting device 2(R), which were obtained by calculation. FIG. 31 shows the emission (EL) spectra of the light-emitting device 1(IR) and the light-emitting device 2(IR), which were obtained by calculation. In FIG. 28 to FIG. 31, the horizontal axis represents the wavelength (unit: nm) and the vertical axis represents energy-based normalized emission intensity (arbitrary unit).

As shown in FIG. 28, the light-emitting device 1(B) and the light-emitting device 2(B) exhibited equally high external quantum efficiency in the blue region. As shown in FIG. 29, the light-emitting device 1(G) exhibited higher external quantum efficiency than the light-emitting device 2(G). Similarly, as shown in FIG. 30, the light-emitting device 1(R) exhibited higher external quantum efficiency than the light-emitting device 2(R). Furthermore, as shown in FIG.

31, the light-emitting device 1(IR) exhibited higher external quantum efficiency than the light-emitting device 2(IR).

The above results show that when all the light-emitting devices are compared with each other, the light-emitting apparatus 1000 exhibits higher emission efficiency and consumed lower power than the light-emitting apparatus 1100.

The difference between the light-emitting apparatus 1000 and the light-emitting apparatus 1100 is the stacking order of the light-emitting layers. It is suggested that adjusting the optical path length between the pair of electrodes in the light-emitting device to a favorable length is easier in the case where the light-emitting layers are stacked in descending order of the wavelength of emitted light from the optical adjustment layer 199 than in the case where the light-emitting layers are stacked in ascending order of the wavelength of emitted light.

According to the results of this example, the device structures of the light-emitting devices from which red light, green light, blue light, and infrared light were extracted at high efficiency were able to be estimated only by change in the thickness of the optical adjustment layer.

As shown in FIG. 28, not only a peak of blue light but also a peak of near-infrared light was observed in the light-emitting device 1(B).

This suggests that it is possible to use the light-emitting device 1(B) for a subpixel that emits both blue light and infrared light. For example, the structure of the light-emitting device 1(B) can be applied to the light-emitting device 47B(IR) illustrated in FIG. 8A. In that case, the light-emitting apparatus can have a structure that emits both visible light and infrared light without an increase in the number of subpixels included in one pixel. Therefore, it is possible to add a function of emitting infrared light to the light-emitting apparatus without significantly changing the pixel layout of the light-emitting apparatus.

In addition, it is suggested that the light-emitting device 1(B) can be used in both of a subpixel emitting blue light and a subpixel emitting infrared light. For example, the structure of the light-emitting device 1(B) can be applied to both of the light-emitting device 47B and the light-emitting device 47N illustrated in FIG. 8B. Accordingly, it is possible provide a subpixel that emits infrared light without significantly increasing the number of manufacturing steps of the light-emitting apparatus.

Reference Example

A method for synthesizing bis{4,6-dimethyl-2-[3-(3,5-dimethylphenyl)-2-benzo[g]quinoxalinyl-N]phenyl-κC}(2,2,6,6-tetramethyl-3,5-heptanedionato-κ2O,O')iridium(III) (abbreviation: [Ir(dmdpbq)$_2$(dpm)]), which is used in Example described above, will be described in detail. The structure of [Ir(dmdpbq)$_2$(dpm)]) is shown below.

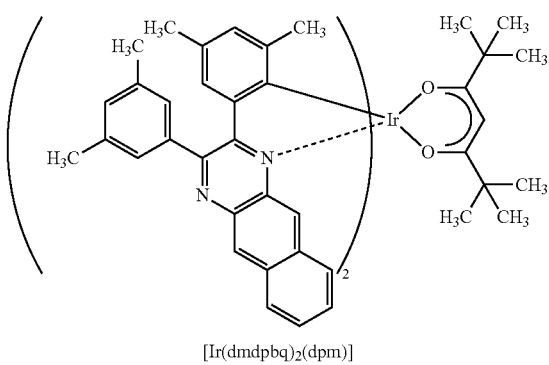

[Chemical formula 2]

[Ir(dmdpbq)$_2$(dpm)]

Step 1; Synthesis of 2,3-bis-(3,5-dimethylphenyl)-2-benzo[g]quinoxaline (abbreviation: Hdmdpbq)

First, Hdmdpbq was synthesized in Step 1. Into a three-necked flask equipped with a reflux pipe, 3.20 g of 3,3',5,5'-tetramethylbenzyl, 1.97 g of 2,3-diaminonaphthalene, and 60 mL of ethanol were put, the air in the flask was replaced with nitrogen, and then the mixture was stirred at 90° C. for 7.5 hours. After a predetermined time elapsed, the solvent was distilled off. Then, purification by silica gel column chromatography using toluene as a developing solvent was performed, whereby the target substance was obtained (a yellow solid, yield: 3.73 g, percent yield: 79%). The synthesis scheme of Step 1 is shown in (a-1).

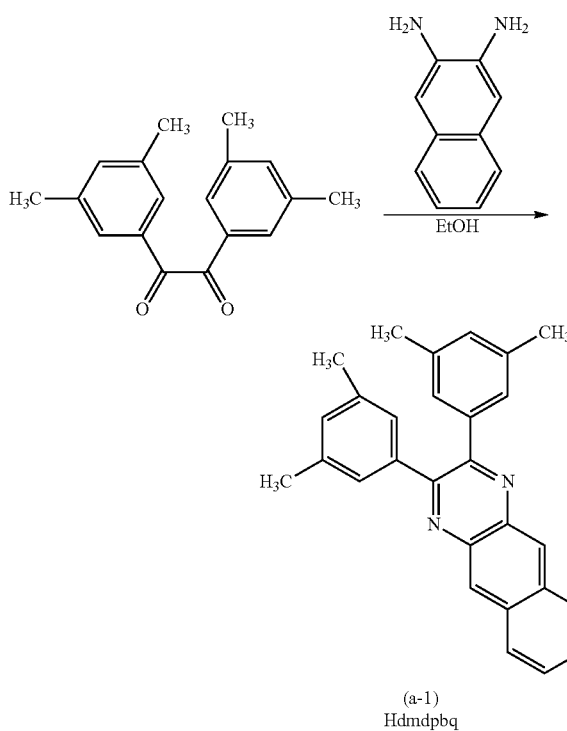

[Chemical formula 3]

(a-1)
Hdmdpbq

Analysis results by nuclear magnetic resonance spectroscopy ($^1$H-NMR) of the yellow solid obtained in Step 1 are shown below. The analysis results show that Hdmdpbq was obtained.

Given below is $^1$H NMR data of the obtained substance.
$^1$H-NMR. δ (CD$_2$Cl$_2$): 2.28 (s, 12H), 7.01 (s, 2H), 7.16 (s, 4H), 7.56-7.58 (m, 2H), 8.11-8.13 (m, 2H), 8.74 (s, 2H).

Step 2; Synthesis of di-p-chloro-tetrakis{4,6-dimethyl-2-[3-(3,5-dimethylphenyl)-2-benzo[g]quinoxalinyl-κN]phenyl-κC}diiridium(III) (abbreviation: [Ir(dmdpbq)$_2$Cl]$_2$)

Next, [Ir(dmdpbq)$_2$Cl]$_2$ was synthesized in Step 2. Into a recovery flask equipped with a reflux pipe, 15 mL of 2-ethoxyethanol, 5 mL of water, 1.81 g of Hdmdpbq obtained in Step 1, and 0.66 g of iridium chloride hydrate (IrCl$_3$—H$_2$O) (produced by Furuya Metal Co., Ltd.) were put, and the air in the flask was replaced with argon. Then, microwave irradiation (2.45 GHz, 100 W) was performed for two hours to cause reaction. After a predetermined time elapsed, the obtained residue was suction-filtered and washed with methanol, whereby the target substance was obtained (a black solid, yield: 1.76 g, percent yield: 81%). The synthesis scheme of Step 2 is shown in (a-2).

Step 3; Synthesis of [Ir(dmdpbq)$_2$(dpm)]

Then, [Ir(dmdpbq)$_2$(dpm)] was synthesized in Step 3. Into a recovery flask equipped with a reflux pipe, 20 mL of 2-ethoxyethanol, 1.75 g of [Ir(dmdpbq)$_2$Cl]$_2$ obtained in Step 2, 0.50 g of dipivaloylmethane (abbreviation: Hdpm), and 0.95 g of sodium carbonate were put, and the air in the flask was replaced with argon. Then, microwave irradiation (2.45 GHz, 100 W) was performed for three hours. The obtained residue was suction-filtered with methanol and then washed with water and methanol. The obtained solid was purified by silica gel column chromatography using dichloromethane as a developing solvent, and then recrystallization was performed with a mixed solvent of dichloromethane and methanol, whereby the target substance was obtained (a dark green solid, yield: 0.42 g, percent yield: 21%). With a train sublimation method, 0.41 g of the obtained dark green solid was purified by sublimation. The conditions of the sublimation purification were such that the dark green solid was heated under a pressure of 2.7 Pa at 300° C. while the argon gas flowed at a flow rate of 10.5 mL/min. After the sublimation purification, a dark green solid was obtained in a yield of 78%. The synthesis scheme of Step 3 is shown in (a-3).

[Chemical formula 4]

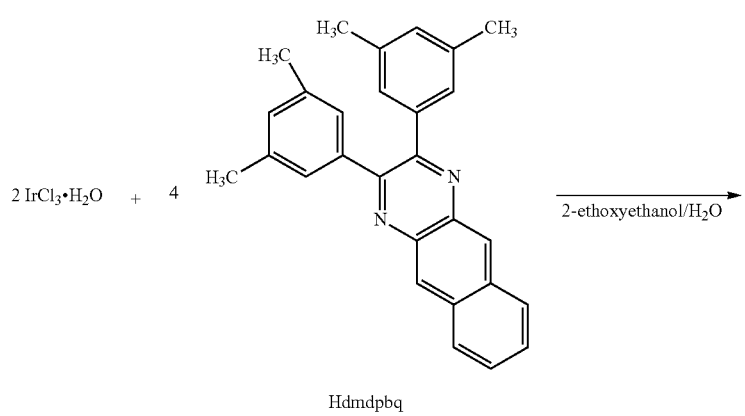

Hdmdpbq

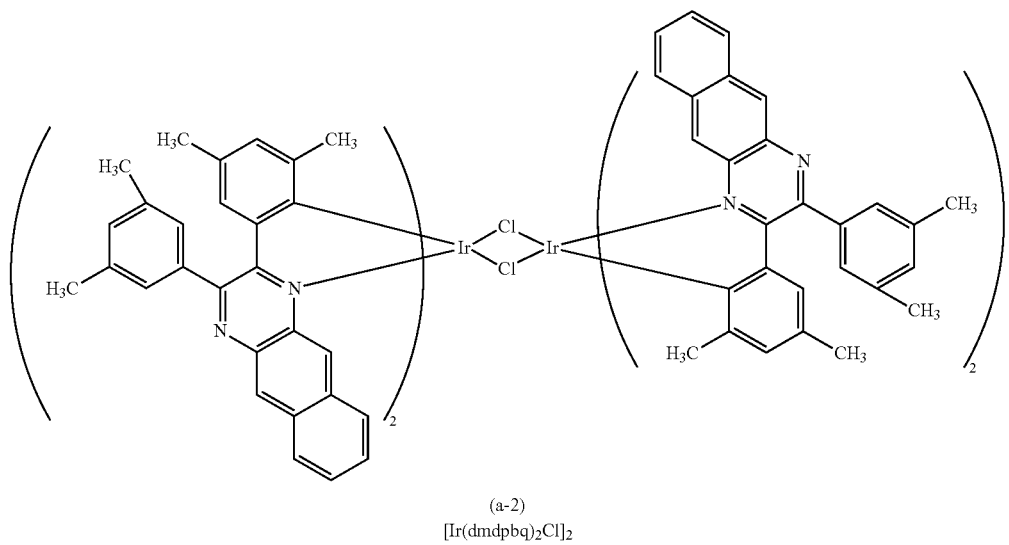

(a-2)
[Ir(dmdpbq)$_2$Cl]$_2$

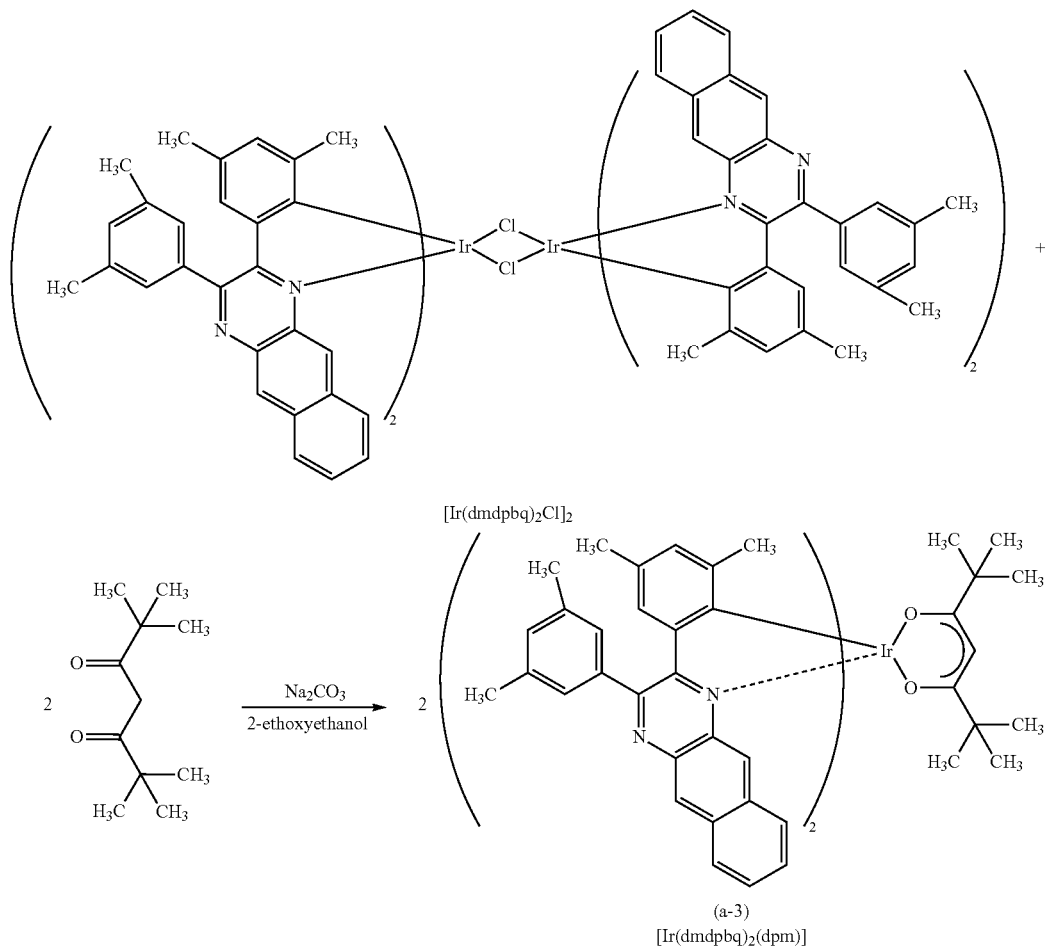

[Chemical formula 5]

Analysis results by nuclear magnetic resonance spectroscopy ($^1$H-NMR) of the dark green solid obtained in Step 3 are shown below. The analysis results show that [Ir(dmdpbq)$_2$(dpm)] was obtained.

$^1$H-NMR. δ (CD$_2$Cl$_2$): 0.75 (s, 18H), 0.97 (s, 6H), 2.01 (s, 6H), 2.52 (s, 12H), 4.86 (s, 1H), 6.39 (s, 2H), 7.15 (s, 2H), 7.31 (s, 2H), 7.44-7.51 (m, 4H), 7.80 (d, 2H), 7.86 (s, 4H), 8.04 (d, 2H), 8.42 (s, 2H), 8.58 (s, 2H).

REFERENCE NUMERALS

C1: capacitor, C2: capacitor, IRF: optical filter, M1: transistor, M2: transistor, M3: transistor, M4: transistor, M5: transistor, M6: transistor, M7: transistor, OUT1: wiring, OUT2: wiring, PD: light-receiving device, PIX1: pixel circuit, PIX2: pixel circuit, V1: wiring, V2: wiring, V3: wiring, V4: wiring, V5: wiring, 1: light-emitting device, 2: light-emitting device, 10A: display device, 10B: display device, 10C: display device, 10D: display device, 10E: display device, 10F: display device, 21B: light, 21G: light, 21N: infrared light, 22: light, 23a: light, 23b: reflected light, 30A: light-emitting apparatus, 30B: light-emitting apparatus, 30C: light-emitting apparatus, 30D: light-emitting apparatus, 40A: light-emitting apparatus, 40B: light-emitting apparatus, 40C: light-emitting apparatus, 40D: light-emitting apparatus, 40E: light-emitting apparatus, 41: transistor, 42: transistor, 45: layer including transistor, 47B: light-emitting device, 47G: light-emitting device, 47N: light-emitting device, 47R: light-emitting device, 47V: light-emitting device, 48a: light-emitting unit, 48b: light-emitting unit, 48c: light-emitting unit, 48d: light-emitting unit, 48e: light-emitting unit, 50A: display device, 50B: display device, 52: finger, 53: layer including light-receiving device, 55: layer including transistor, 57: layer including light-emitting device, 100A: display device, 100B: display device, 100C: display device, 100D: display device, 110: light-receiving device, 112: common layer, 114: common layer, 115: common electrode, 116: buffer layer, 141a: filter, 141b: filter, 142: adhesive layer, 143: space, 149: lens, 151: substrate, 152: substrate, 153: substrate, 154: substrate, 155: adhesive layer, 162: display portion, 163: light-emitting portion, 164: circuit, 165: wiring, 166: conductive layer, 172: FPC, 173: IC, 181: pixel electrode, 182: buffer layer, 183: active layer, 184: buffer layer, 189: optical adjustment layer, 189N: optical adjustment layer, 190: light-emitting device, 190B: light-emitting device, 190G: light-emitting device, 190N: light-emitting device, 191: pixel electrode, 191B: pixel electrode, 191N: pixel electrode, 192: buffer layer, 193: light-emitting layer, 193B: light-emitting layer, 193G: light-emitting layer, 193N: light-emitting layer, 193R: light-emitting layer, 193V: light-emitting layer, 194: buffer layer, 195: protective layer, 195*a*: inorganic insulating layer, 195*b*: organic insulating layer, 195*c*: inorganic insulating layer, 198: intermediate layer, 198*a*: intermediate layer, 198*b*: intermediate layer, 199: optical adjustment layer, 199B: optical adjustment layer, 199G: optical adjustment layer, 199N: optical adjustment layer, 199R: optical adjustment layer, 199V: optical adjustment layer, 200A: light-emitting apparatus, 200B: light-emitting apparatus, 201: transistor, 202: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 215: insulating layer, 216: partition, 217: partition, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 1000: light-emitting apparatus, 1100: light-emitting apparatus, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal.

This application is based on Japanese Patent Application Serial No. 2018-246814 filed on Dec. 28, 2018 and Japanese Patent Application Serial No. 2018-246821 filed on Dec. 28, 2018, the entire contents of which are hereby incorporated herein by reference.

The invention claimed is:

1. A light-emitting apparatus comprising:
a first light-emitting device and a second light-emitting device,
wherein the first light-emitting device comprises a first pixel electrode, a first optical adjustment layer, a first light-emitting layer, a second light-emitting layer, and a common electrode,
wherein the second light-emitting device comprises a second pixel electrode, a second optical adjustment layer, the first light-emitting layer, the second light-emitting layer, and the common electrode,
wherein the first optical adjustment layer is positioned between the first pixel electrode and the common electrode,
wherein the second optical adjustment layer is positioned between the second pixel electrode and the common electrode,
wherein the first optical adjustment layer and the second optical adjustment layer are separately provided,
wherein the first light-emitting layer and the second light-emitting layer each comprise a region positioned between the first pixel electrode and the common electrode and a region positioned between the second pixel electrode and the common electrode,
wherein the first light-emitting device emits infrared light emitted by the first light-emitting layer, and
wherein the second light-emitting device emits visible light emitted by the second light-emitting layer.

2. The light-emitting apparatus according to claim 1, further comprising:
a third light-emitting device,
wherein the first light-emitting device and the second light-emitting device further comprise a third light-emitting layer,
wherein the third light-emitting device comprises a third pixel electrode, a third optical adjustment layer, the first light-emitting layer, the second light-emitting layer, the third light-emitting layer, and the common electrode,
wherein the third light-emitting layer comprises a region positioned between the first pixel electrode and the common electrode, a region positioned between the second pixel electrode and the common electrode, and a region positioned between the third pixel electrode and the common electrode,
wherein the third light-emitting device emits visible light emitted by the third light-emitting layer, and
wherein the second light-emitting layer and the third light-emitting layer emit light having different wavelengths from each other.

3. The light-emitting apparatus according to claim 1,
wherein the first light-emitting device and the second light-emitting device further comprise a third light-emitting layer,
wherein the third light-emitting layer comprises a region positioned between the first pixel electrode and the common electrode and a region positioned between the second pixel electrode and the common electrode, and
wherein the first light-emitting device emits both infrared light emitted by the first light-emitting layer and visible light emitted by the third light-emitting layer.

4. The light-emitting apparatus according to claim 1,
wherein the first light-emitting device and the second light-emitting device further comprise a charge-generation layer, and
wherein the charge-generation layer is positioned between the first light-emitting layer and the second light-emitting layer.

5. The light-emitting apparatus according to claim 1,
wherein the first light-emitting layer comprises a region positioned between the first optical adjustment layer and the second light-emitting layer and a region positioned between the second optical adjustment layer and the second light-emitting layer.

6. A light-emitting apparatus comprising:
a first light-emitting device and a second light-emitting device,
wherein the first light-emitting device comprises a first pixel electrode, a first optical adjustment layer, a first light-emitting layer, a second light-emitting layer, a third light-emitting layer, a fourth light-emitting layer, and a common electrode,
wherein the second light-emitting device comprises a second pixel electrode, a second optical adjustment layer, the first light-emitting layer, the second light-emitting layer, the third light-emitting layer, the fourth light-emitting layer, and the common electrode, wherein the first optical adjustment layer is positioned between the first pixel electrode and the common electrode, wherein the second optical adjustment layer is positioned between the second pixel electrode and the common electrode, wherein the first light-emitting layer, the second light-emitting layer, the third light-emitting layer, and the fourth light-emitting layer each comprise a region positioned between the first pixel electrode and the common electrode and a region positioned between the second pixel electrode and the common electrode, wherein the first light-emitting layer is configured to emit infrared light, wherein the second light-emitting layer is configured to emit visible light, wherein the third light-emitting layer is configured to emit visible light having a shorter wavelength than visible light emitted by the second light-emitting layer, wherein the fourth light-emitting layer is configured to emit visible light having a shorter wavelength than visible light emitted by the third light-emitting layer, wherein the first light-emitting device emits infrared light emitted by the first light-emitting layer, and wherein the second light-emitting device emits visible light emitted by the second light-emitting layer, the third light-emitting layer, or the fourth light-emitting layer.

7. The light-emitting apparatus according to claim 6,
wherein the second light-emitting layer is configured to emit red light,
wherein the third light-emitting layer is configured to emit green light, and
wherein the fourth light-emitting layer is configured to emit blue light.

8. The light-emitting apparatus according to claim 6,
wherein the first light-emitting device and the second light-emitting device further comprise a first charge-generation layer, and
wherein the first charge-generation layer is positioned between the first light-emitting layer and the fourth light-emitting layer.

9. The light-emitting apparatus according to claim 6,
wherein the first light-emitting device and the second light-emitting device further comprise a second charge-generation layer, and
wherein the second charge-generation layer is positioned between the first light-emitting layer and the second light-emitting layer.

10. The light-emitting apparatus according to claim 6,
wherein the first light-emitting layer, the second light-emitting layer, the third light-emitting layer, and the fourth light-emitting layer are stacked in this order from a side close to the first optical adjustment layer, and
wherein the first light-emitting layer, the second light-emitting layer, the third light-emitting layer, and the fourth light-emitting layer are stacked in this order from a side close to the second optical adjustment layer.

11. The light-emitting apparatus according to claim 6,
wherein the first light-emitting device emits both infrared light emitted by the first light-emitting layer and visible light emitted by the fourth light-emitting layer.

12. The light-emitting apparatus according to claim 6,
wherein the first optical adjustment layer is positioned between the first pixel electrode and the first light-emitting layer.

13. The light-emitting apparatus according to claim 6,
wherein the first optical adjustment layer is positioned between the common electrode and the first light-emitting layer.

14. A display device comprising a display portion,
wherein the display portion comprises a first light-emitting device, a second light-emitting device, and a light-receiving device,
wherein the first light-emitting device comprises a first pixel electrode, a first optical adjustment layer, a first light-emitting layer, a second light-emitting layer, and a common electrode,
wherein the second light-emitting device comprises a second pixel electrode, a second optical adjustment layer, the first light-emitting layer, the second light-emitting layer, and the common electrode,
wherein the first optical adjustment layer is positioned between the first pixel electrode and the common electrode,
wherein the second optical adjustment layer is positioned between the second pixel electrode and the common electrode,
wherein the first light-emitting layer and the second light-emitting layer each comprise a region positioned between the first pixel electrode and the common electrode and a region positioned between the second pixel electrode and the common electrode,
wherein the light-receiving device comprises a third pixel electrode, an active layer, and the common electrode,
wherein the active layer is positioned between the third pixel electrode and the common electrode,
wherein the active layer comprises an organic compound,
wherein the first light-emitting device emits infrared light emitted by the first light-emitting layer,
wherein the second light-emitting device emits visible light emitted by the second light-emitting layer, and
wherein the light-receiving device is configured to absorb at least part of visible light and infrared light.

15. The display device according to claim 14,
wherein the first light-emitting device comprises a common layer,
wherein the second light-emitting device comprises the common electrode,
wherein the light-receiving device comprises the common layer, and
wherein the common layer comprises a region positioned between the first pixel electrode and the common electrode, a region positioned between the second pixel electrode and the common electrode, and a region positioned between the third pixel electrode and the common electrode.

16. The display device according to claim 14, further comprising:
a third light-emitting device,
wherein the first light-emitting device and the second light-emitting device further comprise a third light-emitting layer,
wherein the third light-emitting device comprises a fourth pixel electrode, a third optical adjustment layer, the first light-emitting layer, the second light-emitting layer, the third light-emitting layer, and the common electrode,
wherein the third light-emitting layer comprises a region positioned between the first pixel electrode and the common electrode, a region positioned between the second pixel electrode and the common electrode, and a region positioned between the fourth pixel electrode and the common electrode, wherein the third light-emitting device emits visible light emitted by the third light-emitting layer, and wherein the second light-emitting layer and the third light-emitting layer emit light having different wavelengths from each other.

17. The display device according to claim 14, wherein the first light-emitting device and the second light-emitting device further comprise a third light-emitting layer, wherein the third light-emitting layer comprises a region positioned between the first pixel electrode and the common electrode and a region positioned between the second pixel electrode and the common electrode, and wherein the first light-emitting device emits both infrared light emitted by the first light-emitting layer and visible light emitted by the third light-emitting layer.

18. The display device according to claim 14, wherein the first light-emitting device and the second light-emitting device further comprise a charge-generation layer, and wherein the charge-generation layer is positioned between the first light-emitting layer and the second light-emitting layer.

19. The display device according to claim 14, wherein the first light-emitting layer comprises a region positioned between the first optical adjustment layer and the second light-emitting layer and a region positioned between the second optical adjustment layer and the second light-emitting layer.

20. A display device comprising:

a display portion, wherein the display portion comprises a first light-emitting device, a second light-emitting device, and a light-receiving device, wherein the first light-emitting device comprises a first pixel electrode, a first optical adjustment layer, a first light-emitting layer, a second light-emitting layer, a third light-emitting layer, a fourth light-emitting layer, and a common electrode, wherein the second light-emitting device comprises a second pixel electrode, a second optical adjustment layer, the first light-emitting layer, the second light-emitting layer, the third light-emitting layer, the fourth light-emitting layer, and the common electrode, wherein the first optical adjustment layer is positioned between the first pixel electrode and the common electrode, wherein the second optical adjustment layer is positioned between the second pixel electrode and the common electrode, wherein the first light-emitting layer, the second light-emitting layer, the third light-emitting layer, and the fourth light-emitting layer each comprise a region positioned between the first pixel electrode and the common electrode and a region positioned between the second pixel electrode and the common electrode, wherein the first light-emitting layer is configured to emit infrared light, wherein the second light-emitting layer is configured to emit visible light, wherein the third light-emitting layer is configured to emit visible light having a shorter wavelength than visible light emitted by the second light-emitting layer, wherein the fourth light-emitting layer is configured to emit visible light having a shorter wavelength than visible light emitted by the third light-emitting layer, wherein the light-receiving device comprises a third pixel electrode, an active layer, and the common electrode, wherein the active layer is positioned between the third pixel electrode and the common electrode, wherein the active layer comprises an organic compound, wherein the first light-emitting device emits infrared light emitted by the first light-emitting layer, wherein the second light-emitting device emits visible light emitted by the second light-emitting layer, the third light-emitting layer, or the fourth light-emitting layer, and wherein the light-receiving device is configured to absorb at least part of visible light and infrared light.

21. The display device according to claim 20, wherein the second light-emitting layer is configured to emit red light, and the third light-emitting layer is configured to emit green light, and wherein the fourth light-emitting layer is configured to emit blue light.

22. The display device according to claim 20, wherein the first light-emitting device and the second light-emitting device further comprise a first charge-generation layer, and wherein the first charge-generation layer is positioned between the first light-emitting layer and the fourth light-emitting layer.

23. The display device according to claim 20, wherein the first light-emitting device and the second light-emitting device further comprise a second charge-generation layer, and wherein the second charge-generation layer is positioned between the first light-emitting layer and the second light-emitting layer.

24. The display device according to claim 20, wherein the first light-emitting layer, the second light-emitting layer, the third light-emitting layer, and the fourth light-emitting layer are stacked in this order from a side close to the first optical adjustment layer, and wherein the first light-emitting layer, the second light-emitting layer, the third light-emitting layer, and the fourth light-emitting layer are stacked in this order from a side close to the second optical adjustment layer.

25. The display device according to claim 20, wherein the first light-emitting device emits both infrared light emitted by the first light-emitting layer and visible light emitted by the fourth light-emitting layer.

26. The display device according to claim 20, wherein the first optical adjustment layer is positioned between the first pixel electrode and the first light-emitting layer.

27. The display device according to claim 20, wherein the display portion has flexibility.

* * * * *